United States Patent
Hagiwara et al.

(10) Patent No.: US 6,538,723 B2
(45) Date of Patent: Mar. 25, 2003

(54) SCANNING EXPOSURE IN WHICH AN OBJECT AND PULSED LIGHT ARE MOVED RELATIVELY, EXPOSING A SUBSTRATE BY PROJECTING A PATTERN ON A MASK ONTO THE SUBSTRATE WITH PULSED LIGHT FROM A LIGHT SOURCE, LIGHT SOURCES THEREFOR, AND METHODS OF MANUFACTURING

(75) Inventors: Shigeru Hagiwara, Kawasaki (JP); Ken Ozawa, Kawaguchi (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/351,173

(22) Filed: Jul. 12, 1999

(65) Prior Publication Data

US 2002/0196418 A1 Dec. 26, 2002

Related U.S. Application Data

(63) Continuation of application No. 08/905,966, filed on Aug. 5, 1997.

(30) Foreign Application Priority Data

Aug. 5, 1996 (JP) .............................................. 8-221751
Mar. 24, 1997 (JP) .............................................. 9-088907

(51) Int. Cl.[7] ........................ G03B 27/54; G03B 27/74; G03B 27/42
(52) U.S. Cl. .............................. 355/67; 355/53; 355/68
(58) Field of Search ............................ 355/53, 55, 67, 355/68, 69; 430/30; 250/205

(56) References Cited

U.S. PATENT DOCUMENTS

| 4,924,257 | A |   | 5/1990 | Jain |
| 5,561,285 | A |   | 10/1996 | Sakata et al. |
| 5,591,958 | A |   | 1/1997 | Nishi et al. |
| 5,627,627 | A |   | 5/1997 | Suzuki |
| 5,659,383 | A |   | 8/1997 | Ozawa |
| 5,677,754 | A |   | 10/1997 | Makinouchi |
| 5,717,483 | A |   | 2/1998 | Kikuchi |
| 5,721,608 | A | * | 2/1998 | Taniguchi ................. 355/53 |
| 5,728,495 | A |   | 3/1998 | Ozawa |
| 5,854,671 | A |   | 12/1998 | Nishi |

FOREIGN PATENT DOCUMENTS

JP 8-250402 3/1995

* cited by examiner

*Primary Examiner*—Russell Adams
*Assistant Examiner*—Peter B. Kim
(74) *Attorney, Agent, or Firm*—Nixon & Vanderhye P.C.

(57) ABSTRACT

In a scanning exposure apparatus and method, a pattern formed on a mask is transferred onto a substrate by scanning the mask and the substrate synchronously with respect to pulsed light emitted from a pulsed laser light source. A number of pulses of a light beam that are to be emitted to each point on the substrate during scanning exposure is determined, and the light source is controlled according to the determined number of pulses, so that the maximum scanning speeds of the mask and the substrate and/or the maximum oscillation period of the pulsed light are maintained during the scanning exposure process. In another arrangement, during the process of exposing a shot area on the substrate, integral values of the amount of exposure energy are detected at a plurality of points in that shot area. Based on this detection result, the oscillation frequency of the pulsed light that is to be emitted to the next shot area is determined so that the next shot area is exposed at an appropriate exposure level. In another arrangement, the light source and/or the exposure light emitted from the light source are adjusted so that the output level of the light source is set to the minimum required level, and so that the target value of the integral exposure dose is reliably achieved without reducing the scanning speeds of the mask and the substrate from their maximum. In still another arrangement, during the process for exposing the substrate to the laser beam, while scanning the substrate to transfer the mask pattern, the illuminance of the light source is controlled at a constant value. In yet another arrangement, when the exposure apparatus is not performing exposure (i.e., during the non-exposure period of the operation), the illuminance of the light source is maintained at a constant level, but the exposure light is blocked by a blind so as not to reach the mask or the mask stage.

16 Claims, 25 Drawing Sheets

SCANNING EXPOSURE IN WHICH AN OBJECT AND PULSED LIGHT ARE MOVED RELATIVELY, EXPOSING A SUBSTRATE BY PROJECTING A PATTERN ON A MASK ONTO THE SUBSTRATE WITH PULSED LIGHT FROM A LIGHT SOURCE, LIGHT SOURCES THEREFOR, AND METHODS OF MANUFACTURING

This is a continuation of application Ser. No. 08/905,966, filed Aug. 5, 1997, now pending.

BACKGROUND OF THE INVENTION

This invention relates to a scanning exposure method and a scanning-type exposure apparatus and, more particularly, to a scanning exposure method and a scanning-type exposure apparatus used in a photolithographic process for manufacturing, for example, semiconductor devices, liquid crystal display devices, image pick-up devices (including CCDs), thin-film magnetic heads, and so on.

When manufacturing a semiconductor device or the like using a photolithographic technique, a projection exposure apparatus is used to transfer the pattern on a reticle, which functions as a mask, via a projection optical system onto the respective shot areas of a substrate (i.e., a wafer or a glass plate) coated with a photoresist layer. One of the essential functions of such a projection exposure apparatus is exposure control, i.e., keeping the integral exposure dose on each point on the wafer within an appropriate range.

In a projection exposure apparatus of a collective-exposure type, such as a stepper, a continuous light source (e.g., a super high-pressure mercury-vapor lamp) or a pulsed laser light source (e.g., an excimer laser) is generally used. A collective-exposure type exposure apparatus transfers the circuit pattern of a reticle as a whole onto the shot areas of a wafer, while keeping the wafer stage used for supporting the wafer at rest, unlike a scanning-type exposure apparatus. With either kind of light source, a cut-off control is generally employed as an exposure control device, in which a portion of the exposure light is extracted and guided to a photoelectric detector, called an integrator sensor, during the process of exposing a wafer which is coated with a photosensitive material (photoresist). The integrator sensor detects the amount of light energy to which the wafer is exposed. If a laser light source is used, laser beam emission is continued until the integral value of the exposure energy detected exceeds a predetermined critical level (hereinafter, referred to as the designated amount of exposure dose) required for that photosensitive material. If a continuous light source is used, the shutter is closed when the integral value of the exposure dose detected exceeds the critical level.

With a pulsed laser light source, there is a small variation or error in the energy of the pulsed laser beams. In order to overcome this, the wafer is exposed to a number of pulses greater than the minimum number of exposure pulses to achieve desired exposure-control accuracy. However, if, for example, a wafer coated with a high-sensitivity resist whose designated amount of exposure dose is considerably small is used, the intensity of each pulse of laser beam is high relative to the sensitivity of the resist. If the wafer is exposed to a number of pulses greater than the minimum number, the total amount of exposure dose would exceed the designated amount of exposure dose for that resist. Therefore, in the case in which a material whose designated amount of exposure energy is relatively small is used, an attenuator or the like is positioned in the optical path to attenuate each pulse of the laser beam so as to keep the number of laser pulses emitted to the wafer greater than the minimum number while preventing the exposure dose from exceeding the designated amount.

In recent years, scanning-type projection exposure apparatus, including a step-and-scan exposure apparatus, have been developed, in which a reticle and a wafer are synchronously scanned with respect to the projection optical system so as to transfer a larger circuit pattern imprinted on a reticle onto the shot areas of a wafer with high accuracy. The cut-off control method cannot be used in scanning-type exposure apparatus because the cut-off control method focuses on only one point on the wafer to detect the exposure dose. Therefore, two other control methods have been used for scanning-type exposure apparatus.

The first control method used in the scanning-type exposure apparatus is to simply integrate the quantity of each pulse of the illumination light beam to control the exposure dose. This method is called open exposure control. The second control method is the individual pulse control method, which is disclosed in, for example, Japanese Patent Application Laid-open No. 6-252022. In the individual pulse control method, the exposure dose of a plurality of sub-areas within slit-like exposure areas on the wafer is measured in real time to calculate an integral amount of exposure dose for each pulse of the beam, and the exposure dose of the next pulse of the beam is determined based on the previously calculated integral exposure dose. This method requires a complicated algorithm.

In the first control method, the energy of the pulsed light must be controlled so that the number of laser pulses emitted onto each point of the wafer is an integer in order to achieve a good linearity in the exposure control. The designated exposure amount is expressed as:

(designated amount of exposure dose)=(the number of pulses)× (average energy of a pulse)    (1)

The average energy of a pulse is determined immediately before the exposure process from the values detected by the integrator sensor. To this end, an energy modulator is provided in the optical path.

FIGS. 28(A) and 28(B) illustrate examples of conventional energy modulators. The double-grating modulator shown in FIG. 28(A) comprises a pair of grating plates 72 and 74 that are positioned in the optical path of the emitted laser beam LB. Grating 72 is a fixed grating in which transparent portions and light-blocking portions are alternately formed at a predetermined interval. Grating 74 is a movable grating that moves in the direction of the interval. The position of the movable grating 74 relative to the fixed grating 72 is changed to vary the transmittance with respect to the laser beam LB. The modulator shown in FIG. 28(B) comprises a pair of glass plates 76 and 78 that are tilted in the optical path so that the inclination angle Θ is variable. An antireflection coating is applied to both surfaces of the glass plates 76 and 78. The transmittance of the glass plates 76 and 78 changes according to the incident angle of the laser beam LB. Taking advantage of this property, the inclination angle Θ is controlled to regulate the transmittance with respect to the laser beam LB. As still another means of modulation, the energy of the laser source itself may be modulated.

In addition to equation (1), the scanning-type exposure apparatus must also satisfy equation (2):

$V=Ws/N×f$    (2)

where V is the scanning speed of the wafer (or the wafer stage) during scanning exposure, Ws is the width of a slit-like exposure area on the wafer, which is referred to as a slit width, N is the number of pulses emitted onto each point of the wafer, and f is the oscillation frequency of the laser.

In the exposure process, the total exposure dose (i.e., the designated amount of exposure dose) required for the wafer is determined first. Then, the average energy of the pulsed light is measured, and the number of pulses emitted onto each point of the wafer is calculated. Finally, the scanning speed V is determined using the slit width Ws and the oscillation frequency f as constants.

In the conventional technique, the oscillation frequency of the laser is fixed at the maximum oscillation frequency $f_0$ based on the maximum scanning speed, which is defined by the capabilities (including mechanical function) of the stage control system of the exposure apparatus.

In scanning exposure, the slit width Ws is a fixed value determined by the optical design of the system, and the oscillation frequency f of the laser is also a fixed value $f_0$, which corresponds to the maximum scanning speed $V_{max}$ determined by the capabilities of the stage control system. When the number of pulses emitted to the wafer is the minimum number $N_{min}$ ($N=N_{min}$), the scanning speed V is set to $V_{max}$ based on equation (2).

As in the collective-type exposure apparatus, so too in the scanning-type exposure apparatus, when a pulsed laser beam is used as the exposure light beam, a number of pulses greater than the minimum number of exposure pulses must be emitted onto each point of the wafer in order to achieve a desired exposure-control accuracy. Therefore, when the designated amount of exposure dose is considerably small, as in the case where a high-sensitivity resist is exposed, each pulse of the laser beam is attenuated by an attenuator (or an energy regulator), which is positioned in the optical path, so that a number of laser pulses greater than the minimum number is emitted to the wafer while preventing the exposure dose from exceeding the designated amount.

An example of the energy regulator for roughly adjusting the exposure dose is shown in FIG. 28(C). The energy adjuster of this example comprises one or more rotatable discs 80, named revolvers, each of which has several ND filters 84 having different transmittances. Transmittance equals (1−attenuation rate). By rotating the respective revolver 80, the transmittance with respect to the incident laser beam LB can be changed to many different values, up to 100%. In the example of FIG. 28(C), the transmittance can be changed to 36 different values (6×6=36). With this energy regulator, the transmittance (i.e., attenuation rate) can be changed only by discrete intervals, normally based on a geometric series.

Because the transmittance can be adjusted only in discrete (not in continuous) fashion, it is often difficult for this type of energy regulator to set the value of the designated attenuation rate to exactly correspond to the designated amount of exposure dose. Therefore, a combination of ND filters that achieves an attenuation rate closest to and less than the target attenuation rate is employed. Consequently, the number N of pulses emitted to each point of the wafer must be further increased in order to take into account the discrete (not continuous) character of the means of adjusting the ND filter transmittance. In other words, the number N of exposure pulses must be increased further beyond the minimum number $N_{min}$ to take into account the difference between the target attenuation rate (which could be realized by an ideal continuous-variable energy regulator) and the selected closest attenuation rate. In this case, the scanning speed V cannot be maintained at its maximum, as is clear from equation (2). As a result, the exposure time $T_{exp}$ which equals Ws/V, becomes longer because of the discrete character of the means for adjusting the transmittance of the ND filters, and the throughput of the system drops at certain values of the designated amount of exposure dose. The relation between the designated amount of exposure dose ($S_0$) and the exposure time ($T_{exp}$) using this type of energy regulator is shown in FIG. 5 by the dashed line.

In general, an illuminance-distribution control mechanism is also provided in a projection exposure apparatus for the purpose of keeping the exposure dose projected onto each shot area of the wafer within an appropriate range.

In a collective exposure type exposure apparatus, the illumination-distribution is controlled using an optical integrator (such as a fly-eye lens), which is positioned in the illumination optical system to form multiple light-source images, thereby superposing luminous fluxes issuing from the multiple light-source images onto the wafer. With a collective-type exposure apparatus, the wafer is at rest when each shot area of the wafer is exposed. Accordingly, the integral exposure dose on each shot area is calculated by continuously receiving a monitoring light flux, which is obtained by splitting a portion of the illumination light during the actual exposure process, by integrating the photoelectrically converted signals of the received monitoring light flux, and by multiplying the integrated signals by a prescribed coefficient, which was obtained experimentally in advance.

Thus, the exposure control mechanism of a collective-type projection exposure apparatus can be easily composed of a photoelectric detector (integrator sensor) for receiving the monitoring light flux, an integrator for integrating the detection signals from the integrator sensor, and a controller for controlling the illuminance of the illumination light (or the exposure time) so that the difference between the integral result and the target value is reduced.

Meanwhile, a deformed light source, in which the aperture of the illumination system aperture stop is off-center from the optical axis for the purpose of improving the focal depth and the resolution for a fine and periodical pattern, has been proposed in, for example, Japanese Patent Application Laid-open No. 4-225358. A zonal illumination method for making the aperture shape of the aperture stop annular has also been proposed. Even if the aperture shape of the aperture stop is varied, the actual illuminance on the wafer surface can be accurately monitored by positioning the light-receiving surface of the integrator sensor on a detection surface that is substantially conjugate with the wafer surface. The exposure time, or the illuminance of the illumination light, is controlled so that the integral value of the detection signals from the integrator sensor is converged to the target value, thereby keeping the integrated exposure dose on each shot area of the wafer within the appropriate range.

A scanning-type projection exposure apparatus, which is often called a slit-scan type or step-and-scan type apparatus, also uses an optical integrator, as in the collective-type exposure apparatus. In the scanning-type of exposure apparatus, if a fly-eye lens is used as the optical integrator, the incident plane of each lens element of the fly-eye lens is conjugate with the pattern surface of the reticle. The illumination area on the reticle has a long rectangular or arc shape, and is often referred to as a slit-like illumination area. In order to improve the illumination efficiency, it is preferable for the lens element to have a long rectangular cross-section similar to the slit-like illumination area.

However, as has been described above, it is difficult to apply the exposure control method used in the collective-type exposure apparatus to the scanning-type exposure apparatus as it is, because, in the scanning-type exposure apparatus, the wafer is scanned relative to the slit-like exposure area formed on the wafer surface (which is conjugate with the slit-like illumination area on the reticle). The exposure dose on each shot area must be controlled so that the integral exposure dose is kept constant over all the points on the wafer while the wafer is passing through the slit-like exposure area. If the integral exposure dose differs among the respective points in the wafer shot area, an error or unevenness is caused in the exposure result of that shot area, which has an effect similar to that of an illumination error or unevenness caused in the collective-type exposure apparatus.

As one of the integral exposure control methods, a shutter is used in a collective-type exposure apparatus, in which the exposure time is controlled by opening or closing the shutter. However, this method cannot be applied to the scanning-type exposure apparatus because the exposure is performed continuously. Therefore, the scanning-type exposure apparatus controls the integral exposure dose by, for example, setting appropriate scanning speeds for the reticle and wafer. It is difficult, however, to change the scanning speeds by a small amount to adjust the integral exposure dose on the wafer in real time during the scanning exposure process.

It is necessary for the scanning-type exposure apparatus to control the illumination light so that the illuminance of the illumination light emitted onto the wafer is stably maintained during the scanning exposure process. One example of such a control method is a constant illuminance control method that constantly monitors the illuminance of the illumination light and feeds the monitoring result back to the power source of the exposure light source to control the electric power supplied from the power source to the light source.

In the scanning-type exposure apparatus, the exposure dose is adjusted according to the sensitivity of the resist. An amount of exposure dose suitable for the sensitivity of the wafer is supplied to the wafer by adjusting the scanning speed, the quantity of illumination light, the width of the slit, or a combination of these factors.

If the output power of the lamp (light source) is p and the attenuation rate of the attenuation plate is $q_1$, the exposure dose e on the wafer is expressed by the following equation using a coefficient k, which is defined according to the shape of the aperture stop in the illumination system:

$$e = kpq_1 \quad (101)$$

If the width of the slit-like exposure area in the scanning direction on the wafer surface is D and the scanning speed of the wafer during the scanning exposure operation is $V_w$, the integral exposure dose $\Sigma E$ on the wafer is expressed as follows in terms of equation (101):

$$\Sigma E = e(D/Vw) = kpq_1(D/Vw) \quad (102)$$

For instance, if the width D of the slit-like exposure area on the wafer is fixed, then the integral exposure dose $\Sigma E$ is proportional to the attenuation parameter r, and is inversely proportional to the scanning speed $V_w$. This relation is expressed as follows:

$$\Sigma E \; rP_{max}/Vw \quad (103)$$

From the relation (103), structure for adjusting the integral exposure dose can be grouped into a means for changing the scanning speed $V_w$ and a means for changing the attenuation rate. According to these two groups, the sensitivity of the resist can also be grouped into two regions, that is, a low-sensitivity region (the right half shown in FIG. 29), where the integral exposure dose can be adjusted by solely regulating the scanning speed $V_w$, and a high-sensitivity region (the left half shown in FIG. 29), where the intensity of each pulse of the beam is adjusted by the attenuator so as to control the total amount of exposure dose. In other words, appropriate integral exposure dose adjusting structure can be selected according to the sensitivity of the resist.

Since the scanning speed can be changed in continuous fashion, the integral exposure dose on the wafer can be finely adjusted according to the sensitivity of the resist in the low-sensitivity region. However, when using an attenuator to change the quantity of exposure light in the high-sensitivity region, it is very difficult to adjust the quantity of exposure light always in continuous fashion because an attenuation plate, which is often used as the attenuator, changes the attenuation rate only in discrete fashion.

For this reason, in practice, it is necessary to adjust the scanning speed for each value of the attenuation rate (or the transmittance) of the attenuation plate so as to correspond to the sensitivity of the resist, as shown in FIG. 30. This method causes the throughput to be reduced.

In order to prevent the throughput from dropping, the discrete values of the attenuation rate (transmittance) must be set finely. This requires an increased number of attenuation plates, which are then assembled in multiple stages. This is inconvenient because the structure of the optical system becomes excessively complicated.

In addition to the problem of the throughput, there is still another problem in that if a high-sensitivity resist is used, the exposure dose must be controlled with higher accuracy than that required by a low-sensitivity resist; otherwise, scanning exposure cannot be satisfactorily performed. This means that an attenuator that is capable of changing the quantity of exposure in continuous fashion is required.

Yet another problem is that an impure gas component in the air may photochemically react with the oxygen, and the reactant may adhere onto the surfaces of lens components of the illumination optical system as a blur, which causes the illuminance to drop. It is known that the blur caused by such a photochemical reaction increases in proportion to the density of the impure gas, the quantity of light, and the illumination time. Some kinds of blur can be removed by rinsing the parts with pure water, but others cannot be removed. In the latter case, the blurred parts must be replaced with new parts. The blur reduces the illuminance of the exposure light onto the wafer, and the lamp (light source) must be frequently replaced. The maintenance tasks and the cost of running the apparatus increase, while the throughput decreases.

In a step-and-repeat type exposure apparatus, the lenses (i.e., glass components) of the illumination optical system are illuminated only when the shutter is open (i.e., only during the exposure process). On the other hand, in a step-and-scan type exposure apparatus, which performs exposure with a constant illuminance, if the illuminance is monitored at a position conjugate with the wafer surface in the optical path under uniform illumination, the illumination light continuously strikes the lenses not only during the actual exposure period, but even during the stabilizing period for adjusting the illuminance. This increases the blur, as well as the load on the lenses, and the life of the lens is shortened.

In recent years, the illuminance of an illumination optical system has been increased for the purpose of improving the throughput. This situation even worsens the problem of blur mentioned above.

SUMMARY OF THE INVENTION

The present invention was conceived in view of these problems in the prior art. It is an object of the invention to provide a scanning exposure method and a scanning-type exposure apparatus that can accurately control the exposure dose. It is another object of the invention to provide a scanning exposure method and a scanning-type exposure apparatus that can precisely transfer the image of a circuit pattern formed on a mask onto a substrate by exposing the substrate to pulsed light, without reducing the throughput. It is still another object of the invention to provide a scanning exposure method and a scanning-type exposure apparatus that can expose a substrate at an appropriate exposure dose regardless of the sensitivity of the resist layer formed on the substrate. It is yet another object of the invention to provide a scanning exposure method and a scanning-type exposure apparatus that can achieve a desired integral amount of exposure dose on a substrate, while keeping the scanning speed of the substrate constant, even if the energy of each pulse of the light source fluctuates during the exposure process. It is still another object of the invention to provide a scanning exposure method and a scanning-type exposure apparatus that can prevent blur from occurring in the optical system. It is yet another object of the invention to provide a scanning exposure method and a scanning-type exposure apparatus that can prolong the life of the light source.

In order to achieve these and other objects, the scanning exposure method according to the invention transfers a pattern formed on a mask onto a substrate by scanning the mask and the substrate synchronously with respect to pulsed light emitted from a pulsed laser light source. This scanning exposure method includes the steps of (i) determining a number of pulses of a light beam that are to be emitted to each point on the substrate during the scanning exposure process, and (ii) controlling the light source according to the determined number of pulses, so that the maximum scanning speeds of the mask and the substrate and/or the maximum oscillation period of the pulsed light are maintained during the scanning exposure process.

The number N of the pulses that are to be emitted on each point on the substrate is determined prior to the scanning exposure process. During the actual scanning exposure process, the pulsed laser light source is controlled so that the scanning speeds of the mask and the substrate and/or the oscillation period of the pulsed light are kept at their maximum based on the determined number N of the pulses.

In the high-sensitivity region, where the designated amount of exposure dose (i.e., the integral amount of exposure dose emitted on the substrate) is small, the designated amount of exposure dose can easily be achieved while keeping the scanning speeds of the mask and the substrate at their maximum, and therefore, a high throughput can be maintained. In this case, the oscillation frequency of the pulsed laser source is controlled based on equation (2) above.

In the low-sensitive region, where the designated amount of exposure dose is large, the synchronous scanning speeds of the mask and the substrate cannot be maintained at their maximum. In this case, the oscillation frequency of the light source (i.e., the oscillation period of the pulsed light) is set at its maximum, and the scanning speeds of the mask and the substrate are adjusted based on equation (2). As is clear from equation (2), if the maximum oscillation frequency is $f_{max}$, the scanning speed is $(f_{max}/f_0)$ times as high as the conventional speed, and the exposure time required for exposing a point on the substrate can be reduced to $f_0/f_{max}$ of the conventional exposure time. Because $f_{max}$ is equal to or greater than $f_0$ ($f_{max} \geq f_0$), the throughput increases even in the low-sensitivity region. If the energy of the pulsed laser source can be changed in continuous fashion, the range of the designated amount of exposure dose that can be used at the maximum scanning speed is broadened, as compared with the conventional apparatus.

In another aspect of the invention, a scanning-type exposure apparatus is provided that includes a pulsed laser source that emits pulsed light along an optical path, a mask stage disposed in the optical path and used for supporting a mask and which is movable in the prescribed scanning direction, and a substrate stage supporting a substrate and being movable at least in the scanning direction. The scanning-type exposure apparatus also has a stage control system communicating with the apparatus components and controlling the scanning speeds of the mask stage and the substrate stage so that the mask stage and the substrate stage are synchronously scanned at a predetermined speed ratio. An alteration system is also provided coupled with the laser source for altering the oscillation frequency of the pulsed laser source. An attenuator is provided in the scanning-type exposure apparatus to attenuate the quantity of pulsed light. The control system controls the alteration system according to the number of pulses that are to be emitted to each point of the substrate when performing scanning exposure using the attenuated pulsed light, so that the scanning speeds of the mask stage and the substrate stage and/or the oscillation frequency of the pulsed laser light are maintained at their maximum.

If the designated amount of exposure dose is small, and if the intensity of the pulsed light emitted by the pulsed laser source is high relative to the designated amount of exposure dose, then the pulsed light is attenuated by the attenuator to keep the number of exposure pulses greater than the minimum number. When the substrate is exposed to the attenuated light during scanning exposure, the number of pulses emitted onto each point on the substrate is varied according to the attenuation rate so as not to drop below the minimum necessary number. Thus, the control system controls the alteration system according to the number of pulses emitted onto each point of the substrate so that the scanning speeds of the mask stage and the substrate stage and/or the oscillation frequency of the pulsed laser source are maintained at their maximum.

In other words, the oscillation frequency f of the pulsed laser source is controlled by the control system according to the number N of exposure pulses to maintain both or either the maximum scanning speeds of the mask stage and the substrate stage and/or the maximum oscillation frequency. For example, in the high-sensitivity region, where the designated amount of exposure dose is small and the necessary oscillation frequency of the laser is not so high, both the mask stage and the substrate stage can be scanned at their maximum speeds during the scanning exposure process, and the throughput is also maintained at its maximum. In this case, the oscillation frequency of the pulsed laser source is controlled based on equation (2) above.

In the low-sensitivity region, where the designated amount of exposure dose for the substrate is large, the attenuation rate of the pulsed light is set to 0% (i.e., the transmittance is set to 100%), and the scanning speeds of the mask stage and the substrate stage are reduced from their maximums. In this case, the oscillation frequency of the laser is set to its maximum, and the scanning speeds of the mask and the substrate are adjusted based on equation (2). As is clear from equation (2), if the maximum oscillation frequency is $f_{max}$, the scanning speed is ($f_{max}/f_0$) times as high as the conventional speed, and the exposure time required for exposing a point on the substrate can be reduced to $f_0/f_{max}$ of the conventional exposure time. Because $f_{max}$ is equal to or greater than $f_0$ ($f_{max} \geq f_0$), the throughput increases even in the low-sensitivity region. Even if the energy of the pulsed laser source can be changed in continuous fashion, the range of the designated amount of exposure dose that can be used at the maximum scanning speeds is broadened, as compared with the conventional apparatus.

In accordance with still another aspect of the invention, a scanning exposure method for transferring an image of a mask pattern onto a plurality of shot areas of a substrate is provided. In this method, during the process of exposing a shot area on the substrate, integral values of the amount of exposure energy are detected at a plurality of points in that shot area. Based on this detection result, the oscillation frequency of the pulsed light that is to be emitted to the next shot area is determined so that the next shot area is exposed at an appropriate exposure level.

Therefore, even if an unacceptable error occurs in the determination of the amount of integrated exposure dose used to expose a given shot area, the oscillation frequency of the pulsed light is nevertheless controlled correctly based on the integral exposure dose detected during that exposure process, thereby exposing the next shot area at an appropriate level. In other words, the number of pulses is adjusted for the next shot area, without changing the scanning speed, so as to achieve a desired value for the integral exposure dose.

In still another aspect of the invention, the light source and/or the exposure light emitted from that light source are adjusted so that the output level of the light source is set to the minimum required level, and so that the target value of the integral exposure dose is reliably achieved without reducing the scanning speeds of the mask and the substrate from their maximum.

With this method, scanning exposure is performed by moving the mask and the substrate synchronously at their maximum speeds, while setting the output level of the light source at the minimum necessary level. Owing to the low output level, the parts (glass components) of the illumination system can be prevented from deteriorating. As a result, the life of the light source can be prolonged, and at the same time, the throughput can be kept high.

In yet another aspect of the invention, the electric power of the light source is controlled at a constant level in an open loop, as a rough adjustment step, prior to a constant illuminance control step. This rough adjustment step is referred to as a constant electric power control step. On the other hand, in the constant illuminance control step, the illuminance of the light source is precisely controlled at a certain constant level.

In other words, before the illuminance of the light source (e.g., a mercury-vapor lamp) is finely controlled at a constant level, the illuminance is roughly adjusted to near the target value by the constant electric power control step in the open loop. This two-step control can reduce the time required to reach the target value and improve the throughput.

In yet another aspect of the invention, during the process for exposing the substrate to the laser beam, while scanning the substrate, to transfer the mask pattern, the illuminance of the light source is controlled at a constant value. When the exposure process is not being performed, the electric power of the light source is set to a lower level in the open loop. In this arrangement, the power consumption of the light source can be reduced, and therefore, the deterioration of the light source can be prevented. At the same time, the next exposure process can begin smoothly.

In still another aspect of the invention, when the exposure apparatus is not performing exposure (i.e., during the non-exposure period of the operation), the illuminance of the light source is maintained at a constant level, but the exposure light is blocked by a blind so as not to reach the mask or the mask stage. This arrangement precludes the need for readjustment of the exposure dose of the light source, thereby eliminating the time required for adjusting the exposure dose.

BRIEF DESCRIPTION OF THE DRAWINGS

The above and other objects, features, and advantages of the present invention are further described in the detailed description that follows, with reference to the drawings by way of non-limiting exemplary embodiments of the present invention, wherein like reference numerals represent like parts throughout the several views, and wherein:

FIGS. 13(A)–(C) illustrate a mosaic fly-eye lens (second fly-eye lens) used in the apparatus shown in FIG. 11, in which FIG. 13(A) is an enlarged side view of the fly-eye lens, FIG. 13(B) is a front view of the first bundle of lenses taken along the BB line in FIG. 13(A), and FIG. 13(C) is a front view of the second bundle of lenses taken along the CC line in FIG. 13(A);

DETAILED DESCRIPTION OF PREFERRED EMBODIMENTS

The first embodiment of the present invention will be explained with reference to FIGS. 1–6.

Figure 1:
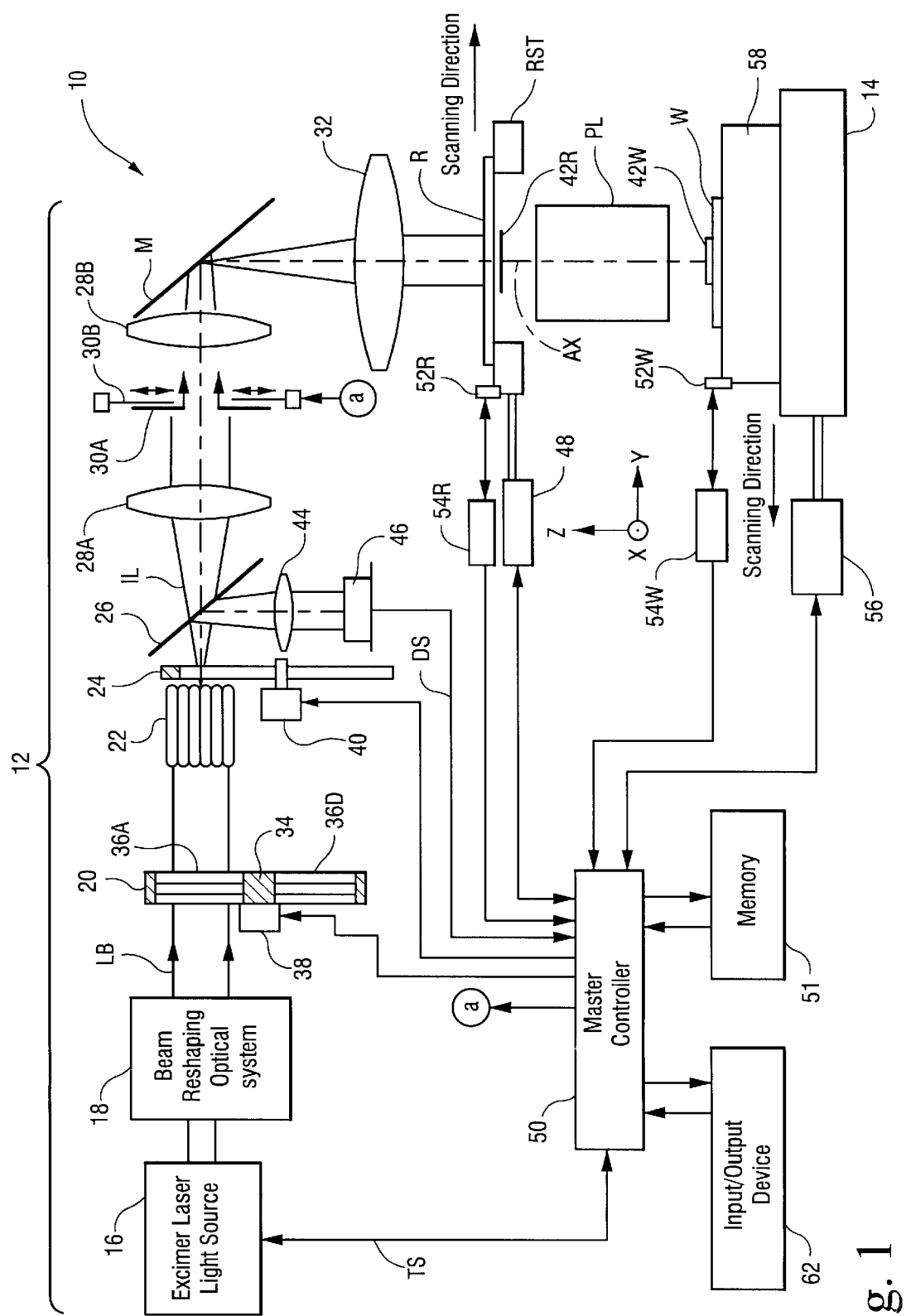
FIG. 1 is a schematic diagram showing the structure of the scanning-type exposure apparatus according to the first embodiment of the invention.

FIG. 1 is a schematic illustration of a scanning exposure device 10 according to the first embodiment of the invention. This scanning exposure device 10 is a step-and-scan type apparatus in which an excimer laser light source is used as a pulsed laser light source for exposure.

The scanning exposure device 10 comprises an illumination system 12 including an excimer laser light source 16, a reticle stage RST as a mask stage on which a reticle R (mask) illuminated by the illumination system 12 is held and moved in a prescribed scanning direction, a projection optical system PL, which projects the pattern of the reticle R onto a wafer substrate W, an XY stage 14, which holds and horizontally (on the XY plane) moves the wafer W, and a system that controls these components.

The illumination system 12 comprises the excimer laser light source 16, a beam reshaping optical system 18, an energy rough modulator 20, a fly-eye lens 22, an aperture stop plate 24, a beam splitter 26, a first relay lens 28A, a second relay lens 28B, a fixed reticle blind 30A, a movable reticle blind 30B, a mirror M for bending the optical path, and a condenser lens 32.

Each component of the above-mentioned illumination system 12 will be explained. A KrF excimer laser light source (oscillation wavelength 248 nm) or an ArF excimer laser light source (oscillation wavelength 193 nm) and the like are used for the excimer laser light source 16. A pulsed light source such as a metal vapor laser light source or a higher harmonics generator, which generates YAG laser and the like, can be used for an exposure light source instead of the excimer laser light source 16.

The beam reshaping optical system 18 reshapes the cross section of a laser beam LB pulse emitted from the excimer laser light source 16 so that the laser beam LB will efficiently enter the fly-eye lens 22 installed behind the laser beam LB. The beam reshaping optical system 18 comprises, for example, a cylinder lens or a beam expander (whose drawings are omitted here) and the like.

The energy rough controller 20 is installed on the optical path of the laser beam LB, which lies behind the beam reshaping optical system 18. Here, several (for instance 6) ND filters with different transmittance (1−light attenuation rate) are installed around a rotary plate 34 (FIG. 1 illustrates two ND filters 36A and 36D out of the six.). By rotating the rotary plate by a driving motor 38, the transmittance can be adjusted with respect to the incident laser beam LB in multiple steps starting from 10% in the form of a geometrical progression. The driving motor 38 is controlled by a main control device 50, which will be described later. By installing another similar rotary plate above the rotary plate 34, and by combining the two sets of ND filters, the transmittance can be controlled more finely (cf. FIG. 26(C)).

The fly-eye lens 22 is installed on the optical path of the laser beam LB positioned behind the energy rough controller 20 and provides a plurality of secondary light sources that illuminate the reticle R with uniform illuminance distribution. A laser beam emitted from this secondary light source will be called "a pulsed illumination light IL" in the following.

The aperture stop plate 24 comprising a disk-shaped component is installed in a vicinity of the emission surface of the fly-eye lens 22. On this illumination-type aperture stop plate 24, an aperture stop consisting of a standard circular aperture, an aperture stop comprising a small circular aperture designed to reduce the coherence factor F, an annular-shaped aperture stop for zonal illumination, and a deformation aperture stop whose multiple apertures are eccentrically positioned with respect to the optical axis for the purpose of deformation illumination (FIG. 1 illustrates only two kinds of the aperture stops listed here) and the like, for example, are installed. This aperture stop plate is rotated by a driving device 40 such as a motor controlled by a main control device 50. The driving device 40 selects and installs an aperture stop on the optical path of the pulsed illumination light IL.

A large beam splitter 26 with a small reflectance and a large transmittance is installed on the optical path of the pulsed illumination light IL positioned behind the aperture stop plate 24. A relay optical system consisting of a first relay lens 28A and a second relay lens 28B is installed behind the beam splitter 26 via a fixed reticle blind 30A and a movable reticle blind 30B.

The fixed reticle blind 30A is installed on a plane slightly defocused from a plane that is conjugate with respect to the pattern plane of the reticle R, and forms a rectangular aperture that specifies an illumination field 42R on the reticle R. The movable reticle blind 30B having an aperture component whose position and width along the scanning direction are variable is installed, which prevents unwanted exposure by further restricting the exposure field 42R via the movable blind 30B at the beginning and the end of scanning exposure.

On the optical path behind the second relay lens 28B comprising the relay optical system, the bending mirror M is installed for reflecting the pulsed illumination light IL toward the reticle R. The condenser lens 32 is positioned on the optical path behind the mirror M.

In operation, the laser beam LB pulse emitted from the excimer laser light source 16 enters the beam reshaping optical system 18. Here, the laser beam LB cross-section is reshaped so that the beam will efficiently enter the fly-eye lens 22 lying behind the beam reshaping optical system 18, and then the beam enters the energy rough controller 20. The laser beam LB, which has passed through one of the ND filters in the energy rough controller 20, enters the fly-eye lens 22. At this stage, multiple secondary light sources are created on the emission surface of the fly-eye lens 22. The pulsed illumination light IL emitted from these multiple secondary light sources passes through one of the aperture stops on the aperture stop plate 24 and reaches the small beam splitter whose transmittance is large and reflectance is small. The pulsed illumination light IL as the exposure light, which has passed through this beam splitter 26, passes through a rectangular aperture component of the fixed reticle blind 30A and the movable reticle blind 30B via the first relay lens 28A. Then, the pulsed illumination light IL passes through the second relay lens 28B, and its optical path is bent vertically downward by the mirror M. Subsequently, the pulsed illumination light IL passes through the condenser lens 32 and forms a rectangular illumination field 42R whose illuminance distribution is uniform on the reticle R held on a reticle stage RST.

The pulsed illumination light IL reflected by the beam splitter 26 is intercepted by an integrator sensor 46 comprising photoelectric transfer elements via a condenser lens 44. A photoelectric transfer signal emitted from the integrator sensor 46 is supplied as an output DS (digit/pulse) to the main control device 50 via a peak hold circuit (not shown) and an A/D converter. For the integrator 46, for example, a PIN type diode having high response frequencies for analyzing the pulse emission of the excimer laser light source 16 and the like can be used. The correlation coefficient between the output DS of this integrator sensor 46 (the illuminance of the illuminating light IL that enters the integrator sensor) and the illuminance of the pulsed illuminating light IL on the surface of the wafer W is predetermined and stored in a memory 51 installed in the main control device 50.

The reticle R is installed on the reticle stage RST and is held by adsorption via a vacuum check valve and the like. The reticle stage RST can be micro-mobilized on the horizontal plane (XY-plane), and can be shifted along the scanning direction (the Y-direction, which corresponds to the left-right direction on the page FIG. 1 is listed) within a prescribed range by the reticle stage mobilization component. The position of the reticle stage RST is measured by an external laser interferometer 54R via a movable mirror 52R fixed on the reticle stage RST. The values measured by the laser interferometer 54R are provided to the main control device 50.

The projection optical system PL consists of multiple lens elements that share the same optical axis AX along the direction of the Z-axis. Each of the lens elements is installed in the projection optical system PL so that the system becomes both-side telecentric. For this projection optical system PL, those with projection magnification power $\alpha$ ($\alpha$ is 1/4 or 1/5, for instance) are used. For this reason, as described above, when the illumination field 42R on the reticle R is illuminated by the pulsed illuminating light IL, the image of the pattern formed on the reticle R reduced by the projection optical system PL by the projection magnification power $\alpha$ is projected onto the slit-shaped exposure field 42W (an illumination field conjugate with the illumination field 42R on the reticle R) on the wafer W whose surface is coated with a photoresist (photosensitive) material.

The wafer W is installed on an XY stage 14, which is designed to be two dimensionally movable on the XY plane along the Y direction, which is the scanning direction, and along the X direction orthogonal the Y direction (the vertical direction on FIG. 1) by a wafer mobilization component 56. On the XY stage 14, a Z-tilt stage 58 is installed. The wafer W is held in a wafer holder (not shown) on the Z-tilt stage 58 by vacuum adsorption and the like. The Z-tilt stage 58 controls the position of the wafer W along the Z-direction and controls the tilt angle of the wafer W with respect to the XY plane. The position of the XY stage 14 is measured by a second external laser interferometer 54W via a movable mirror 52W fixed on the Z-tilt stage 58. The values measured by the laser interferometer 54W are provided to the main control device 50.

The main control device 50 comprises a microcomputer (or a minicomputer) consisting of a CPU (Central Processing Unit), a ROM (Read Only Memory), a RAM (Random Access Memory) and the like, and controls, for example, the synchronous scanning of the reticle R and the wafer W, stepping of the wafer W, exposure timing, and the like as a whole so that the exposure operation is accurately performed.

More concretely, the main control device 50 controls the position and velocity of the reticle stage RST and those of the XY stage 14 based on the values measured by the laser interferometers 54R and 54W via the reticle stage mobilization component 48 and the wafer stage mobilization component 56, respectively. For example, the wafer W moves in the -Y direction (or the +Y direction) at the speed $\alpha$ ($V_R$) (where $\alpha$ is a projection magnification power from the reticle R with respect to the wafer W) with respect to the exposure field 42W at the same time as the reticle R moves in the direction +Y (or the direction -Y) at the speed V with respect to the illumination field 42R during scanning exposure. During a stepping operation, the main control device 50 controls the position of the XY stage 14 based on the values measured by the laser interferometer 54W via the wafer stage mobilization component 56. In this way, according to the first embodiment of the present invention, the stage control system consists of the main control device 50, the laser interferometers 54R and 54W, the reticle stage mobilization component 48 and the wafer stage mobilization component 56.

The main control device 50 controls emission timing and the emission light amount and the like of the excimer laser 16 by supplying the control information TS to the excimer lens 16. In addition, the main control device 50 controls the energy rough controller 20 and the aperture stop plate 24 via a motor 38 and mobilization device 40, respectively, and controls the switching action of the movable reticle blind 30B in synchronization with the motion of the stage system. In this way, the main control device 50 plays the role of an exposure controller and a stage controller according to the present embodiment. Of course, these controllers can be installed separately from the main control device 50.

Figure 2:
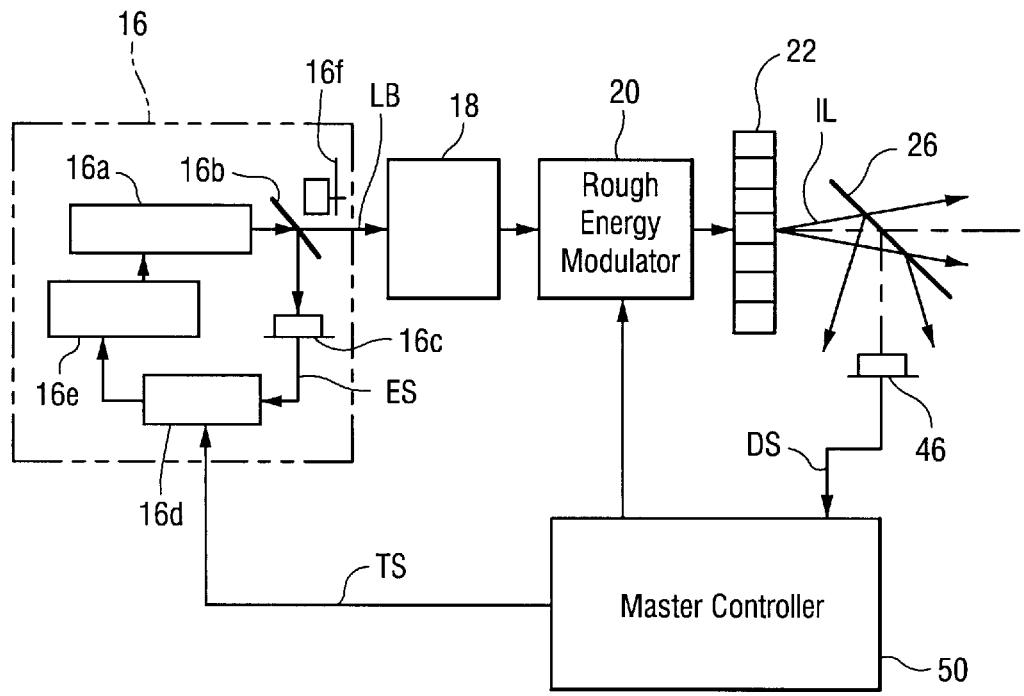
FIG. 2 is a block diagram showing the structure of the exposure dose control components used in the apparatus shown in FIG. 1.

FIG. 2 isolates and illustrates components related to the exposure dose control of the scanning exposure device 10 depicted in FIG. 1. As FIG. 2 illustrates, the excimer laser 16 comprises a laser resonator 16a, a beam splitter 16b, energy monitors 16c, 16d, and a high voltage power source 16e.

In FIG. 2, the laser beam emitted from the laser resonator 16a in the form of a pulse enters the beam splitter 16b whose transmittance is high and reflectance is low. The laser beam LB, which has passed through the splitter 16b is emitted outside toward the beam reshaping optical system 18. The laser beam LB reflected by the beam splitter 16b enters the energy monitor 16c consisting of photoelectric transfer elements. The photoelectric transfer signal from the energy monitor 16c is supplied to the energy controller 16d as the output ES via a peak hold circuit (not shown in FIG. 2). The unit of the energy control amount that corresponds to the output ES of the energy monitor 16c is (mJ/pulse). The energy controller 16d feedback-controls the source voltage at the high voltage power source 16e so that the output ES of the energy monitor 16c corresponds to the target energy value per pulse of the control information TS supplied from the main control device 50. The energy controller 16d also alters even oscillation frequencies via the high voltage source 16e by controlling the energy supplied to the laser resonator 16a. That is, the energy controller 16d sets the oscillation frequency of the excimer laser light source 16 to the frequency prescribed by the main control device 50 corresponding to the control information TS supplied from the main control device 50. In addition, the main control device 50 feedback-controls the source voltage of the high voltage source 16e so that the energy per pulse at the excimer laser light source 16 corresponds to the value instructed by the main control device 50.

A shutter 16f is installed outside the beam splitter 16b within the excimer laser light source 16 for the purpose of shielding the laser beam LB corresponding to the control information from the main control device 50.

At the time of implementing a control table (described below), the output ES of the energy monitor 16c is supplied to the main control device 50 via the energy controller 16d. The relation between the output ES of the energy controller 16d and output DS of the integrator sensor 46 is figured out in the main control device 50. Then, during scanning exposure, the main control device 50 sends the prescribed control information TS to the energy controller 16c, lets the excimer laser light source 16 perform pulse emission, integrates the output DS from the integrator sensor 46 for each pulsed illumination light, and obtains an integral exposure dose sequentially at each point of the wafer W. The main control device 50 controls the transmittance at the energy rough controller 20 and micro-controls the energy per pulse of the laser light source 16 before exposing the wafer to the laser beam so that the integral exposure dose at each point on the wafer W becomes a target exposure dose for the photoresist on the wafer W.

An example of an exposure dose control operation in the scanning exposure device 10 structured as above will be described.

An implementation procedure of a control table, which is a prerequisite to the exposure dose control, will first be described. The unit of the output ES of the energy monitor 16c inside the excimer laser light source 16 is set as (mJ/pulse) in order to implement a control table centered around the integrator sensor 46. As mentioned above, the unit (the unit of energy-control amount) of the output DS of the integrator sensor 46 is (digit/pulse).

The output DS of the integrator sensor 46 is assumed to be pre-calibrated with respect to the output of a standard illumination photometer (not shown in FIG. 1) installed on the Z-tilt stage 58 in FIG. 1 at the same height as the image plane (i.e, the wafer surface). The data processing unit of the standard illumination photometer is a physical quantity expressed by $(mJ/(cm^2 \cdot pulse))$. Calibration of the integrator sensor 46 is equivalent to obtaining a transformation coefficient or function that transforms an output DS (digit/pulse) of the integrator sensor 46 into an exposure dose $(mJ/(cm^2 \cdot pulse))$ on the image plane. By using this transformation coefficient or function, an exposure dose supplied indirectly onto the image plane from the output DS of the integrator sensor 46 can be measured. Hence, in the following, the exposure dose on the image plane indirectly obtainable from the output DS of the integrator sensor 46 as the amount P processed by the integrator sensor 46 will be explained.

The relation between the exposure dose on the image plane (i.e, the processed amount P $(mJ/(cm^2 \cdot pulse))$ by the integrator sensor 46) and the output ES (mJ/pulse) of the energy monitor 16c within the excimer laser light source 16 can be obtained. As a prerequisite condition for obtaining the relation, it is assumed that the energy E per pulse of the laser beam LB emitted from the excimer laser light source 16 is stabilized at a prescribed level of the central energy $E_0$. It is also assumed that the transmittance at the energy rough controller 20 can be set at 100%.

The energy E of the laser beam LB is varied around the central energy $E_0$ as follows. Here, the number of data used in obtaining the correlation data is denoted by $N_{DATA}$.

$$E = E_0 \{1 \pm (i/N_{DATA}) \times E_R/E_0\} \quad (3)$$

where $E_R$ represents the required energy modulation range. The ratio $E_R/E_0$ typically lies between 0.02 and 0.03. Also, i represents an integer. The value of i is changed from 0 to $N_{DATA}$, for example.

The excimer laser light source 16 emits pulses by actually changing the value of i, and the value $P_i$ of the amount P processed by the integrator sensor 46 and the value $E_i$ of the output ES of the energy monitor 16c are recorded as the correlated data $(P_i, E_i)$. A result from one pulse or from the average of the values obtained from several pulses can be used as data as long as the data has been simultaneously measured.

Figure 3:
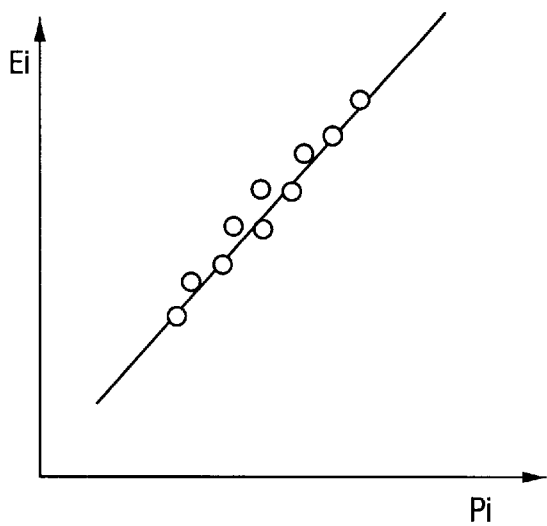
FIG. 3 is a graph showing the correlation between the amount of processing of the integrator sensor and the output of the energy monitor.

FIG. 3 illustrates the correlation data ($P_i$, $E_i$) obtained in this way. In FIG. 3, the value $P_i$ of the amount P processed by the integrator sensor 46 is plotted on the horizontal axis, and the value $E_i$ of the output of the energy monitor 16c is plotted along the vertical axis. Then, for example, by interpolating the correlation data in FIG. 3, a transformation function f(P) is obtained to be used for computing the output ES (mJ/pulse) of the energy monitor 16c from the amount P (mJ/($cm^2$·pulse)) processed by the integrator sensor 46 or to obtain a transformation coefficient that obtains the output ES from the processed amount P. Then, either the transformation function f(P) or the transformation coefficient is recorded in the memory 51 (depicted in FIG. 1) as a control table. After that, based on the processed amount P of the integrator sensor 46 and the control table, the main control device 50 can accurately calculate the output ES of the corresponding energy monitor 16c.

In the following explanation, it is assumed that the relation between the integrator sensor 46 and the energy monitor 16c is highly linear, and the correlation data ($P_i$, $E_i$) can be represented by a linear function like the solid straight line in FIG. 3. It is further assumed that the offset can be regarded as 0, and the slope of the linear function can be treated as a transformation coefficient β. That is, it is assumed that the output ES of the corresponding energy monitor 16c can be calculated by using the processed amount P (mJ/($cm^2$·pulse)) of the integrator sensor 46 and the transformation coefficient β such that:

$$ES = \beta P \quad (4)$$

The master controller 50 calculates the transformation coefficient β from the correlation data in FIG. 3, for example, by least square approximation and records the transformation coefficient β in the memory 51 as a control table. This completes the implementation of the control table.

Next, a fundamental exposure dose control sequence of the scanning exposure device 10 according to the present embodiment will be described referring to the flow chart of FIG. 4, which shows the control algorithm of the CPU contained in the master controller 50. The transmittance of the energy rough controller 20 with respect to the laser beam LB emitted from the excimer laser light source 16 only needs to be set so that the exposure pulse count exceeds the required exposure pulse count. Hence, the fundamental exposure dose control sequence of the scanning exposure device 10 will be explained by focusing on the micro modulation of the energy of the laser beam LB.

First, quantities to be used in the following explanation are defined as follows:

(a) $S_0$: the exposure dose (target exposure dose) to be given to the photo-resist on the wafer W determined by the operator.

(b) N: the pulse count of the pulsed illumination light IL to be illuminated on each point on the wafer (the exposure pulse count).

(c) p: the average pulse energy density (mJ/($cm^2$·pulse)) on the image plane to be measured indirectly by the integrator sensor 46 before exposure.

(d) $A_t$: the target average error (the accuracy to the target amount of the exposure dose) in the exposure dose with respect to the designated exposure dose within each shot area on the wafer.

(e) $P_t$: setting pulse energy (mJ/($cm^2$·pulse)) based on the integrator sensor 46.

(f) $E_t$: energy setting value (mJ/pulse) of the laser beam LB received by the excimer laser light source 16 from the master controller 50. Hence, the following equation holds corresponding to Equation (4).

$$E_t = \beta P_t \quad (5)$$

(g) $V_{max}$: the maximum scanning speed (mm/s) of the XY stage 14.

(h) $N_{min}$: the minimum exposure pulse count per one point on the wafer W.

(i) Ws: the effective exposure slit width (mm) on the wafer surface.

c) $f_{max}$: the actual maximum oscillation frequency (Hz) of the excimer laser light source 16.

$f_0$ is defined to be the neutral value of the laser oscillation frequency f as a prerequisite condition. $f_0$ can be calculated from the following equation corresponding to the intrinsic oscillation frequency in the conventional exposure dose control.

$$f_0 = V_{max} N_{min}/Ws \quad (6)$$

It is assumed that $f_0 < f_{max}$ and that the oscillation frequency can be modulated in the range $f_0 < f < f_{max}$ according to the present embodiment.

In order to minimize the exposure time for providing the designated amount of exposure dose, the rough energy modulator 20 is designed to change its transmittance by discrete intervals based on a geometric series. If the common ratio is r, $r < f_0/f_{max}$ is satisfied in this embodiment.

The standard exposure dose control sequence can thus be described as follows.

Figure 4:
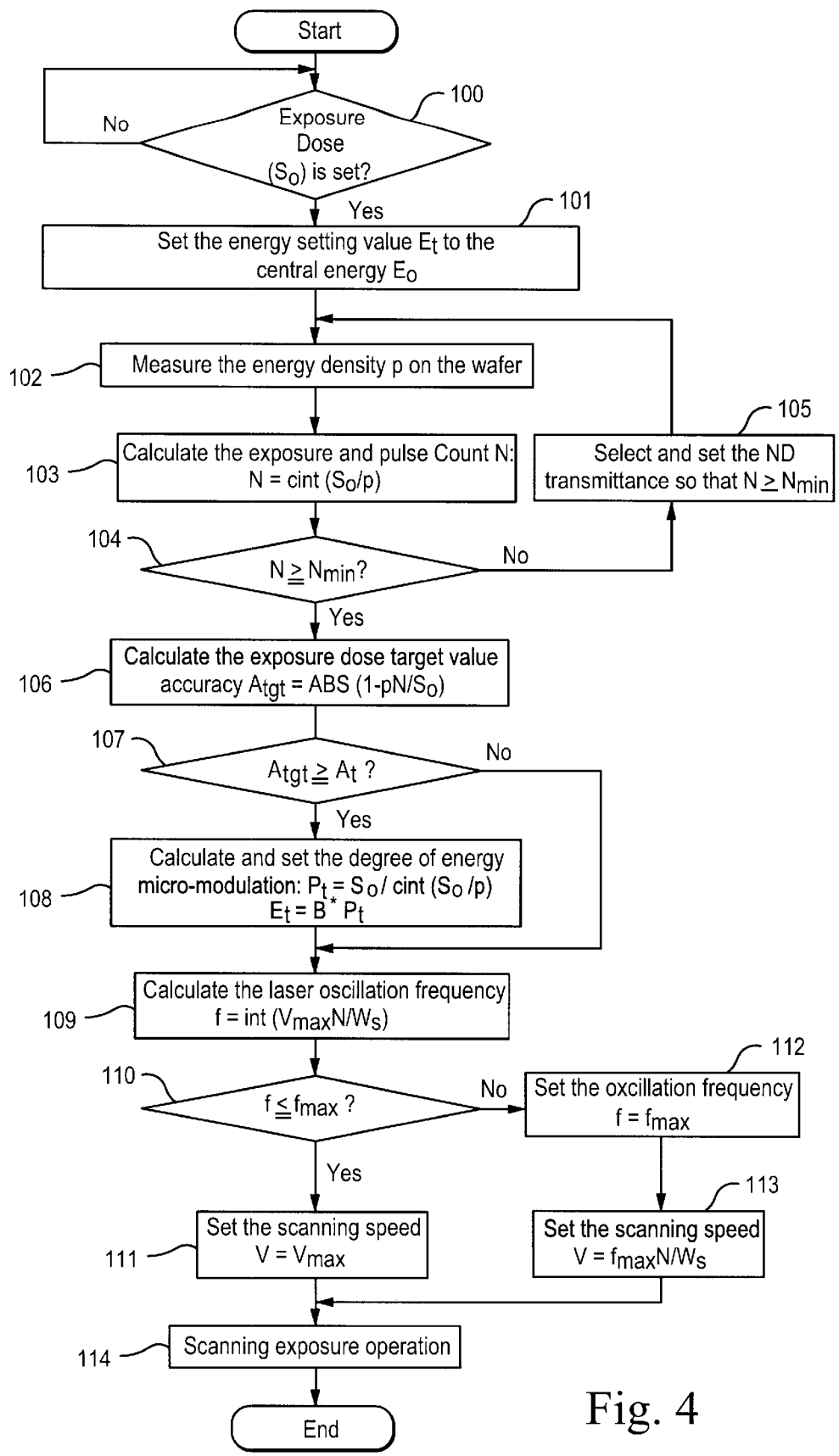
FIG. 4 is a flowchart showing the CPU's exposure dose control algorithm in the master controller according to the first embodiment.

First, at step 100 in FIG. 4, when the target exposure dose $S_0$ is set by the operator via an input-output device 62 (cf. FIG. 1) such as a console, the energy setting value $E_t$ per pulse of the laser beam LB is set to the central energy $E_0$ corresponding to the target exposure dose $S_0$.

In step 102, the average pulse energy density p (mJ/($cm^2$·pulse)) on the wafer W is indirectly measured by letting the excimer laser light source 16 perform pulse emission multiple times (for example several hundred times), and integrating the output of the integrator sensor 46. To perform this measurement, the movable reticle blind is mobilized to completely close the aperture so that the illumination light IL is prevented from reaching the reticle R. Of course, the wafer W can be withdrawn and measurement can be performed by mobilizing the XY stage 14.

In step 103, the exposure pulse count N is calculated using the following equation:

$$N = cint(S_0/p) \quad (7)$$

where the function cint denotes a function that rounds off values below the first decimal point.

In the next step 104, it is determined whether the exposure pulse count N exceeds the minimum exposure pulse count $N_{min}$, which is needed to obtain the required duplication accuracy of the exposure dose control. The minimum exposure pulse count $N_{min}$ is a value to be obtained, for example, based on the ratio δp/p, of the pulse energy distribution (the value of 3σ) δp which is pre-measured and pre-set as a device constant with respect to the average pulse energy density p.

Then, if the decision at step 104 is rejected, i.e, when the exposure pulse count N is less than the minimum exposure pulse count $N_{min}$, the process moves on to step 105. In step 105, a transmittance is selected and set that is closest to $S_0/(N_{min})(p)$ and satisfies $N \geq N_{min}$ out of all transmittance values that can be set by the ND filter of the energy rough controller 20 shown in FIG. 1. Then, process steps 102 and 103 are repeated. If the decision at step 104 is approved, or if the decision at step 104 is approved at the initial step (when $N \geq N_{min}$), the process moves to step 106 and calculates the actual measured value $A_{tgt}$ of the target value accuracy of the exposure dose in accordance with the following equation:

$$A_{tgt}=ABS(1-pN/S_0) \qquad (8)$$

In step 107, it is decided whether it is necessary to micro-modulate the pulse-energy at the excimer laser light source 16, i.e, whether the actual measured value $A_{tgt}$ of the target value accuracy of the exposure dose exceeds the above-mentioned exposure dose target value accuracy $A_t$ or not. If this decision is rejected, i.e, if the actual measured value $A_{tgt}$ is less than the exposure dose target value accuracy $A_t$, the process moves to step 109 and calculates the laser oscillation frequency f by setting scanning speed V=maximum scanning speed ($V_{max}$) and using the following equation:

$$f=int[(V_{max} \times N)/Ws] \qquad (9)$$

Here, the function int(a) represents the largest integer that does not exceed the real number a.

If the decision at step 107 is approved, that is, if $A_{tgt} \geq A_t$, the pulse energy must be micro modulated. Hence, the process moves to step 108 and first calculates the target pulse energy $P_t$(mJ/(cm$^2$·pulse)) based on the integrator sensor 46 using the following equation:

$$P_t=S_0/cint(S_0/p) \qquad (10)$$

and thus calculates the energy target value $E_t$ (mJ/pulse) of the laser beam LB at the excimer laser light source 16 using the transformation coefficient β stored in the memory 51 as a control table and using equation (5). This energy target value $E_t$ is supplied to the energy controller 16d, and the process moves to step 109 and calculates the laser oscillation frequency f by setting the scanning speed V at its maximum ($V_{max}$) as described above.

In step 110, it is decided whether the laser oscillation frequency f calculated above is less than the maximum oscillation frequency $f_{max}$ of the laser. If the decision is approved, the process proceeds to step 111 to set the laser oscillation frequency at the value calculated above via the energy controller 16d and to set the target scanning speed at its maximum $V_{max}$. If the decision at step 110 is rejected, the process moves on to step 112. In step 112, since the laser oscillation frequency cannot be set above the maximum $f_{max}$, the laser oscillation frequency is first set at the maximum oscillation frequency $f_{max}$, and in step 113, the scanning speed is set V based on the following equation:

$$V=(Ws)(f_{max})/N \qquad (11)$$

Then, at step 114, exposure is performed under the setting conditions (V, f, $P_t$) determined in the previous steps.

Figure 5:
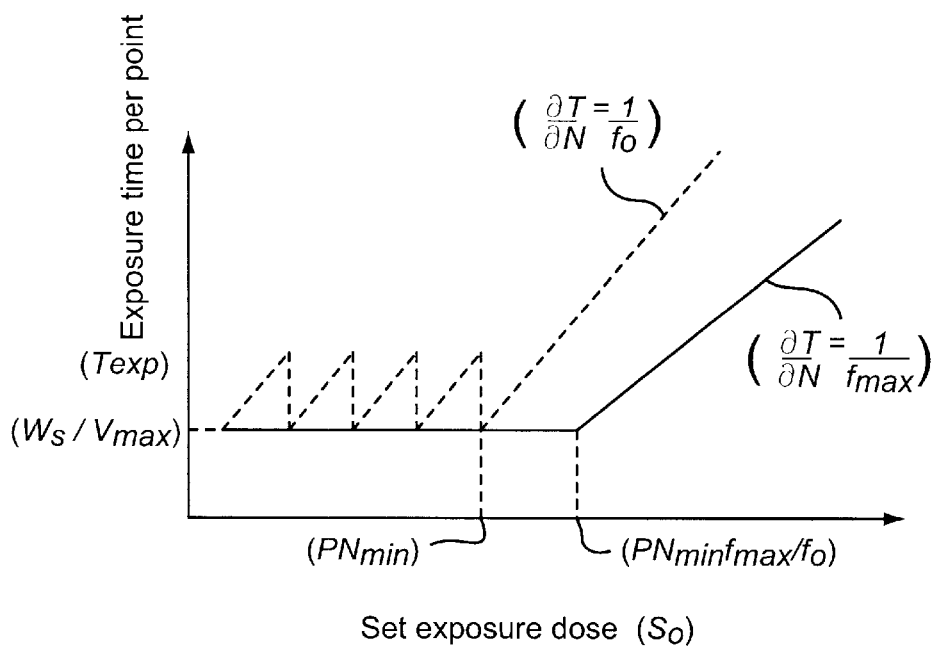
FIG. 5 illustrates the relation between the exposure time ($T_{exp}$) and the designated amount of exposure dose ($S_0$) determined by the exposure dose control sequence shown in FIG. 4, together with a comparative example.

FIG. 5 illustrates the relation between the target exposure dose ($S_0$) in the exposure dose control sequence in the flow chart shown in FIG. 4 explained above and the exposure time per point (Texp). In FIG. 5, the solid lines represent the case according to the present embodiment, and the broken lines represent the conventional case for comparison.

As shown in FIG. 5, according to the present embodiment, in the range corresponding to high-sensitivity photoresists (the range where the target exposure dose $S_0 \geq P(N_{min})(f_{max}/f_0)$, exposure at the maximum scanning speed ($V_{max}$) (regardless of the values of the target exposure dose ($S_0$)) can be always performed without being influenced by the divergent light reduction rate of the energy rough controller 20, and the exposure time (Texp) becomes minimal. In addition, even in the range corresponding to low-sensitivity photoresists (the range where the target exposure dose $S_0>(PN_{min})(f_{max}/f_0)$), the exposure time is reduced since exposure is performed at the maximum oscillation frequency $f_{max}$, of the laser, which becomes evident by comparing the slope $\delta T/\delta N=1/f_0$ of the broken line representing the conventional case and the slope of the solid line representing the present embodiment. That is, it also becomes possible to obtain a wide-range target exposure region throughput. Moreover, the range of the target exposure dose $S_0$ that can be exposed at the maximum scanning speed is extended from $PN_{min}$ to $PN_{min}(f_{max}/f_0)$ According to the present embodiment, the exposure dose of the laser beam LB emitted onto the wafer W can be controlled, and the required integral exposure dose at each point on the wafer W can be obtained with high precision and high speed.

The exposure dose control sequence explained above exhibits remarkable effects under the illumination condition with low illuminance on the image plane. To cope with the power loss that occurs when the illumination conditions are changed, for instance, by the aperture stop plate 24, illumination systems that do not reduce the energy transmission efficiency are being proposed. However, a perfect system which has zero difference between any two illumination conditions is hard to achieve. In fact, it is impossible to overcome an illuminance (average pulse energy) difference between any two illumination conditions.

Figure 6:
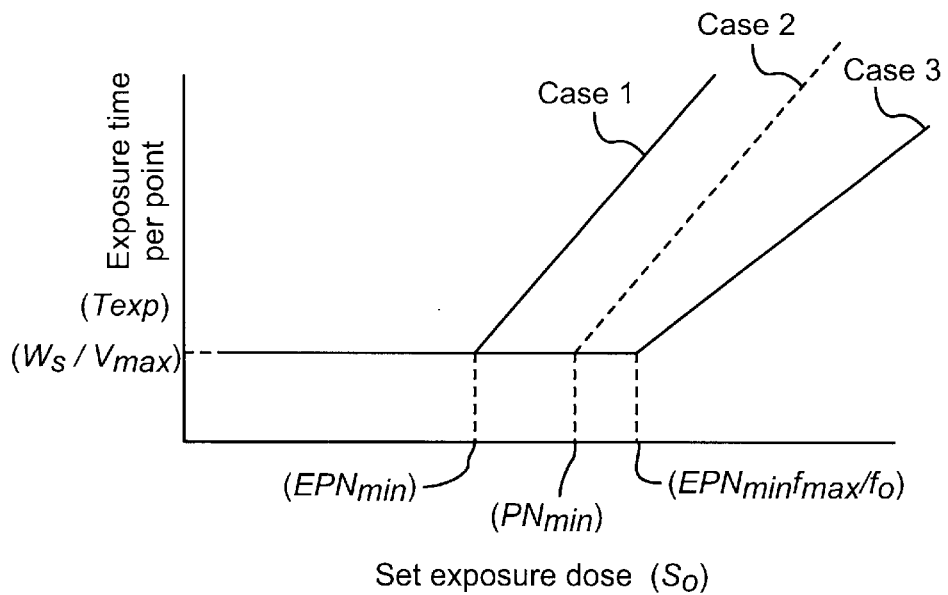
FIG. 6 is a diagram used to explain that the exposure dose control sequence shown in FIG. 4 exhibits a more significant effect under certain illumination conditions, as compared with the efficiency (E<1) under the standard illumination conditions.

As an example, an illumination condition X under which an efficiency corresponding to the standard illumination condition under which the average pulse energy becomes maximal is set to be E (E<1) will be exemplified. Then, one example will be explained that shows that the exposure dose control sequence of the present embodiment exhibits further prominent effects with reference to FIG. 6. In FIG. 6, it is assumed that an attenuator whose transmittance is continuously variable is installed to simplify the explanation.

Under the standard illumination condition of the conventional sequence, as shown in case 1 on FIG. 6, the minimum exposure time per point under the illumination condition is $(Ws/V_{max})=(N_{min}/f_0)$. The maximum exposure dose within the minimum exposure time can be represented by $PN_{min}$. On the other hand, under the illumination condition with efficiency E, the maximum exposure dose achievable within the minimum exposure time becomes $EPN_{min}$ as shown in case 2 on FIG. 6. Under the illumination condition with a small efficiency value E, the throughput at every target exposure dose level is unsatisfactory.

When the sequence according to the present embodiment is applied to the above-mentioned illumination condition with efficiency E, the minimum exposure time becomes $Ws/V_{max}$ as shown in case 3 on FIG. 6, which doesn't differ from the conventional case. However, the maximum target exposure dose $S_0$ that can be achieved within the minimum exposure time is increased to $(EPN_{min})(f_{max}/f_0)$, which is larger than the maximum target exposure dose $S_0=PN_{min}$ achieved under the conventional sequence illumination condition of case 1. This result is obtained in the present embodiment since the effective illuminance can be obtained by increasing the laser oscillation frequency (repetition frequency) and the reduction in the average pulse energy can be compensated for due to the change in the illumination condition according to the present embodiment. In this way, according to the above sequence, the exposure time is shortened within the range $(EPN_{min} \geq S_0 < (EPN_{min})(f_{max}/f_0))$ in which the oscillation frequency f can be modulated, and the throughput in the entire low-sensitivity region is improved.

Figure 28A:
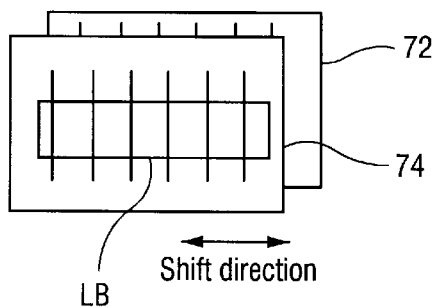
FIGS. 28(A) and 28(B) illustrate examples of the fine energy-regulator.

According to the above embodiment of the present invention, the case was explained wherein micro-control of the pulse energy of the excimer light source 16 is performed. However, the present invention is not restricted to this case. The pulse energy can be micro-controlled using an energy micro-modulator shown in the above mentioned FIGS. 28(A) and 28(B) instead of this case or together with this case. In this case, the corresponding micro-modulator is installed on the optical path of the laser beam LB between the energy rough controller 20 and the fly-eye lens 22. Moreover, the system is controlled by the master controller 50 so that the desired integral exposure dose can be obtained at each point on the wafer W.

The second embodiment of the present invention will be described with reference to FIGS. 7–10. The same reference numerals will be used for the components identical or similar to the ones mentioned in the first embodiment, and will only be briefly explained or omitted.

Figure 7:
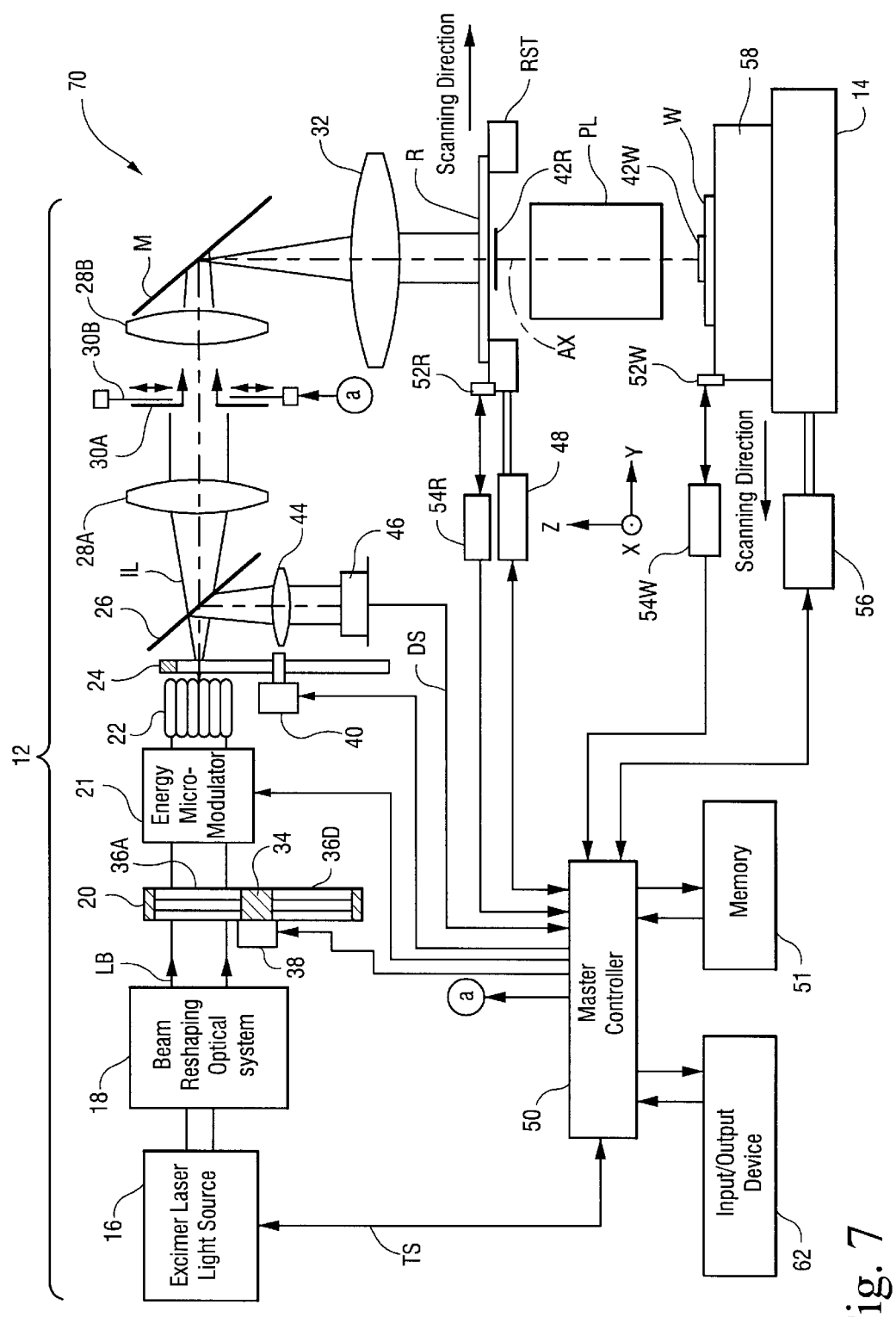
FIG. 7 is a schematic diagram showing the structure of the scanning-type exposure apparatus according to the second embodiment of the invention.

FIG. 7 schematically illustrates the structure of the scanning exposure device 70 used in the second embodiment of the present invention. This scanning exposure device 70 differs from the previously mentioned scanning exposure device 10, which micro-modulates the output pulse energy of the excimer laser light source itself, in that the scanning exposure device 70 micro-modulates the pulse energy using an energy micro-modulator.

Figure 28B:
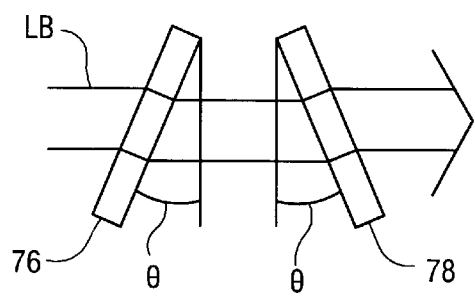
Figure 28C:
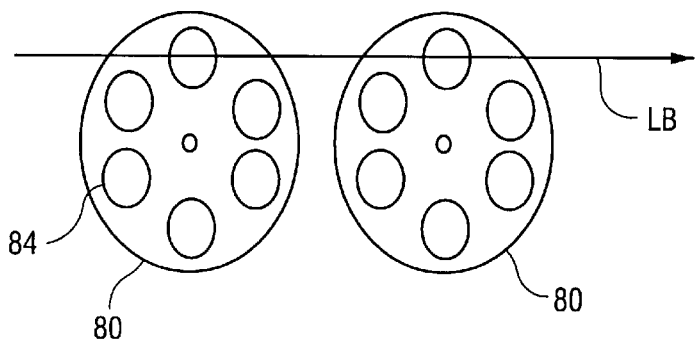
FIG. 28(C) illustrates an example of the rough energy-regulator.

For this reason, in the scanning exposure device 70 according to the second embodiment, an energy micro-modulator 21 is installed on the optical path of the laser beam LB between the energy rough controller 20 and the fly-eye lens 22 as depicted in FIG. 7. For this energy micro-modulator 21, for example, a double-grating type micro-modulator shown in the previously mentioned FIG. 28(A) or an energy micro-modulator consisting of two optical filter plates each of whose transmittance is micro-controlled corresponding to the incidence angle of the laser beam as shown in FIG. 28(B) can be used along with a mobilization component that controls the cross angle of these two optical plates within a prescribed range. The micro-modulation amount $T_F$ due to the energy micro-modulator 21 is controlled by the master controller 50.

The amount of the transmitted light can also be continuously varied, for example, by using an audio-optical modulator that utilizes Raman-Nass diffractions (Debye-Sears effect), and by controlling the modulation in this audio-optical modulator.

Figure 8:
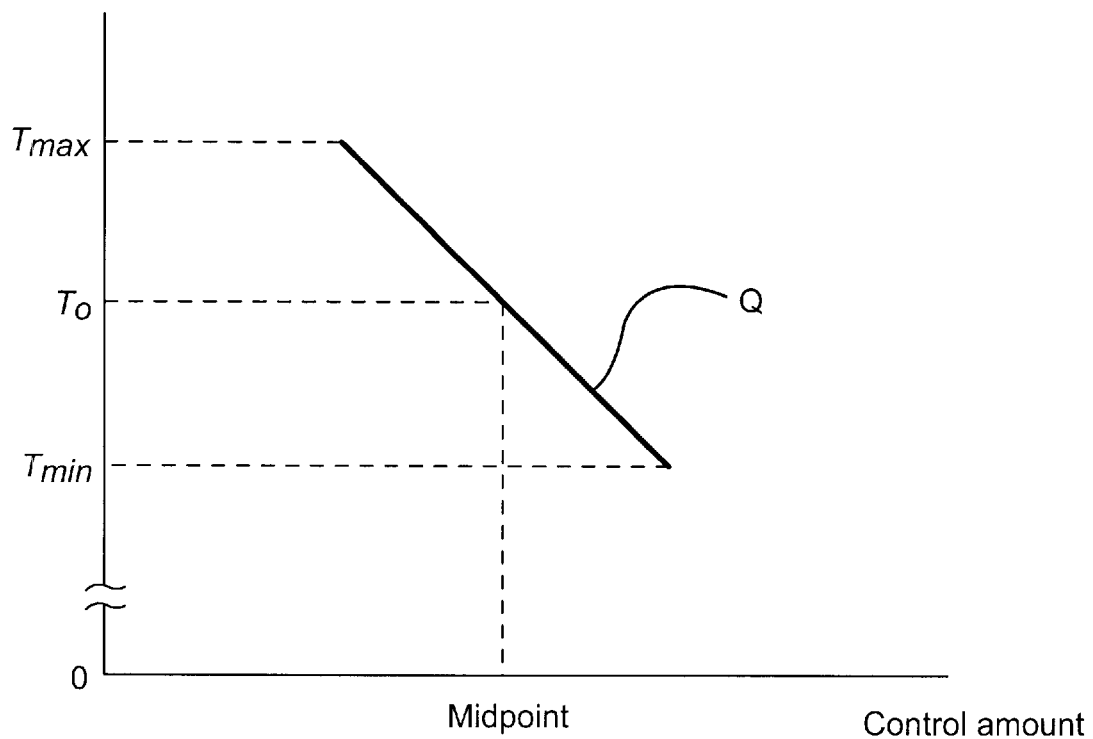
FIG. 8 is a graph showing the transmittance modulation rate of the energy modulator as a function of the amount of external control provided to the driving unit of the energy modulator according to the second embodiment of the invention.

FIG. 8 illustrates a relation between the amount of change in the transmittance and the externally controlled amount supplied to the driving device inside the energy micro-modulator 21 as a straight line Q. In FIG. 8, the transmittance obtained by dividing the light amount of the emitted laser beam by the light amount of the incident laser beam is defined to be the micro-modulation amount $T_F$. According the present embodiment, the control range of the micro-modulation amount $T_F$ lies continuously between the prescribed minimum $T_{min}$ and the maximum $T_{max}$. The micro-modulation amount $T_F$ is controlled to be the mid-point value $T_0$ between the minimum $T_{min}$ and the maximum $T_{max}$ by setting at the mid-point (neutral point) the control amount supplied to the internal driving device. Furthermore, when the energy micro-modulator 21 is reset, the control amount is set at the neutral point, and the micro-modulation amount $T_F$ is set at the mid-point value $T_0$.

The structure of the other parts are similar to that of the scanning exposure device 10 used in the first embodiment except for the control algorithms of the CPU inside the master controller 50.

Next, the fundamental exposure dose control sequence of a scanning exposure device 70 will be described with reference to the flow chart of FIGS. 9 and 10, which show the control algorithm of the CPU inside the master controller 50. Since the only requirement for the transmittance of the energy rough controller 20 with respect to the laser beam emitted from the excimer laser light source 16 is that the exposure pulse count exceeds the required minimum exposure pulse count, the fundamental exposure dose control sequence of the scanning exposure device 70 will be described by focusing on the micro-energy modulation of the laser beam LB.

The exposure dose control according to the present embodiment is performed by the pulse count method within each shot field, however, the prescribed energy modulation is performed between shot fields.

Figure 9:
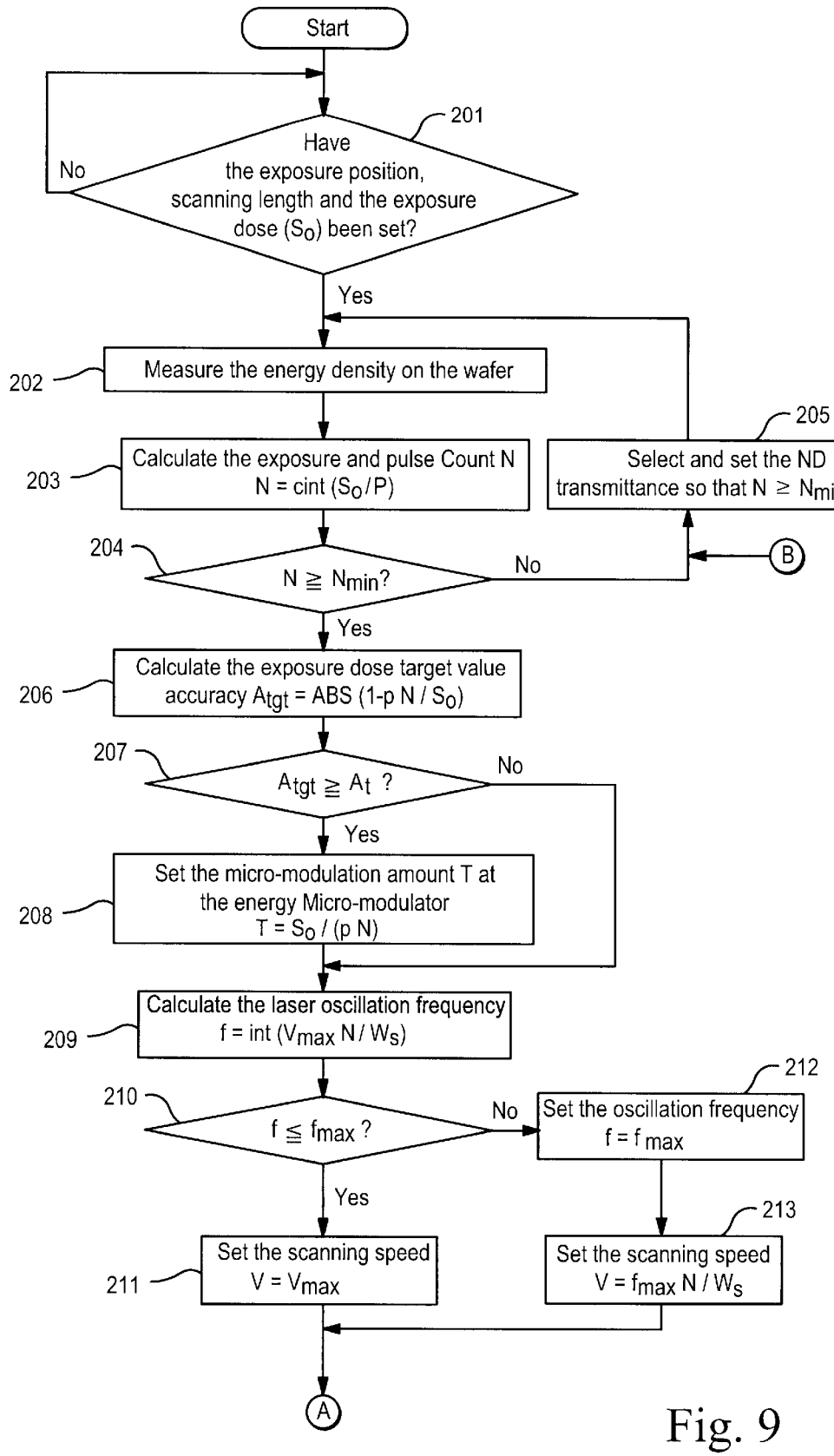
FIG. 9 is a flowchart showing a portion of the CPU's exposure dose control algorithm in the master controller according to the second embodiment.

First, in step 201 of FIG. 9, it is determined whether (i) the central coordinates (exposure position) of the multiple shot fields to be exposed on the wafer W, (ii) the shift distance (scanning length) L to the wafer W along the scanning direction at the time each of the shot fields is to be exposed, and (iii) the target integral exposure dose (designated exposure dose) $S_0$ (mJ/cm$^2$) have been set via the input-output device 62 (cf. FIG. 7) such as a console and the like through an operator. Then, once the target exposure dose $S_0$ and the like are set, the process moves to step 202, where the excimer laser light source 16 performs pulse emissions a multiple number of times (several hundred times, for instance), and indirectly measures the average pulse energy density p (mJ/cm$^2$·pulse) on the wafer W by calculating the output of the integrator sensor 46. To perform this measurement, the movable reticle blind is mobilized to completely close the aperture so that the illumination light IL is prevented from reaching the reticle R. Of course, the wafer W can be withdrawn, and this measurement can be performed by driving the XY stage 14. Moreover, at the time the above-mentioned average pulse energy density is measured, the ratio $\delta P/p$ can be obtained where $\delta P$ represents three times the standard deviation ($3\sigma$) of the pulse energy distribution, and p represents the average pulse energy density.

In step 203, the exposure pulse count N is calculated as in step 103.

Following the calculation of the exposure pulse count N, in the CPU inside the master controller 50, for example, the minimum exposure pulse count $N_{min}$ required to restrict the distribution of the integral exposure dose on each shot field on the wafer W within the prescribed admissible range is obtained based on the ratio $\delta P/p$ where $\delta P$ represents three times the standard deviation of the pulse energy distribution, which is pre-measured and pre-set as a device constant, and p represents the average pulse energy density. The minimum exposure pulse count $N_{min}$ can also be obtained based on $\delta P/p$ obtained in step 202. According to the method wherein pulsed light from the single excimer laser source 16 is emitted step by step as in the present embodiment, the distribution of the integral exposure dose per point on the wafer W becomes a normal distribution with a mean value Np and with a value $3\sigma$ equal to $N^{1/2}$ ($\delta P$), as disclosed in Japanese Patent Application Laid-open No. H8-250402. If the reproducibility of the integral exposure dose on each of the shot fields on the wafer is represented by $A_0$, and the reproducibility of the integral exposure dose needed at each point on the wafer is represented by $A_{rep}$, then, the minimum exposure pulse count $N_{min}$ required to restrict the reproducibility of the integral exposure dose of the multiple pulses below $A_{rep}$ is set so that it satisfies the following equation:

$$N_{min} \geq [(\delta P/P)^2/A_o]^2 \qquad (12)$$

In step 204, it is decided whether the exposure pulse count N calculated in step 203 exceeds the minimum exposure pulse count $N_{min}$ for the purpose of obtaining the reproducibility of the required exposure dose control.

If the decision in step 204 is rejected, i.e., if the exposure pulse count N is less than the minimum exposure pulse count $N_{min}$, the process moves on to step 205. In step 205, a transmittance that is closest to $S_0(N_{min})$(p) and satisfies $N \geq N_{min}$, out of transmittance values that can be set by the ND filter of the energy rough controller 20 shown in FIG. 7 is selected and set. The processing steps 202 and 203 are then repeated. If the decision at step 204 is approved, or if the decision at step 204 is approved at the initial step (when $N > N_{min}$) the process moves on to step 206 and calculates the actual measured value $A_{tgt}$ of the target value accuracy of the exposure dose in accordance with the following equation:

$$A_{tgt} ABS(1-p\,N/S) \qquad (12A)$$

In step 207, it is decided whether the pulse-energy at the excimer laser light source 16 needs to be micro-modulated, i.e, whether the actual measured value $A_{tgt}$ of the target value accuracy of the exposure dose exceeds the above-mentioned exposure dose target value accuracy $A_t$. If this decision is rejected, i.e, if the actual measured value $A_{tgt}$ is less than the exposure dose target value accuracy $A_t$, the process moves to step 209 and calculates the laser oscillation frequency f by setting the scanning speed V at its maximum ($V_{max}$) and using equation (9) given above. In this way, the maximum scanning speed $V_{min}$ is maintained by increasing the laser oscillation frequency f by the amount the exposure pulse count N exceeds the minimum exposure pulse count $N_{min}$.

On the other hand, if the decision is approved at step 207, the process moves to step 208, to control the value p of the average pulse energy by setting the micro-modulation amount $T_F$ at the energy micro-modulator 21 of FIG. 7 according to the following equation, and the process moves on to step 209.

$$T_F = S_0/pN \qquad (13)$$

The micro-modulation amount (transmittance) $T_F$ at the energy micro-modulator 21 varies between the minimum $T_{min}$ and the maximum $T_{max}$ as explained with reference to FIG. 8. Each of the maximum $T_{max}$ and the minimum $T_{min}$ can be expressed using the above-mentioned minimum exposure pulse count $N_{min}$ and the exposure dose target accuracy $A_t$ as follows:

$$T_{max} = (N_{min}+1)(1-A_t)/N_{min} \qquad (14A)$$

$$T_{min} = (N_{min})(1+A_t)/(N_{min}+1) \qquad (14B)$$

In addition, the value of the micro-modulation amount $T_F$ at the initial state and the reset state is set at $(T_{min}+T_{min})/2$, i.e, $T_0$.

In step 210, it is decided whether the laser oscillation frequency f calculated above is less than the maximum oscillation frequency $f_{max}$ of the laser. If the decision is approved, the process moves to step 211. In step 211, the laser oscillation frequency is set at the value calculated above via the energy controller 16d, and the target scanning speed is set at its maximum $V_{max}$. If the decision at step 210 is rejected, the process moves on to step 212. In step 212, since the laser oscillation frequency cannot be set as above, the laser oscillation frequency is first set at the maximum oscillation frequency $f_{max}$, and in step 213, the scanning speed V is set in the same manner as in step 113.

Since the initial set-up has been completed, the pattern image of the reticle R is then exposed onto an assigned shot field on the wafer W by the set exposure dose and the exposure scanning method.

During this scanning exposure, the integral exposure amount on the shot field of the wafer due to the laser beam LN emitted from the excimer laser light source 16 is calculated in the CPU contained in the master controller 50 via the integrator sensor 46. In this case, since the exposure pulse count at each point on the wafer W is N, the integral exposure dose S is calculated step by step while the shot field on the wafer W corresponding to the exposure field 42W in FIG. 7 is being scanned by integrating the pulse-like photo electric transfer signals from the integrator sensor 46 M times (M is an integer greater than 2) and N pulses at a time. In this way, the integral exposure dose $S_j$(j=1 through M) at the M positions $Y_j$(j=1 through M) distributed along the Y direction on the wafer with almost equal intervals can be calculated.

Since the concrete method to calculate the integral exposure dose $S_j$ is disclosed in Japanese Patent Application Laid-open No. H 8-250402, a detailed explanation of the method will be omitted.

In step 215, the average $S_{rst}$ of the M integral exposure doses $S_j$ and the average pulse energy p' during the exposure are calculated in accordance with the following equations:

$$S_{rst} = (S_1 + S_2 + \ldots + S_M)/M \qquad (15)$$

$$p' = S_{rst}/N \qquad (16)$$

In step 216, it is decided whether the target value error ABS ($S_{rst}/S_0 - 1$) is greater than the above-mentioned exposure dose target value accuracy $A_t$, where ABS ($S_{rst}/S_0 - 1$) is an error between the target integral exposure dose and the average actual integral exposure dose $S_{rst}$ on the exposed shot field. Then, if the decision is approved, i.e, if the target value error exceeds the exposure dose target value accuracy $A_t$, the process moves on to step 217 and calculates the dose required to correct the exposure dose. In practice, the corrected dose $T_{add}$, which is obtained by dividing the post-correction exposure dose per pulse of the laser beam LB by the present exposure dose will be set as follows:

$$T_{add} = S_0/S_{rst} \qquad (17)$$

In this case, the value of the rough control amount $T_R$ (transmittance) of the exposure dose at the energy rough controller 20 corresponding to the shot field where the exposure has ended, and the value of the micro control amount $T_F$ of the exposure dose at the energy micro-modulator 21 are stored in the memory 51 as the pre-shot field information.

In step 218, it is decided whether the value obtained by multiplying the micro control amount $T_F$ at the energy micro-modulator 21 by the correction amount $T_{add}$ stays within the controllable range of the energy micro-modulator 21 based on the following equation:

$$T_{min} \leq (T_{add}) \cdot (T_F) \leq T_{max} \qquad (18)$$

If equation (18) holds, then the process moves to step 219, changes the micro control amount $T_F$ of the exposure dose at the energy micro-modulator 21 into $T_F'$, which equals $(T_{add})(T_F)$, and the process moves on to step 230. At step 230, it is decided whether any shot fields still remain to be exposed. If any shot fields remain to be exposed, the process returns to step 214, and exposure is performed by the scanning exposure method utilizing the newly set micro control amount $T_F'$ of the energy micro-modulator 21. In doing so, since the exposure dose has been corrected based on the actual integral exposure dose on the shot field right in front, the obtained integral exposure dose turns out to be close to the target integral exposure dose (set exposure dose) $S_0$.

If the decision at step 216 is rejected, i.e, if the target value error ABS $(S_{rst}/S_0-1)$ is less than the exposure target value accuracy $A_t$, the process directly moves to step 230 since the exposure condition need not to be changed, and the next shot field is exposed. Then, the processing sequence of the entire routine is completed when all the shot fields to be exposed are exhausted.

If the product of the micro control amount $T_F$ and the correction amount $T_{add}$ does not fall into the range provided by equation (18) in step 218, the process moves to step 220 and changes the exposure pulse count N per point on the wafer W into N' defined in the following equation (19). Note that the average pulse energy p' is the actual average pulse energy obtained from equation (16).

$$N'=\text{cint}(S_0/p') \tag{19}$$

In step 221, it is decided whether the post-correction exposure pulse count N' exceeds the required minimum exposure pulse count $N_{min}$. If this decision is rejected, i.e, if N' is less than $N_{min}$, then, the system (i) resets the energy micro-modulator 21 at the next step 222, (ii) sets the micro control amount $T_F$ at the midpoint value $T_0$, (iii) returns to step 205 of FIG. 9, (iv) adjusts the rough control amount of the energy rough controller 20 so that N' becomes greater than or equal to $N_{min}$, and (v) returns to step 202.

If the decision is approved, i.e, if $N' \geq N_{min}$ holds, the system moves to step 223 and decides whether the target value error (the error between the target integral exposure dose $S_0$ and the expected post-correction integral exposure dose N'p') exceeds the above-mentioned exposure dose target value accuracy $A_t$ based on the following equation:

$$ABS(N'p'/S_0-1)>A_t \tag{20}$$

If the decision is approved, i.e, if the target value error exceeds the exposure dose target value accuracy $A_t$, the process advances to step 224, and the required correction amount for the exposure dose is calculated. The micro modulation amount $T_F$ at the energy micro-modulator 21 is transformed into the following $T_F'$:

$$T_F'=T_F S_0/(N'p') \tag{21}$$

In the following steps 225 through 229, procedures similar to steps 209 through 213 are performed. In other words, the laser oscillation frequency f that corresponds to the new exposure pulse count N' at the maximum scanning speed is calculated. If this calculated value of f is less than the maximum laser oscillation frequency $f_{max}$, the laser oscillation frequency f is changed to the maximum laser oscillation frequency $f_{max}$, and the scanning speed is set at the maximum scanning speed $V_{max}$. If the calculated f exceeds the maximum laser oscillation frequency $f_{max}$, the laser frequency f is changed into the maximum laser oscillation frequency $f_{max}$, and the scanning speed is set that corresponds to $f_{max}$ and N'. After that, the operation moves on to step 230, and the next shot field is exposed.

If the decision at step 223 is rejected, i.e, the expected target value error ABS (N'p'/S-1) is less than the exposure dose target value accuracy $A_t$, the setting of the energy-micro-modulator 21 needs no change. Hence, the process directly moves to step 225, where the laser oscillation frequency and the scanning speed are set as above, and in step 230 the next shot field is exposed.

Figure 10:
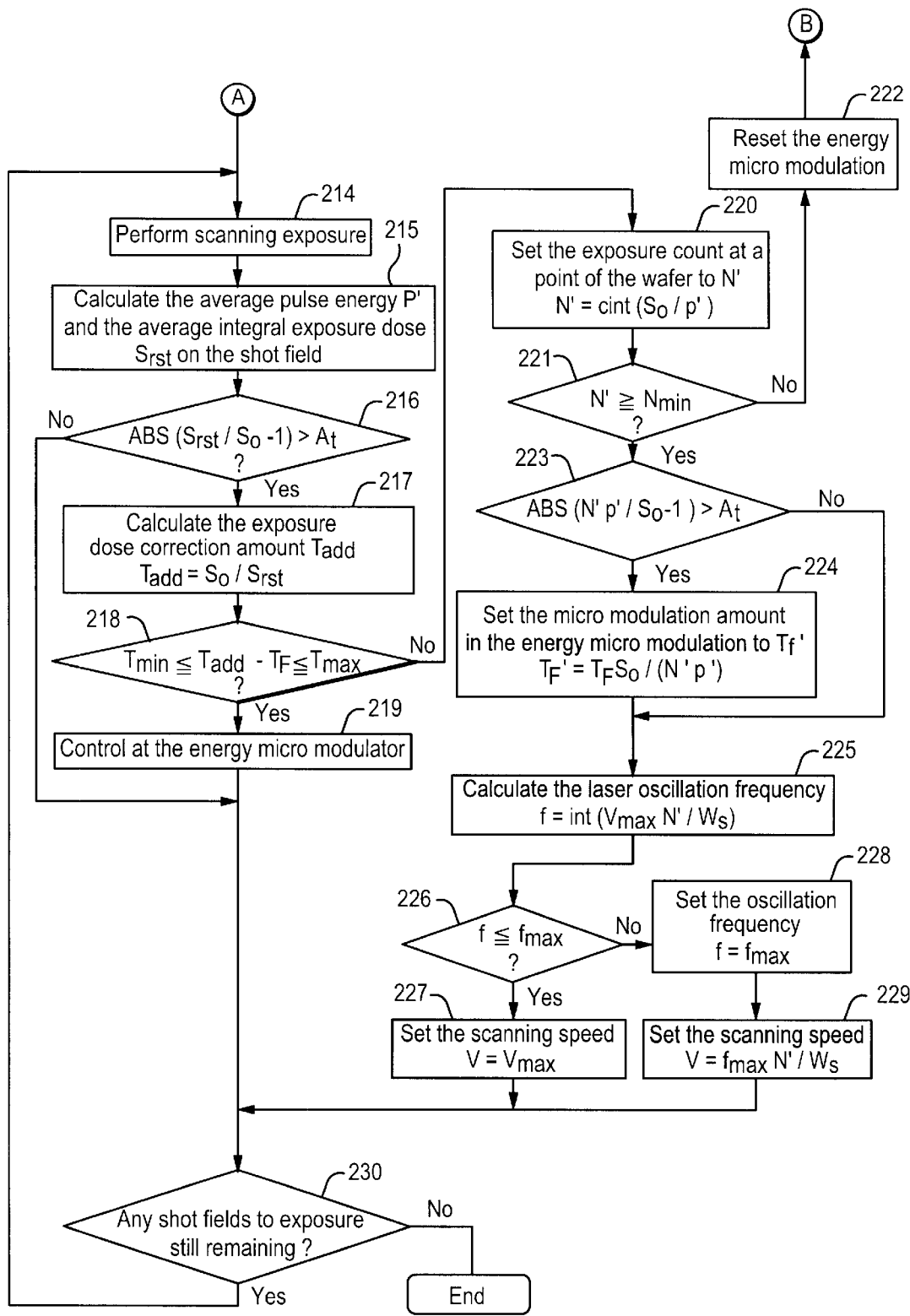
FIG. 10 is a flowchart showing another portion of the CPU's exposure dose control algorithm in the master controller according to the second embodiment.

According to the exposure dose control sequence that follows the flow chart shown in FIGS. 9 and 10 as described above, as shown in steps 215 through 230 (excluding step 222), the integral exposure dose data (running window data) based on the output of the integrator sensor 46 is obtained in order to stabilize the inter-shot exposure dose on the wafer W while each shot field is being exposed. As a result, unless the average integral exposure dose of the previous shot falls out of an admissible range, the pulse energy is corrected by adjusting the micro modulation amount TF at the energy micro-modulator 21 based on the integral exposure dose measured on the shot field exposed right before. In this way, the integral exposure dose to each shot field can be accurately approximated to the target integral exposure dose.

Furthermore, according to the present embodiment, if the average power of the laser light source 16 changes excessively while the wafer W coated with high-sensitivity resist is being exposed, i.e, if the power change corresponding to one pulse occurs and falls out of the micro-modulation dynamic range of the micro-modulator 21 (the case in which the decision in step 218 is rejected), the exposure pulse count at one point on the wafer is changed in step 220 so as to recover the same exposure dose as the one before the laser power reduction. Even if, for example, the pulse count change from N to N+1 is calculated, the desired exposure dose can be consequently obtained without changing the scanning speed since the oscillation frequency f of the laser light source 16 is set to (N+1)/N times that at the previous shot in step 225. Hence, even in such a case, the throughput can be maintained without increasing the exposure time.

The exposure dose control described above is repeated until the average pulse energy of the laser beam from the excimer laser light source 16 is actually measured as in step 202 (a so-called "energy check"). The energy check is performed when the rough modulation amount $T_R$ at the rough energy-modulator 20 is changed according to the flow of step 221→step 222→step 205. The rough modulation amount $T_R$ at the rough energy-modulator 20, however, is rarely changed during exposure to the shot field. The regular energy check is performed whenever the wafer or the wafer lot is exchanged. Hence, the regular energy check need not be performed during the exposure to, for example, a single wafer. The throughput of the exposure process (the number of wafers processed per unit time) is highly maintained in this respect as well.

In the above-mentioned step 215, the average $S_{rst}$ of all the M integral exposure doses $S_j$ (j=1 through M) is calculated via equation (15). However, note that instead of $S_{rst}$, the average $S_{rst}'$ of m integral exposure doses $S_j$ (j=M−m+1 through M) can be used. This enables exposure dose control corresponding to shorter lasting output changes of the excimer laser light source 16 to be performed.

Furthermore, according to the second embodiment of the present invention, the rough energy modulator 20 and the energy micro-modulator 21 are used as pulse energy modulators. Needless to say, however, the system may be modified so that the power (impressed voltage) of the excimer laser light source 16 is the same as in the case of the first embodiment. In this case, the overall energy utility efficiency is improved since, for example, the (1−$T_0$)% energy loss due to the micro-control amount (transmittance) $T_0$ of the energy micro-modulator 21 at the initial state is eliminated.

As shown in steps 216 and 217 of the above-mentioned embodiment, the exposure dose is corrected when the average integral exposure dose $S_{rst}$ exceeds the admissible range. However, even in the case where the average value $S_{rst}$ stays within the admissible range, if the data of the average value $S_{rst}$ is continuously accumulated for every exposure to each of the shot fields and it is discovered that the average value $S_{rst}$ tends to increase or decrease, the exposure dose can be pre-adjusted before the average value $S_{rst}$ falls out of the admissible range. This type of forecast-control feature of the present invention provides an advantage in that the number of shot fields whose integral exposure doses fall out of the admissible range can be reduced.

Furthermore, according to the above-mentioned embodiment the exposure dose is modulated via the energy micro-modulator 21 and the like while each of the shot fields is being exposed. However, the exposure dose can also be modulated via the energy micro-modulator 21 and the like based on the partial integral exposure dose accumulated during each pulsed exposure. In this way, the integral exposure dose on each of the shot fields can be more accurately approximated to the target integral exposure dose.

The third embodiment of the present invention will be described with reference to FIG. 11 and FIG. 23.

Figure 11:
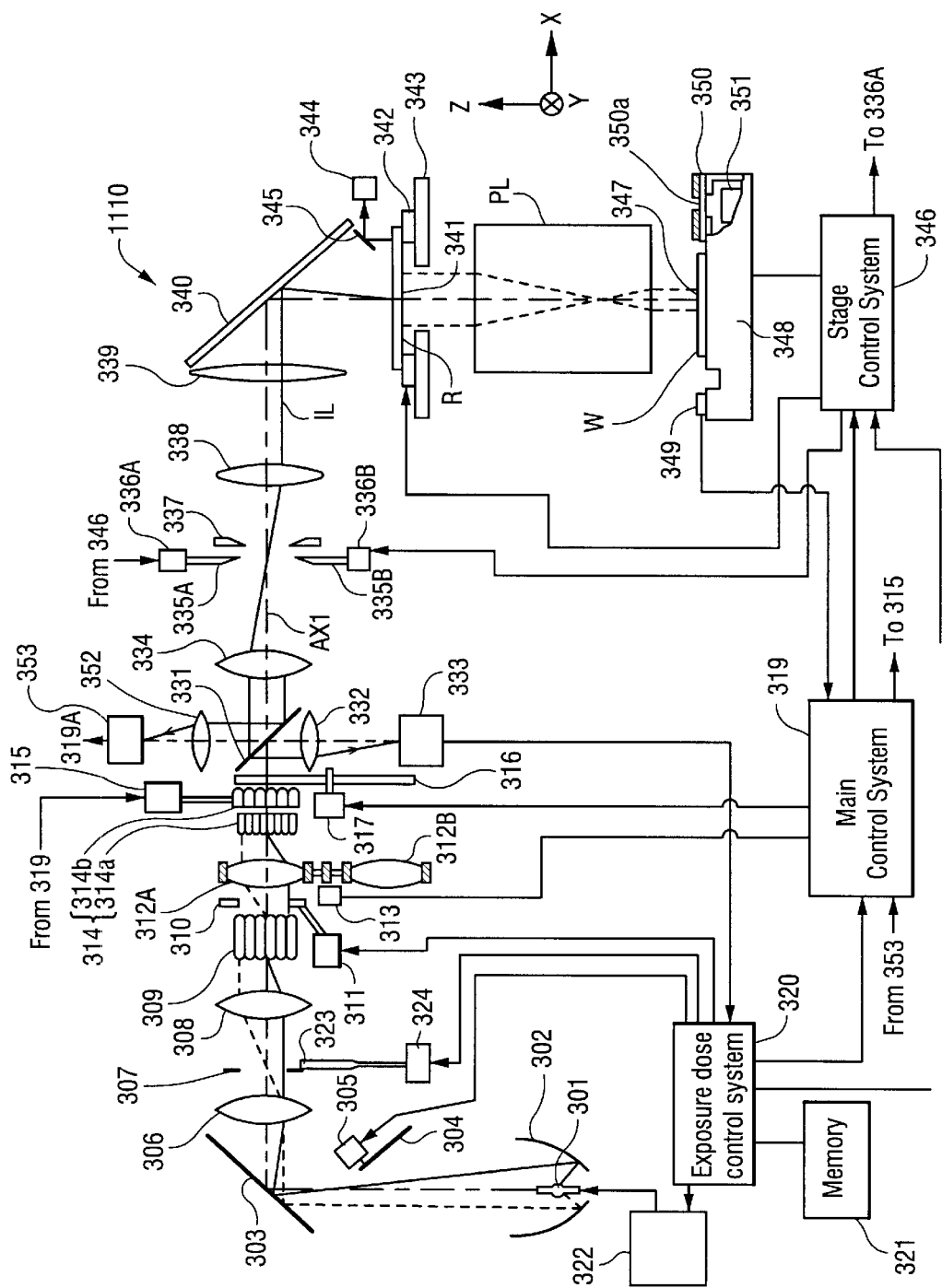
FIG. 11 is a partially cut-away view of the scanning-type projection exposure apparatus according to the third embodiment of the invention.

FIG. 11 illustrates an exposure device 1110 according to the third embodiment wherein a control method of the present invention is applied. This exposure device 1110 is a step-and-scan type projection exposure device.

In FIG. 11, the illumination light (exposure light) IL from a light source mercury lamp 301 is condensed by an elliptic mirror 302. In a vicinity of the convergence point, a shutter 304, which is opened and closed by a shutter control mechanism 305, is installed. When the shutter 304 is open, the illumination light IL is transformed into an almost parallel beam via a mirror 303 and an input lens 306, and reaches a view field stop 307. A light attenuation plate 323, which can be freely installed and removed, is installed behind the view field plate 307 for the purpose of reducing the light such that the light amount that passes through the view field stop 307 can be gradually changed by the attenuation plate 323 within a prescribed range. The light amount of the illumination light IL is made controllable by the attenuation plate 323 in this way so that the throughput can be maintained by correcting the light amount of the illumination light IL corresponding to the sensitivity of the photoresist coated on the surface of the wafer W as a photosensitive substrate The attenuation plate 323 comprises, for example, multiple reflection type half-mirrors installed so that they can be freely switched. The inclination of each of the half mirrors with respect to the optical axis is set so that the overall transmittance of the attenuation plate 323 matches a prescribed transmittance. Then, the light amount of the illumination light IL is controlled by shifting the attenuation plate 323 step by step using a mobilization mechanism 324, which includes a mobilization motor. According to the present embodiment, the exposure dose to the wafer W is controlled by an exposure dose control system 320. The exposure dose control system 320 controls the operation of the mobilization mechanism 324 as well as that of the shutter control mechanism 305. Furthermore, the exposure dose control system 320 controls the power supplied to the mercury lamp 301 via a power source 322 for the mercury lamp 301.

The illumination light IL passes through the aperture of the view field stop 307, and the light amount of the illumination light IL is controlled by the attenuation plate 323. Subsequently, the illumination light IL enters a first fly-eye lens 309 in a double-stacked fly-eye lens group via a first relay lens 308. The illumination light emitted from the multiple light sources of the first fly-eye lens 309 is guided to a second fly-eye lens 314 via a second relay lens 312A. A light amount stop 310 is installed on the emission surface of the first fly-eye lens 309, i.e, in a vicinity of the forming plane of the light source image as a means to reduce the light amount. The size of the aperture of the light amount stop 310 can be adjusted to any level by using the mobilization mechanism 311. The movement of the mobilization mechanism 311 is also controlled by the exposure dose control system 320. According to the present embodiment, the light amount of the illumination light IL that advances from the first fly-eye lens 309 to the second fly-eye lens 314 can be continuously controlled by adjusting the size of the aperture of the light amount stop 310.

Figures 12A, 12B:
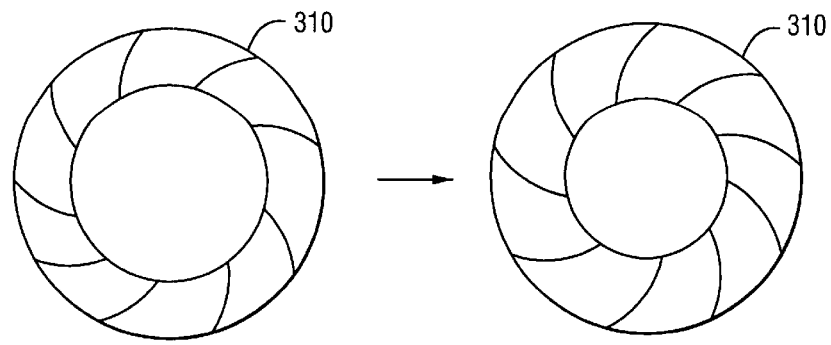
FIGS. 12(A) and 12(B) illustrate an example of the iris used in the apparatus shown in FIG. 11.

FIG. 12(A) illustrates an example of the light amount stop 310. According to FIG. 12(A), the light amount stop 310 consists of an iris stop, wherein the size of the nearly circular aperture of the iris stop can be continuously controlled as shown in FIG. 12(B) by, for example, moving a lever (not shown) around the iris stop.

Recently, a technique to improve a focal point depth with respect to a prescribed pattern by reducing the number of apertures (NA) of an illumination optical system (i.e, by reducing a coherence factor (the value of F), which represents the ratio between the number of apertures of the illumination optical system and that of the projection optical system) is being developed. The illuminance of the illumination light IL that illuminates the reticle R as a mask decreases as the value of F is reduced. According to the present embodiment, a control mechanism that controls the size of the illumination field on the incidence surface of the second fly-eye lens 314 for the purpose of preventing the illuminance reduction of the illumination light IL is installed.

The control mechanism comprises a second relay lens second 312A, another second relay lens 312B whose refracting power is larger than that of the second relay lens 312A and a switching mechanism 313 that switches the two second relay lenses 312A and 312B. The movement of the switching mechanism 313 is controlled by a main control system 319, which controls the overall movement of the projection exposure device 1110. When the illumination system is operated under the regular value of F, the second relay lens 312A is installed between the first fly-eye lens 309 and the second fly-eye lens 314 by the switching mechanism 313. Under this setting, almost the entire surface of the incident surface of the second fly-eye lens 314 is illuminated by the illuminating light IL. When the illumination system is operated under a reduced value of F (by reducing the number of apertures of the illumination optical system), the second relay lens 312B is installed between the first fly-eye lens 309 and the second fly-eye lens 314 by the switching mechanism 313. Under this setting, the central part of the incidence surface of the second fly-eye lens 314 is partially illuminated by the illumination light L. Hence, the illumination light can retain high illuminance prior to the reticle R and the wafer W regardless of the value of F since the illuminance of the illumination light at the second fly-eye lens 314 increases when the value of F is reduced.

The control mechanism according to the present embodiment is based on the switching method. The control mechanism can alternatively be structured with a zoom lens system installed between the first fly-eye lens 309 and the second fly-eye lens 314 and a variable power mechanism that varies the power of the zoom lens system. In this way, by using the zoom lens system, the size of the illuminated view field on the incident surface of the second fly-eye lens can be continuously changed. Hence, the present invention provides an advantage that enables a high degree of illuminance to be maintained prior to the reticle and the wafer even when the value of F is continuously changed.

The above-mentioned second fly-eye lens 314 consists of two lens bundles 314a and 314b. Each of the lens bundles 314a and 314b is a mosaic-like composite of tightly packed multiple lens elements each of which have a flat surface on one side so that the lens bundles themselves have a flat surface on one side. The second fly-eye lens 314 as a set is installed so that the flat surfaces of the lens bundles 314a and 314b are brought close together. For this reason, the second fly-eye lens 314 is called a "mosaic type fly-eye lens 314".

Figure 13A:
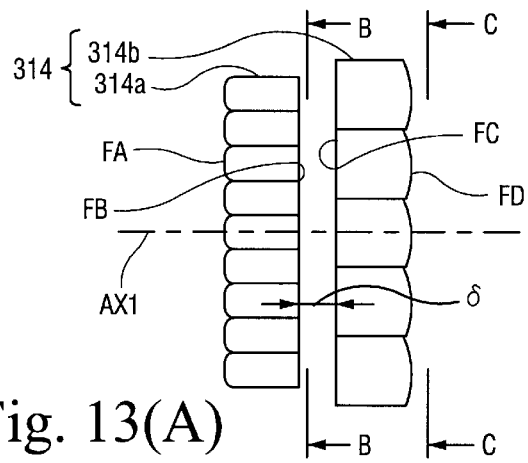

FIG. 13(A) illustrates a side view drawing of the mosaic type fly-eye lens 314. According to FIG. 13(A), the mosaic type fly-eye lens 314 consists of two lens bundles 314a and 314b, which are installed so that the flat surfaces FB of 314a and FC of 314b are positioned along the optical axis AX 1 of the illumination optical system and face each other with separation 8. In this case, each of the lens elements that constitute the first lens bundle 314a located on the light source side has a positive refractive power on the FA side incidence surface. On the other hand, each of the lens elements that constitute the second lens bundle 314b located on the reticle side has a positive refractive power on the FD side emission surface.

Figures 13B, 13C:
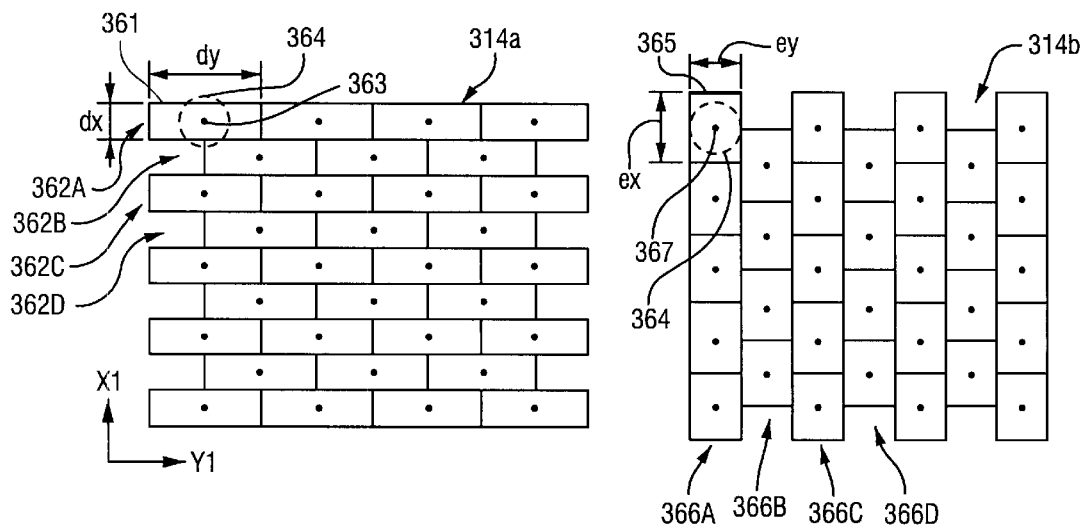

The refractive power of each lens element of the first lens bundle 314a and second lens bundle 314b is determined so that the parallel beam that enters the first lens bundle 314a from the light source side is condensed on the emission surface FD of the second lens bundle 314b, and the parallel beam that enters the second lens bundle 314b from the reticle side is condensed on the incidence surface FA of the first lens bundle 314a. In other words, the emission surface FD of the second lens bundle 314b plays the role of a focal point plane of the mosaic type fly-eye lens 314 so that multiple images of the light source are formed on the emission surface FD. Hence, the lens bundles 314a and 314b need to be combined as one unit to function as one fly-eye lens. Note that the number of lens elements that constitute the two lens bundles 314a and 314b comprising the mosaic type fly-eye lens 314 illustrated in FIGS. 13(A) through 13(C) represents just one example. In practice, the number of lens elements is determined corresponding to the required uniformity accuracy of the required illuminance distribution.

FIG. 13(B) illustrates a front-view drawing of the first lens bundle 314a, which is viewed along the line BB of FIG. 13(A). FIG. 13(C) illustrates a front-view drawing of the second lens bundle 314b, which is viewed along the line CC of FIG. 13(A). In FIG. 13(B) and FIG. 13(C), the direction corresponding to the scanning direction of the reticle of the projection exposure device 1110 during scanning exposure is represented by the X1 direction, and a direction perpendicular to the X1-direction (which corresponds to the non-scanning direction) is represented by the Y1-direction.

As shown in FIG. 13(B), lens groups along the first row 362A the second row 362B, the third row 362C, and so on that constitute the first lens bundle 314a are structured by arranging lens elements 361 each of whose cross-section is a thin long rectangle whose width along the X1-direction is dx and whose width along the Y1-direction is dy (dy>dx) without any gap in between. In addition, the lens groups in the odd-numbered rows (the first row 362A the third row 362C, and so on) and the lens groups in the even-numbered rows (the second row 362B, the fourth row 362D, and so on) are displaced along the Y1-direction by the width dy/2 (where dy is the width of the lens element along the Y1-direction).

According to the present embodiment, the incidence surface of the mosaic type fly-eye lens 314 shown in FIG. 13(A) (i.e, the incidence surface FA of the first lens bundle) is conjugate with the pattern surface of the reticle. The illumination efficiency is maximized when the cross section shape of the lens elements that constitute the first lens bundle 314a is similar to the shape of the slit-shaped illumination field on the reticle. Hence, the ratio between dx (the width of the cross section of the lens element 361 along the X1-direction) and dy (the width of the cross section of the lens element 361 along the Y1-direction) is set approximately equal to the ratio between the width of the slit-shaped illumination field along the scanning direction and the one along the non-scanning direction. For this reason, the cross section of the lens element 361 is a thin and long rectangle along the Y1-direction (which corresponds to the non-scanning direction). For instance, the ratio between dx and dy is set approximately dx:dy=1:3.

As shown in FIG. 13(C), lens groups along the first row 366A the second row 366B, the third row 366C, and so on that constitute the second lens bundle 314b are structured by arranging lens elements 365 each of whose cross section is an approximate square whose width along the X1-direction is ex (which equals 2dx) and whose width along the Y1-direction is ey (which equals dy/2) without any gap in between. In addition, the lens groups in the odd-numbered rows (the first row 366A the third row 366C, and so on) and the lens groups in the even-numbered rows (the second row 366B, the fourth row 366D, and so on) are displaced along the X1-direction by the width ex/2 (where ex is the width of the lens element along the X1-direction). For example, when the cross section of the lens element 361 of the first lens bundle 314a is a rectangle with dx:dy=3:1, the cross section of the lens element 365 of the second lens bundle 314b becomes a rectangle (an approximate square) with dx:dy= 4:3.

According to the arrangement of the first lens bundle 314a, one lens element in one odd-numbered row is positioned as a parallel translation of a certain lens element of any other odd-numbered row along the X1-direction so that the Y1-coordinate of the center of one lens element of the first row coincides with that of a certain lens element of any other odd-numbered row. Similarly, one lens element in one even-numbered row is positioned as a parallel translation of a certain lens element of any other even-numbered row along the X1-direction so that the Y1-coordinate of the center of one lens element of the second row coincides with that of a certain lens element of any other even-numbered row. The same arrangement applies to the second lens bundle 314b except that the roles of the X1-axis and the Y-axis are interchanged (cf. FIGS. 13(B) and 13(C)).

The function and the like of the mosaic type fly-eye lens 314 comprising the lens bundles 314a and 314b will be described. The mosaic type fly-eye lens 314 is a second fly-eye lens. Each of the light source images formed on the emission surface of this second fly-eye lens 314 is the image of the multiple light source images formed on the emission surface of the first fly-eye lens 309 (illustrated on FIG. 11) within the light amount stop 310. In other words, each of the light source images formed on the emission surface of the mosaic type fly-eye lens 314 comprises multiple micro light source images uniformly distributed, for example, within a circular region.

Hence, the light source image obtained on the end face of the first lens bundle 314a by projecting the light source image formed on the emission surface of the mosaic type fly-eye lens 314 comprises multiple micro images of the light source distributed within a circular region 364. The circular region 364 is similar to the shape of the aperture of the light amount stop 310 illustrated in FIG. 12. If the aperture of the light amount stop 310 is opened too wide, however, the circular region 364 cannot be contained within the end face of each lens element 361 since the cross section of each of the lens elements 361 is a thin long rectangle. For this reason, if a fly-eye lens comprising lens elements whose cross sections are similarly shaped as those of the lens elements 361, an eclipse of the light source image is generated on the emission surface, and the illumination efficiency decreases as a result.

According to the present embodiment, the second lens bundle 314b comprising lens elements 365 whose cross sections are approximate squares is installed right behind the first lens bundle 314a. As a result, the light source images distributed within the circular region 364 centered at the center 367 of the lens element 365 are formed. In this case, since the cross section of the lens element 365 is approximately a square, the circular region 364 is contained almost completely within the cross section of the lens element 365 even when the aperture of the light amount stop 310 is widely opened. Consequently, the degree of the eclipse of the multiple light source images formed on the emission surface of the mosaic type fly-eye lens 314 is reduced, and illumination efficiency is improved. Moreover, an extremely high degree of uniformity of the illuminance distribution on the reticle and the wafer is achieved by performing superimposed illumination with the illuminating light from the multiple light source images formed on the emission surface of the mosaic type fly-eye lens 314.

With continued reference to FIG. 11, in the reticle side second lens bundle 314b of the mosaic type fly-eye lens 314, a control mechanism 315 that shifts the lens bundle 314b along a direction perpendicular to the optical axis AX1 and controls the inclination angle of the lens bundle 314b within a prescribed range is installed. According to the present embodiment, the telecentric type displacement amount in the illumination optical system is corrected by controlling the inclination angle-and the shift amount of the lens bundle 314b via the control mechanism 315. For example, when the mercury lamp 310 is exchanged or the illumination condition is switched (between the regular illumination and the deformed illumination and the like) the telecentric type displacement amount in the illumination optical system is automatically corrected by controlling the movement of the control mechanism 315 via the main control system 319.

According to FIG. 11, an aperture stop plate 316 on which multiple kinds of aperture stops are arranged in a vicinity of the emission surface of the mosaic type fly-eye lens 314 is installed.

Figure 14:
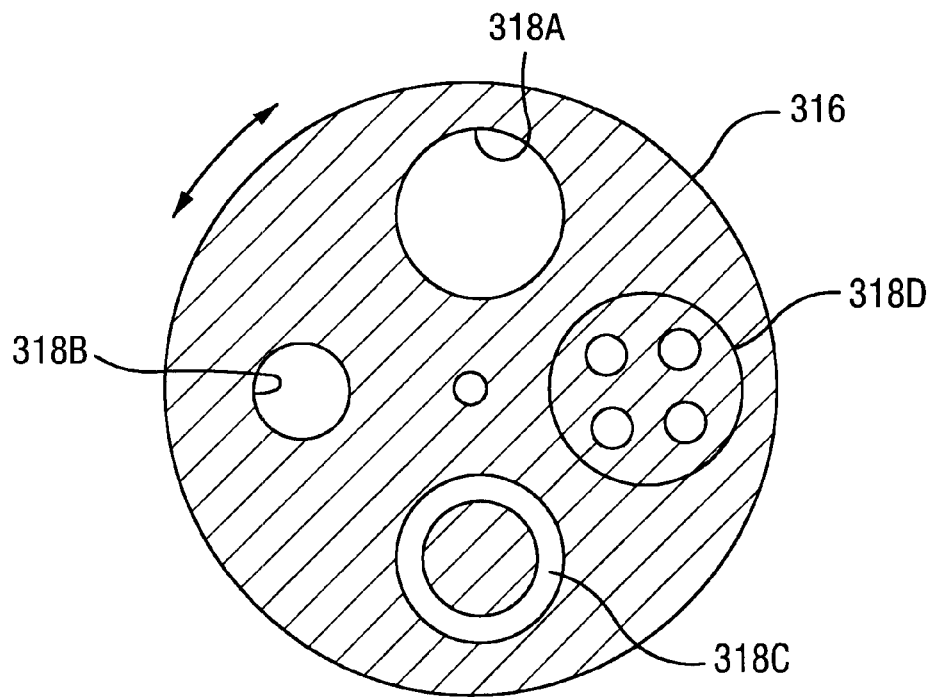
FIG. 14 illustrates an example of the aperture stop plate used in the illumination system of the exposure apparatus shown in FIG. 11.

FIG. 14 illustrates one example of the aperture stop plate 316. According to FIG. 14, installed on the aperture stop plate 316 with approximately equal angular separation are an aperture stop 318A comprising a standard circular aperture, an aperture stop 318B comprising a small circular aperture for the purpose of reducing the value of the coherence factor F, an annular shaped aperture stop 318C for the purpose of zonal illumination, and an aperture stop 318D with multiple apertures eccentrically installed with respect to the optical axis for the purpose of deformed illumination. Any desired aperture stop can be selected from the four aperture stops by rotating the aperture stop plate 316.

With reference again to FIG. 11, the main control system 319 controls the rotation angle of the aperture stop plate 316 by the driving motor via an illumination-system-stop mobilization mechanism 317. The illumination light IL that has passed through an aperture stop selected from the aperture stop plate 316 after being emitted from the mosaic type fly-eye lens 314 enters a beam splitter 331 with a transmittance of approximately 98%. Then, the illumination light IL that has passed through the beam splitter 331 reaches a movable blind (variable view field stop) having two movable blades or blinds 335A and 335B via a first relay lens 334. The installation plane of the movable blinds 335A and 335B serves as a Fourier transform plane for the emission surface of the mosaic type fly-eye lens 314. That is, the installation plane of the movable blinds 335A and 335B is conjugate with the pattern formation plane of the reticle R. A fixed blind 337 having a fixed aperture shape is installed in a vicinity of the movable blinds 335A and 335B.

The fixed blind 337 is a mechanical view-stop with a rectangular aperture that is surrounded by, for example, four knife edges. The rectangular aperture determines the shape of the slit-shaped illumination field above the reticle R. That is, the illumination light restricted by the movable blinds 335A and 335B and the fixed blind 337 forms a slit-shaped illumination field 341 with uniform illuminance distribution above the reticle R via a second relay lens 338, a condenser lens 339 and a mirror 340.

The installation plane of the fixed blind 337 is slightly defocused with respect to the conjugate plane of the pattern formation plane of the reticle R. Hence, the illumination distribution of the edge part of the slit-shaped illumination field 341 varies with prescribed inclination. In addition, the movable blinds 335A and 335B prevent the slit-shaped illumination field from intersecting fields above the reticle R that should not be exposed at the beginning and the end of the scanning exposure. Hence, the movable blinds 335A and 335B are supported so that they can be opened and closed by sliding mechanisms 336A and 336B, respectively. The sliding mechanisms 336A and 336B constitute the movable blind mobilization mechanism whose movement is controlled by a stage control mechanism 346.

The image of a pattern within the illumination field 341 above the reticle R is projected onto a slit-shaped exposure field 347 (a wafer W' conjugate with the illumination field 341 above the reticle R) at the projection magnification power β (β is 1/4 or 1/5, for example) via the projection optical system PL. The Z-axis represents a direction parallel to the optical axis of the projection optical system PL, the X-axis represents a direction parallel to the scanning direction of the wafer W and the reticle R during exposure, and the Y-axis represents a (non-scanning) direction perpendicular to the XZ plane. The reticle R is held on a scanning stage 342 that can freely slide along the X-direction on a reticle base 343. The wafer W is held on a wafer stage 348 that scans the wafer W along the X-direction and positions the wafer W along the Y-direction. The wafer stage 348 also contains a Z-stage that positions the wafer along the Z-direction.

The scanning stage 342 is supported on the reticle base 343 via a static pressure air bearing (not shown), and is mobilized along the X-direction by a mobilization system comprising a linear motor and the like. Similarly, the wafer stage 348 is supported on a base via a static pressure air bearing, and can be mobilized two-dimensionally on the XY plane. According to the present embodiment, the movement of the scanning stage 342 and that of the wafer stage 348 are controlled by the stage control system 346 via these mobilization systems. Note that the mobilization system of the scanning stage 342 and the wafer stage 348 can alternatively be constituted with a ball screw and a rotary motor, which rotary drives the ball screw.

During scanning exposure, the stage control system 346 scans a prescribed shot field on the wafer W in the −X direction (or +X direction) with respect to the exposure field 347 at the speed Vw (which equals βVr) by scanning the wafer stage 348 via a mobilization system synchronously as it scans the scanning stage 342 holding the reticle R in the +X direction with respect to the illumination field 341 at the speed Vr via a mobilization system. In this way, the pattern of the reticle R is sequentially transfer-exposed. Moreover, the stage control system 346 controls the positions of the movable blinds 335A and 335B during scanning exposure via the sliding mechanisms 336A and 336B. The control method will be described with reference to FIG. 16.

Figure 16A:
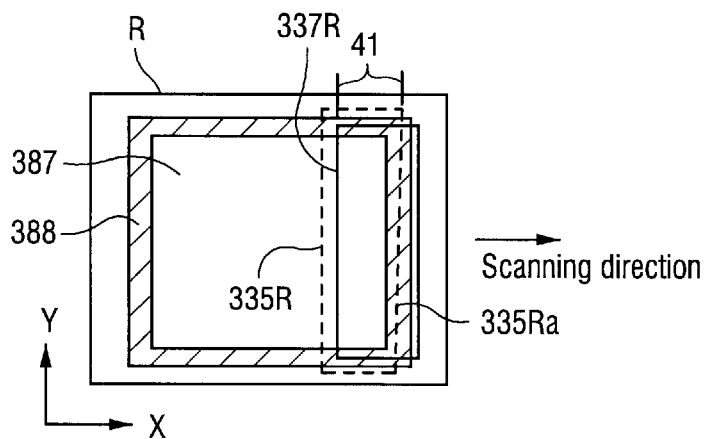
FIGS. 16(A), 16(B) and 16(C) shows the action of the movable blinds 35A and 35B used in the scanning exposure process in the exposure apparatus shown in FIG. 11.
Figure 16B:
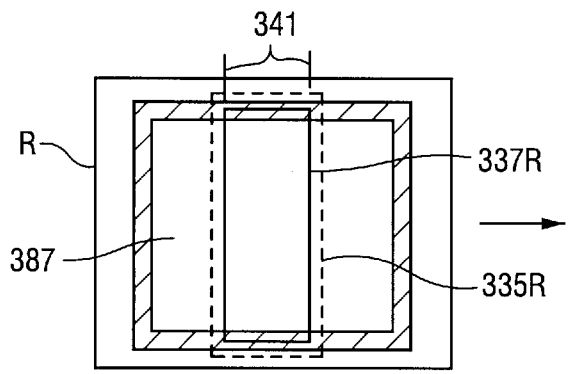
Figure 16C:
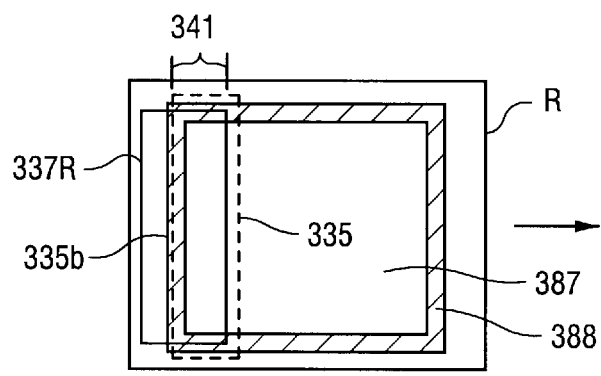

First, as shown in FIG. 16(A), the image 337R of the aperture of the fixed blind 337 shown in FIG. 11 is extended outside with respect to the shielding zone 388 that surrounds the pattern field 387 of the reticle blind R immediately after the scanning exposure is started. To avoid exposure to an unwanted part, the movable blade 335B of FIG. 11 is shifted and one edge 335Ra of the image 335R of the movable blinds 335A and 335B is brought into the shielding zone 388. After that, as shown in FIG. 16(B), when the image 337R of the fixed blind 337 is contained inside the pattern field 387 along the scanning direction, the image 335R of the movable blinds 335A and 335B is set to surround the image 337R. Then, when scanning ends, as shown in FIG. 16(C), if the image 337R of the fixed blind 337 extends outside, the movable blade 335B of FIG. 11 is shifted, and the other edge 335Rb of the image 335R of the movable blinds 335A and 335B is brought into the shielding zone 388. By this operation, the slit-shaped illumination field 24 above the reticle R is prevented from extending outside the shielding zone 388, and consequently, unwanted exposure of the wafer is prevented. Moreover, according to the present embodiment, the movable blinds 335A and 335B are also used to completely shield the exposure light to the reticle R side when the shutter 304 is held open if necessary Referring again to FIG. 11, an illuminance non-uniformity sensor 349 consisting of a photo electric detector having a light-intercepting surface whose height is the same as that of the exposure surface of the wafer W is installed in a vicinity of the wafer W held on the wafer stage 348. The detection signal emitted from the illuminance non-uniformity sensor 349 is supplied to the main control system 319. A reference mark plate 350, which is used to perform reticle alignment, is installed on the wafer stage 348, and a reference mark 350a consisting of aperture patterns is formed on the reference mark plate 350. In addition, an alignment mark is formed so that the reference mark 350a also corresponds to the reticle R. For example, when the reticle R is exchanged, the reference mark 350 is shifted into the effective exposure field of the projection optical system PL, and the reference mark 350a of the reference mark plate 350 is illuminated from the bottom side by the illumination light emitted from the light source 351, whose wavelength band is identical to that of the illumination light IL. Under this illumination light, the images of the alignment mark above the reticle R and the reference mark 350a are observed through a reticle alignment microscope 344 via a mirror 345 installed above the reticle R. Then, based on the observation result, the position of the reticle R with respect to the reference mark plate 350 is adjusted.

Furthermore, on the reference mark plate 350, a reference mark for the purpose of focus calibration is formed, and a detection system is installed at the bottom of the reference mark.

Figure 15A:
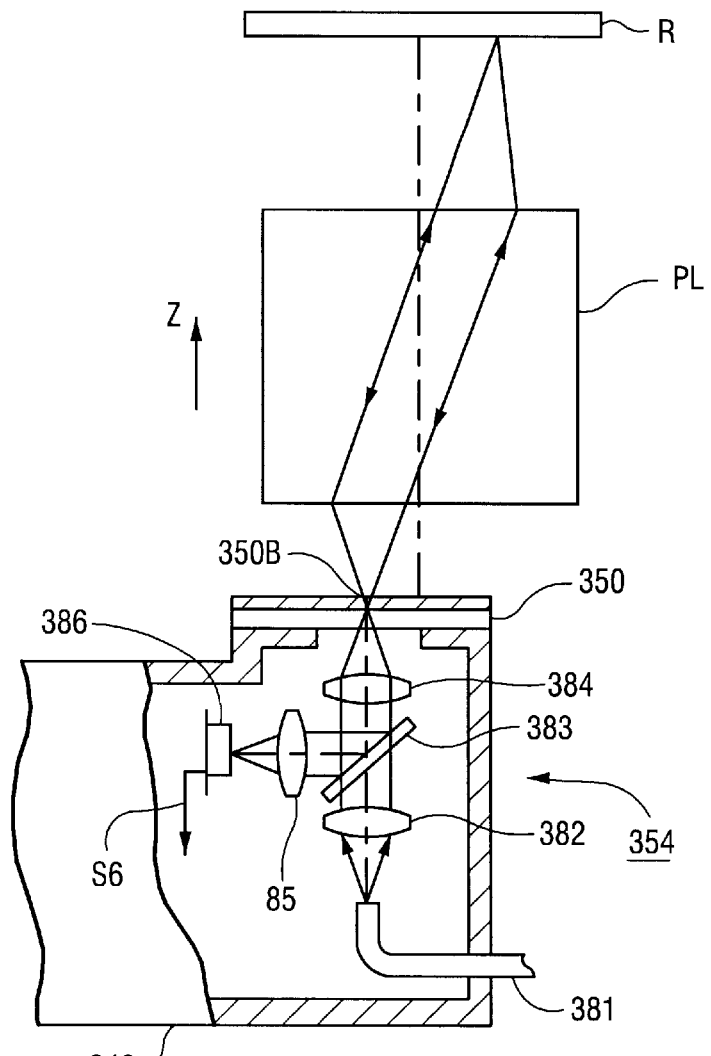
FIG. 15(A) illustrates the major components of the focus-calibration mechanism.

FIG. 15(A) illustrates the reference mark for the purpose of focus-calibration and a detection system. In FIG. 15(A), a reference mark 350b comprising, for example, a cross shaped aperture pattern, is formed on a shielding membrane, which lies on the reference mark plate 350, and a detector 354 is installed at the bottom of the reference mark 350b. Using this reference mark 350b, the position of the image formation plane of the projection optical system PL is obtained as follows: (1) In the detection system 354, illumination light whose wavelength band is identical to that of the illumination light IL of FIG. 11 is guided to the interior of the wafer stage 348 via an optical fiber 381; (2) the reference mark 350b is illuminated from the bottom side by this illumination light via a collimator lens 382, a half mirror 383 and a condenser lens 384; (3) the illumination light that has passed through the reference mark 350b forms the image of the reference mark 350b on the pattern forming plane of the reticle R via the projection optical system PL; (4) the light reflected on this pattern forming plane returns to the reference mark 350b via the projection optical system PL; and (5) the illumination light that has passed through the reference mark 350b passes through the condenser lens 384, the half mirror 383, and a condenser lens 385 within the detection system 354 and enters a photoelectric detector 386.

Figure 15B:
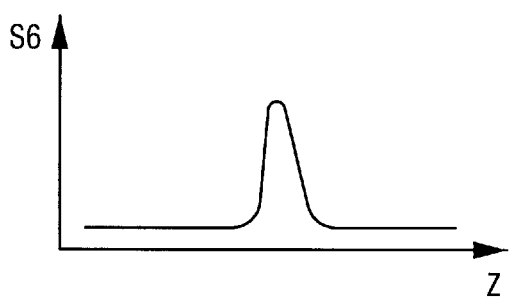
FIG. 15(B) illustrates the waveform of the detection signal obtained by the focus-calibration mechanism shown in FIG. 15(A)

The detection signal S6 photoelectric transfer signal) from the photoelectric detector 386 is supplied to the main control system 319 illustrated in FIG. 11. In this case, when the Z-direction position of the reference mark 350b is changed by mobilizing the Z-stage within the wafer stage 348, as shown in FIG. 15(B), the detection signal S6 changes so that the Z-coordinate of the reference mark 350b is maximized when it coincides with the position of the image forming plane of the projection optical system PL. Hence, the position of the image forming plane of the projection optical system PL can be obtained from the change in the detection signal S6. After that, exposure is performed under favorable conditions by setting the exposure plane of the wafer at the above-mentioned position. Hence, by using the reference mark 350b of the reference mark plate 350, calibration (focus-calibration) of the image formation plane position of the projection optical system PL is performed.

As shown in FIG. 11, the leak light reflected by the beam splitter 331 whose transmittance is approximately 98% is condensed on the light interception surface of the integrator sensor 33 used as a photo amount sensor, which comprises a photoelectric detector via the condenser lens 332. The light interception surface of the integrator sensor 333 is conjugate with the pattern formation plane of the reticle R and also with the exposure surface of the wafer W. A detection signal (photoelectric transfer signal) from the integrator sensor 33 is supplied to the exposure dose control system 320. The detection signal is also supplied to the power source system 322 for the mercury lamp 301 via the exposure dose control system 320.

A memory 321 is connected to the exposure dose control system 320. The memory 321 stores the transformation coefficients and the like for the purpose of obtaining exposure energy on the wafer from an output signal sent from the integrator sensor 333. According to the present embodiment, however, the output signal from the integrator sensor 333 is calibrated by, for example, a prescribed reference illuminometer. Based on this calibration result, the correction coefficients for the purpose of correcting the output signal from the integrator sensor 333 are also stored in the memory 321.

A light interception surface of the integrator sensor 333 is installed at a position conjugate with the pattern plane of the reticle R. Due to this setting, the detection signal from the integrator sensor 333 remains error free even when the shape of the aperture stop is changed by rotating the aperture stop plate 316. However, the light interception surface of the integrator sensor 333 may alternatively be installed on an observation plane that is practically conjugate with the Fourier transform plane (pupil plane) of the reticle pattern under the projection optical system PL, and the light beams that pass through this observation plane may be intercepted.

In addition, according to the present embodiment, a condenser lens 352 and a reflectance monitor 353 comprising a photoelectric detector are installed on the opposite side of the integrator sensor 333 with respect to the beam splitter 331 whose transmittance is approximately 98%. The light interception surface of the reflectance monitor 353 is made approximately conjugate with the surface of the wafer W by the condenser lens 352. In this case, out of the illumination light, which passes through the reticle R and is illuminated onto the wafer W via the projection optical system PL, the light reflected on the wafer W is intercepted by the reflectance monitor 353 via the projection optical system PL and the reticle R. This detection signal (photoelectric transfer signal) is supplied to the main control system 319. In the main control system 319, the light amount (power) of the illumination light that passes through the projection optical system PL is obtained based on the light amount of the illumination light IL illuminated on the reticle side and the light amount of the light reflection from the wafer W, which is calculated from the detection signal from the reflectance monitor 353. Furthermore, the main control system 319 forecasts the thermal expansion amount of the projection optical system PL based on the heat energy obtained by multiplying the thus obtained light amount by the exposure time, and by the amount of change in the image-forming characteristic (such as distortion) of the projection optical system PL due to this forecasted thermal expansion amount. Then, the main control system 319 corrects the image-forming characteristic of the projection optical system PL via a correction mechanism connected to the projection optical system PL.

An exposure dose control mechanism within the illuminance control mechanism according to the present embodiment will be described.

Figure 17:
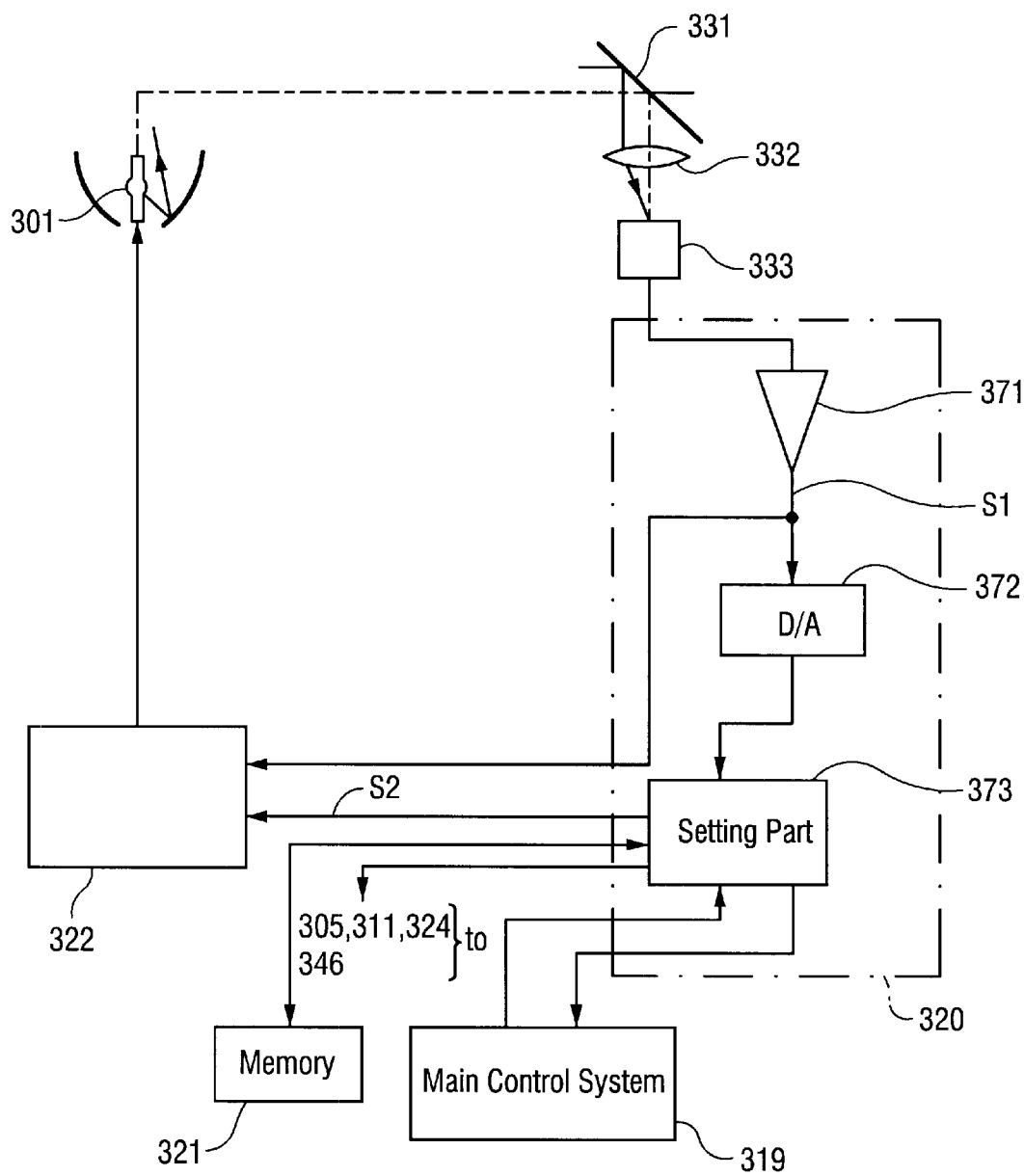
FIG. 17 is a block diagram of the exposure dose control mechanism used in the exposure apparatus shown in FIG. 11.

FIG. 17 illustrates key components of the exposure dose control mechanism of the exposure device 1110. In this FIG. 17, the exposure dose control system 320 comprises a pre-amplifier 371, a digital/analog (D/A) switch 372, and a setting part 373. The detection signal from the integrator sensor 333 becomes an illuminance detection signal corresponding to the illuminance of the illumination light via the amplifier 371. The illuminance detection signal S1 is taken inside the setting part 373 via the D/A switch 372 at a prescribed high sampling frequency. The information on the target integral exposure dose for the wafer W is also supplied to the setting part 373 from the main control system 319. Furthermore, as mentioned previously, the transformation coefficients and the like for the purpose of obtaining the actual exposure dose (exposure energy per unit time) on the wafer W from the value of the illuminance detection signal S1 are stored in the memory 321 connected to the setting part 373. In this way, in the setting part 373, the exposure dose on the wafer W is recognized from the illuminance detection signal S1.

In the setting part 373, the conditions required to obtain the target integral exposure dose are set before starting the scanning exposure. In FIG. 11, if the output power of the mercury lamp 301 is represented by p, the transmittance at the attenuation plate 323 by $q_1$, the transmittance at the light amount stop by $q_2$, then using the coefficient k, which varies corresponding to the shape of the aperture stop, the exposure dose e on the wafer W can be expressed as follows:

$$e=(k)(p)(q_1)(q_2) \quad (104)$$

Also, if the width of the slit-shaped exposure field on the wafer W along the scanning direction is denoted by D and the scanning speed along the X direction during the scanning exposure of the wafer stage 48 by Vw, then the integral exposure dose $\Sigma E$ on the wafer W can be expressed by using equation (104) as follows:

$$\Sigma E=e(D/Vw)=(k)(p)(q_1)(q_2)(D/Vw) \quad (105)$$

In this case, if it is assumed that the width D of the exposure field 347 along the scanning direction is fixed, then, in order to control the prescribed target integral exposure dose $\Sigma E_0$, it suffices to control one of or simultaneously multiple numbers of the output power p of the mercury lamp 301, the transmittance $q_1$ at the attenuation plate 323, the transmittance $q_2$ at the light amount stop and the scanning speed Vw on the wafer stage 348. Hence, in FIG. 17, in order to converge the integral exposure dose $\Sigma E$ to the prescribed target integral exposure dose $\Sigma E_0$, (1) the setting part 373 supplies the target illuminance signal S2 corresponding to the target output power of the mercury lamp 301 to the power source 322, (2) the transmittance $q_1$ of the attenuation plate is set via the mobilization mechanism 324 of FIG. 11, (3) the transmittance $q_2$ at the light amount stop 310 is set via the mobilization mechanism 311, and (4) the scanning speed Vw on the wafer stage 348 is set via the stage control system 346. In this case, if the projection magnification power from the reticle R of the projection optical system PL to the wafer W is denoted by β, the scanning speed Vr on the reticle stage 342 becomes $-Vw/\beta$.

In addition, in the setting part 373, for example, based on the average of the prescribed multiple number of measured values of the illuminance detection signal S1, which are sampled at high speed, the actual exposure dose on the wafer W is calculated and the value of the target illuminance signal S2 is corrected so that this calculated result becomes the target exposure dose. The mode in which the emission power of the mercury lamp 301 is feedback-controlled based on the detection result of the integrator sensor 333 so that the illuminance on the wafer W becomes constant in this way is called the constant illuminance control mode. In addition to this mode, there is also a mode called the constant power control mode that fixes the power supplied to the mercury lamp 301 at a constant value. This constant power control mode, however, is rarely used during the actual scanning exposure.

In FIG. 17, the target illuminance signal S2 and the illuminance detection signal S1 are supplied to the power source system 322. In this power source system 322, the power for the purpose of turning on the mercury lamp 301 is controlled so that the illuminance detection signal SI becomes the target illuminance signal S2. The photoelectric transfer signal corresponding to the emission power of the mercury lamp 301 is emitted from the integrator sensor 333.

The reflection type mirror of the attenuation plate 323 consists of, for example, a glass substrate coated with a dielectric multi-layer membrane. Hence, the membrane characteristics of the attenuation plate 323 can temporarily change in some cases when the exposure light is illuminated on the attenuation plate 323. This change induces a change in the light reduction power of the attenuation plate 323, which is inconvenient in controlling the exposure dose. Moreover, the surface of the reflection type mirror can also become hazy due to the precipitation of gas elements in the air as well as the change in the membrane characteristics. The haze on the surface of the reflection type mirror also induces a change in the light reduction power of the attenuation plate 323. Hence, the light reduction powers of several attenuation plates 323 are periodically measured. The attenuation plate 323 according to the present embodiment is structured so that it can be freely installed and removed. Thus, the mercury lamp 301 is first turned on and the illuminance is stabilized. Then, the attenuation plate 323 is inserted or removed. After that, the output of the integrator sensor 333 is compared before and after the insertion or removal of the attenuation plate 323, and the light reduction power is calculated. According to the present embodiment, the attenuation plate is structured so that it can be freely inserted or removed. However, when a rotation type switching method using, for example, a revolver is used, a plain glass plate is often inserted as a balancer. In that case, the output of the integrator sensor 333 when the plain glass plate is inserted and the output integrator sensor 333 when the attenuation plate is inserted are compared.

During the measurement of the attenuation rate, fluctuation occurs in the illuminance of the mercury-vapor lamp 31. This fluctuation is corrected by appropriately averaging them out.

If the number of attenuation plates 323 used, except for those having a 100% transmittance, is n, there are (n+1) attenuation levels (or transmittances) graded by discrete intervals based on a geometric series.

If the range of the transmittance is 1 to $r_{min}$, the transmittances are set to $r_{min}^{(1/(n+1))}$, $r_{min}^{(2/(n+1))}$, $r_{min}^{(3/(n+1))}$, ... $r_{min}^{(n/(n+1))}$.

Figure 18A:
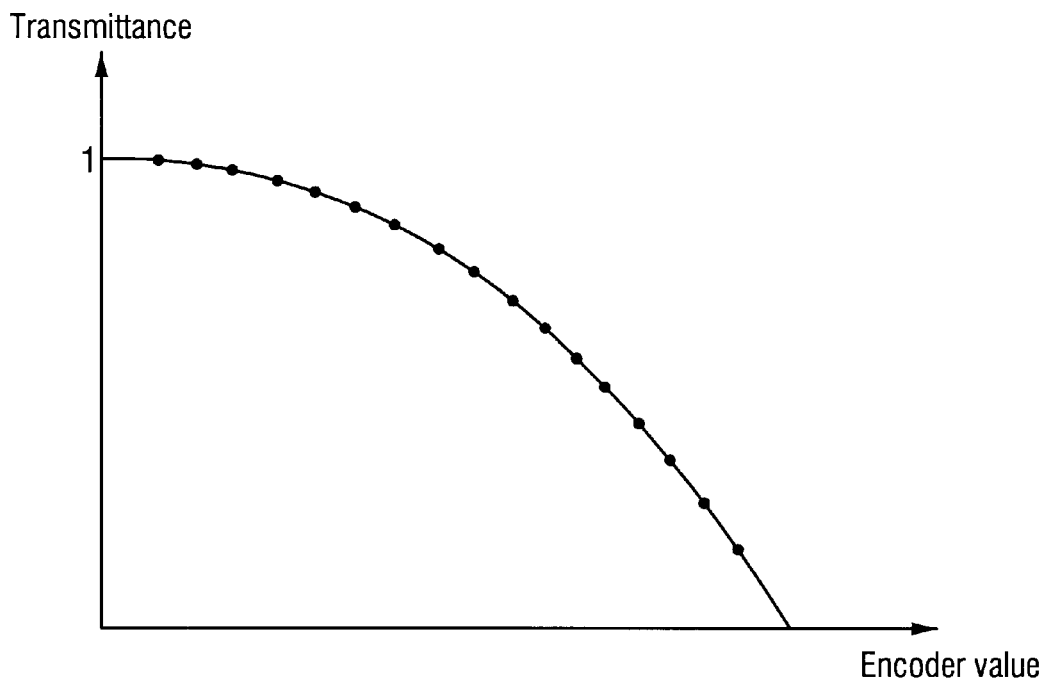
FIG. 18(A) is a graph showing the measured transmittance as a function of the encoder value, which is used to create a control map for the iris.
Figure 18B:
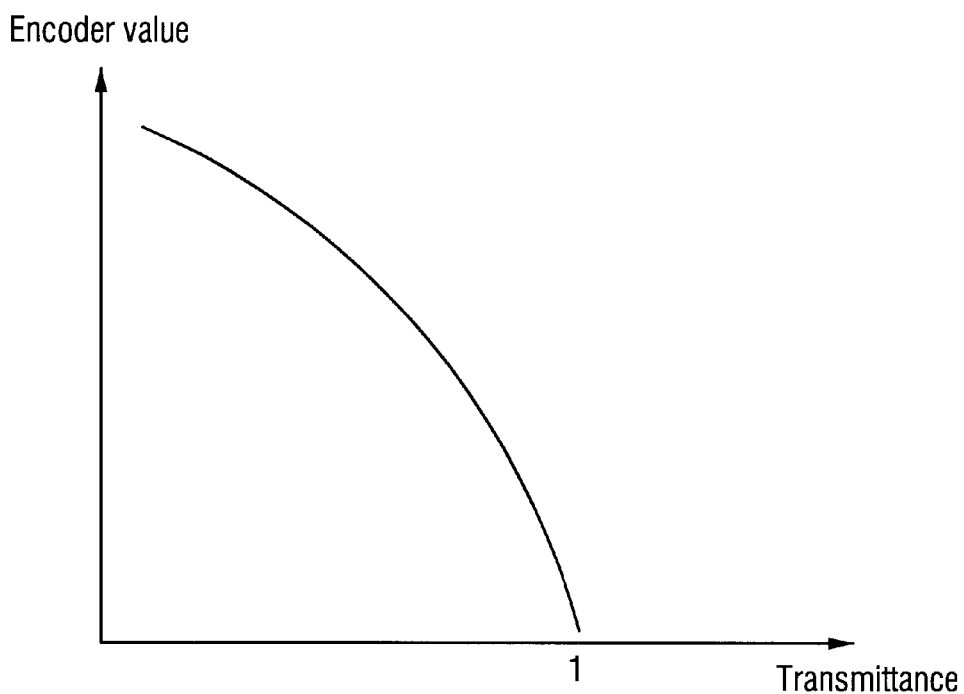
FIG. 18(B) is a graph of the control map obtained from the measurement result shown in FIG. 18(A)

The aperture diameter of the iris 310 is adjusted by an open control. First, the mercury-vapor lamp 31 is turned on. When the illuminance of the lamp 31 becomes stable, the rate of change in the quantity of light is measured using an integrator sensor 333 with regard to the diameter of the iris starting from the full-open state (see FIG. 18(A)). Based on this measurement, a control map shown in FIG. 18(B) is created, which is used in a later step to determine the aperture diameter of the iris corresponding to the attenuation rate. Since, in practice, the aperture diameter of the iris is controlled by an encoder, the control map is composed of the encoder-readable values corresponding to the attenuation rates. When measuring the attenuation rate of the iris, several rounds of measurement are performed at a given aperture diameter, and the obtained data is averaged as in the measurement of the attenuation rate of the attenuation plate 323. Because the measured values are discrete, linear interpolation is performed for creating the control map. If the measured values do not exhibit adequate linearity due to the structure of the iris, then a higher degree interpolation is performed to create the map.

The output power of the mercury-vapor lamp 301 is adjusted in the following manner. The illuminance of the lamp changes linearly as a function of the electric power. Even if the illuminance at the maximum electric power decreases as the lamp deteriorates (ages), the linearity of the relation between the electric power and the illuminance is maintained. Accordingly, if the maximum quantity of light $P_{max}$ is determined, the electric power corresponding to a given illuminance is easily determined within the control range of the lamp. (It should be noted that $p_{max}$ is measured under a constant electric power when the mercury-vapor lamp 301 is turned on.)

If the driving electric power is Q, the maximum power is $Q_{max}$, the minimum power is $Q_{min}$, and the slope is m, then the following equations are established:

$$p = mQ + b \quad (106)$$

$$P_{max} = mQ_{max} + b \quad (107)$$

$$P_{min} = mQ_{min} + b \quad (108)$$

where b is an offset. The slope m satisfies the relation:

$$m = (p_{min} - p_{min})/(Q_{max} - Q_{min}) \quad (108A)$$

If the offset b is substantially small relative to the fluctuation range of the illuminance of the lamp 301 under the constant power control, such that it can be neglected, the slope m is calculated from only $Q_{max}$ and $p_{max}$.

The light quantity p of the lamp 301 is expressed in terms of the maximum quantity of light $p_{max}$:

$$p = (p_{max})(t_L) \quad (109)$$

where $t_L$ is a factor defined by the electric power supplied to the lamp 301 and has a linear relation with the electric power.

Provided that the offset b can be neglected, the electric power is calculated from equation (109):

$$Q = (p_{max})(t_L)/m \quad (110)$$

The output p of the mercury-vapor lamp 301 is a linear function of the electric power Q. Therefore, when taking b into account, the slope m and the intercept b are calculated taking advantage of this linearity. That is, the outputs (i.e., the quantity of light) p of the lamp 301 are measured at the maximum power $Q_{max}$ and the minimum power $Q_{min}$, respectively, by the integrator sensor 333 to determine the slope m and the intercept b. For obtaining the value of p, several rounds of measurement are conducted, and the data is averaged out for the purpose of removing the fluctuation. As the output p of the lamp 301 is measured, the iris is full-opened with its aperture diameter at its maximum. When the output p is expressed by the linear function of the electric power, the output p is normalized using the maximum output value and described as a ratio to the maximum output value. Then, the inverse function is calculated so as to designate the electric power from the output ratio.

As has been described above, the output (i.e., the quantity of light) of the lamp 301 is expressed as a linear function. A high-degree error component, which is an offset from the linear function, can be substantially corrected during the constant illuminance control step.

It should be noted that since the output of the mercury-vapor lamp 301 is naturally attenuated by, for example, deterioration of the electrodes in the lamp, the maximum output $p_{max}$ is periodically measured at a constant frequency.

Next, the exposure dose control method according to the embodiment will be discussed If the output (or the quantity of light) of the mercury-vapor lamp 301 is p, the transmittance of the attenuation plate 323 is $q_1$, and the transmittance of the iris 310 is $q_2$, then the total exposure dose e at a point on the wafer W is expressed using a coefficient k, which depends on the shape of the aperture stop in the illumination system:

$$e = kpq_1q_2 \quad (111)$$

If the width of the slit-like exposure area on the wafer W is D and the scanning speed of the wafer stage during the scanning exposure process is $V_w$, the integral exposure dose $\Sigma E$ is expressed in terms of equation (111):

$$\Sigma E = e(D/Vw) = kpq_1q_2(D/Vw) \quad (112)$$

where p and $q_2$ are changeable in continuous fashion, which allows finer adjustment of the exposure dose. Equation (112) is satisfied when rectangular approximation can be applied to the illuminance distribution in the slit-like exposure area.

Assuming that the width D of the slit-like area on the wafer W is fixed for the purpose of simplifying the explanation, if the maximum output of the lamp 301 is $P_{max}$, the integral exposure dose $\Sigma E$ is determined from equation (112), using a parameter r indicating the transmittance of that exposure light, wherein:

$$\Sigma XE \; r(p_{max})/Vw \quad (113)$$

Figure 29:
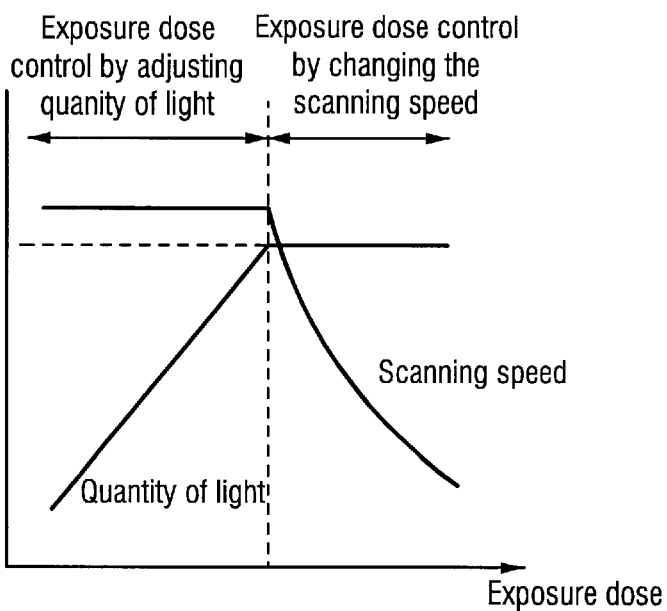
FIG. 29 shows two regions of the sensitivity of the resist.
Figure 30:
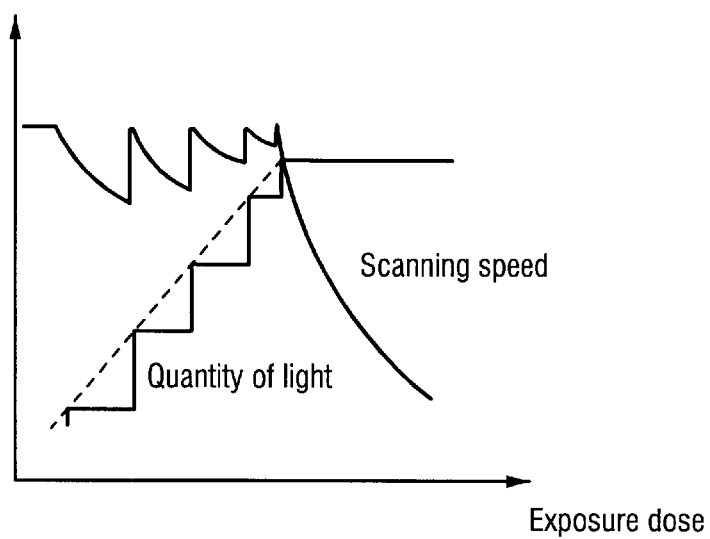
FIG. 30 is a diagram used to explain the problems of the prior art.

As is clear from equation (113), the integral exposure dose is proportional to r and inverse-proportional to $V_w$. Thus, the integral exposure dose can be adjusted by two separate means according to the sensitivity of the resist layer, namely, a means for adjusting the scanning speed and a means for changing the attenuation rate. Based on this grouping, the sensitivity of the resist can be divided into two regions, as shown in FIG. 29, a low-sensitivity region, where the integral exposure dose is regulated by controlling the scanning speed $V_w$, and a high-sensitivity region, where the integral exposure dose is adjusted by the attenuator.

The boundary between these two regions is determined by the upper limit of the scanning speed $V_w$ that can transfer the pattern of the reticle R onto the wafer W and the maximum output (quantity of light) $p_{max}$ of the lamp 301.

Because the scanning speed is changed in continuous fashion, the exposure dose can be finely adjusted in the low-sensitivity region according to the sensitivity of the resist. Accordingly, in the low-sensitivity region, the integral exposure dose is controlled solely by the adjustment of the scanning speed $V_w$.

On the other hand, in the high-sensitivity region, the integral exposure dose is controlled by the attenuator. If such an attenuator changes the attenuation rate only in discrete fashion, the throughput decreases. To avoid such a situation, an iris 310 that can change its transmittance in continuous fashion is used as an attenuator to adjust the exposure dose in a continuous manner according to the sensitivity of the resist. At the same time, the system is adapted to change the output of the mercury-vapor lamp 301 itself in continuous fashion by the exposure control system 20 and the power source system 22.

The output (quantity of light) p of the mercury-vapor lamp 301 is normalized using a parameter $t_L$ and the maximum level $p_{max}$:

$$p = (p_{min})(t_L) \quad (113A)$$

where $t_L$ is a factor defined by the electric power supplied to the lamp 301 and has a linear relation with the electric power.

Equations (111) and (112) are written in terms of equation (113A):

$$e = k(p_{max})(t_L)q_1q_2 \quad (114)$$

$$\Sigma E = e(D/Vw) = k(p_{max})(t_L)q_1q_2(D/Vw) \quad (115)$$

Equation (115) is rewritten using the parameter r.

$$\Sigma E = e(D/V_w) = k(p_{max})r(D/Vw) \quad (116)$$

If the integral exposure dose $\Sigma E$ is given, a pair of the values r and $V_w$ are determined.

Figure 19:
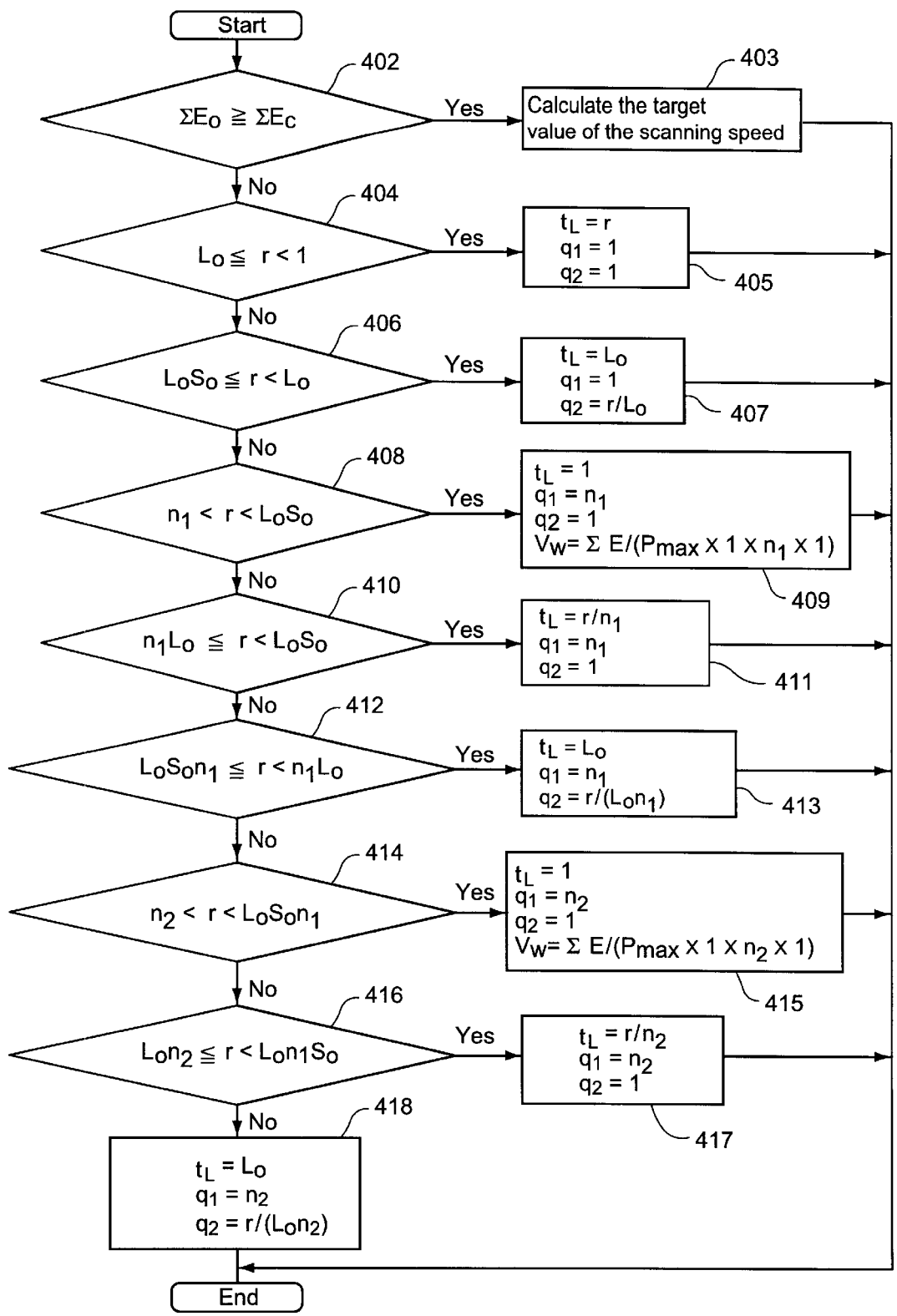
FIG. 19 is a flowchart showing the CPU's exposure dose control algorithm in the setup unit included in the exposure control system.

FIG. 19 is a flowchart showing the CPU light quantity control algorithm in the setup unit 373, which is a component of the exposure control system. An example of the exposure control process performed according to the invention will now be described with reference to FIG. 19. In this example, the adjusting range of the parameter $t_L$ is set to $L_p \leq t_L \leq 1$ ($L_0 < 1$), and the number of attenuation plates 323 is two for the purpose of simplifying the explanation. Accordingly, the transmittance $q_1$ of the attenuation plate 323 can take three values, 1, $n_1$ and $n_2$ ($n_2 < n_1 < 1$). The adjusting range of the transmittance $q_2$ of the iris 310 is $S_0 \leq q_2 \leq 1$ ($S_0 > 1$).

It is necessary to set the lower limit $S_0$ of the transmittance $q_2$ of the iris 310 because the iris 310 is positioned at the exit plane of the first fly-eye lens 309. The transmittance $q_2$ of the iris 310 is determined by its aperture diameter. If the aperture diameter of the iris 310 becomes too small, the number of lens elements whose images are projected to the second fly-eye lens 314 decreases, and the uniformity in the illuminance is reduced, which causes unevenness in the illuminance. For this reason, the lower limit $S_0$ is set.

The transmittance $q_1$ of the attenuation plate 323 is determined based on the minimum value $r_{min}$ of the attenuation rate r, which is obtained by plugging the minimum integral exposure dose $\Sigma E_{min}$ and the maximum scanning speed $Vw_{max}$ into equation (113). In this example, $q_1$ is set to 1, $n_1$ or $n_2$, and:

$$n_1 = r_{min}^{(1/3)} \quad (117)$$

$$n_2 = r_{min}^{(2/3)} \quad (118)$$

The adjusting ranges of the parameters $t_L$, $q_1$, and $q_2$ are determined so that the minimum attenuation rate $r_{min}$ satisfies:

$$r_{min} \leq (L_0)(S_0)(n_2) \quad (119)$$

It is presumed that the value of k(pma) has already been determined by measuring the maximum illuminance under a desirable illumination condition. When the maximum illuminance is measured, it is preferable that the shutter is opened for a necessary and sufficient time. It is not desirable to open the shutter for an unnecessarily long time. As has been mentioned, once the value $K(p_{max})$ is obtained through the measurement under the desirable illumination condition, then r is determined, which is written:

$$r = (t_L)(q_1)(q_2) \quad (120)$$

The operation shown by the flowchart of FIG. 19 starts when the target integral exposure dose $\Sigma E_0$ is input by the operator through the console (not shown) to the master control system 319, and supplied to the setup unit 373 from the master control system 319. First, in step 402, it is determined if the target integral exposure dose $\Sigma E_0$ is greater than or equal to the boundary integral exposure dose $\Sigma E_c$ ($\Sigma E_0 \leq \Sigma E_c$) The boundary integral exposure dose $\Sigma E_c$ is determined by:

$$\Sigma E_c = (p_{max})D/Vw_{max} \quad (121)$$

If the comparison result in step 402 is YES, it is regarded that the low-sensitivity region ($r \geq 1$) applies to this exposure process, and the process proceeds to step 403, in which the target scanning speed $Vw_0$ is calculated to control the exposure dose through adjustment of the scanning speed. The calculation in step 403 is performed based on equation (122):

$$Vw_0 = (p_{max})D/\Sigma E_0 \quad (122)$$

When the target scanning speed $Vw_0$ has been obtained, the routine of this process terminates, and scanning exposure is actually performed at the scanning speed $Vw_0$ and with the maximum quantity of light $P_{max}$.

If the comparison result in step 402 is NO, it is regarded that the high-sensitivity region (r<1) applies, and the process proceeds to step 404, in which it is determined if $L_0 \leq r<1$, wherein r is a parameter of the transmittance of the attenuation rate expressed by the following equation:

$$r = \Sigma E_0 \cdot Vw_{max}/(kp_{max}D) \quad (123)$$

If, in step 404, the inequality (i.e., the condition of r) is satisfied, the process proceeds to step 405 to regulate the quantity of exposure light so that $t_L=r$, $q_1=1$, and $q_2=1$ are satisfied at the same time. More particularly, the electric power supplied to the mercury-vapor lamp 301 is regulated to satisfy $t_L=r$, the attenuation plate 323 is removed off the optical path of the exposure light, and the aperture of the iris is set to 100% open. When these adjustments are completed, the process terminates.

If the value r lies out of the range $L_0 \leq r<1$ in step 404, the process proceeds to step 406, and it is then determined if $(L_0)(S_0) \leq r<L_0$ is satisfied. If the determination result in step 406 is YES, the process advances to step 407, in which the quantity of exposure light is regulated so that $t_L=L_0$, $q_1=1$, and $q_2=r/L_0$ are satisfied at the same time. More particularly, the electric power supplied to the mercury-vapor lamp 301 is set at minimum, the attenuation plate 323 is removed off the optical path of the exposure light, and the aperture of the iris is adjusted so that the attenuation rate is set to 100% open. When these adjustments are completed, the process terminates.

If, in step 406, $(L_0)(S_0) \leq r<L_0$ is not satisfied, then the process advances to step 408 to further determine if $n_1 \leq r<(L_0)(S_0)$ is satisfied. If the determination result in step 408 is YES, it is regarded that r lies in the discontinuous region, and the process proceeds to step 409.

The discontinuous region in this context is the region in which the parameter r cannot be set to the target value under the maximum scanning speed in the high-sensitive region. This happens when the transmittance of the attenuation plate 323 has dropped as time elapsed, due to illumination of the exposure light. In this embodiment, the exposure dose is adjusted in continuous fashion by regulating the output of the mercury-vapor lamp 301 and adjusting the aperture diameter of the iris 310. However, if the transmittance of the attenuation plate 323 drops below the value of the product of the lower limits of the output of the lamp 301 and the transmittance of the iris 310, a gap is generated in the exposure dose adjusting scale, at which the quantity of light changes in a discrete manner.

In order to deal with this discontinuity, in step 409, parameter $t_L$ of the mercury-vapor lamp 301 is set to 1 (t-1), $q_1$ of the attenuation plate 323 is set to $n_1$ ($q_1=n_1$), and $q_2$ of the iris 310 is set to 1 ($q_2=1$) in response to the target amount of exposure dose $\Sigma E_0$. At the same time, the target scanning speed $Vw_0$ is controlled to satisfy $Vw_0=\Sigma E_0/(p_{max})(1)(n_1)$ (1). This means that the electric power supplied to the mercury-vapor lamp is set to its maximum, the attenuation plate 323 having the transmittance of $n_1$ is inserted in the optical path of the exposure light, the aperture ratio of the iris 310 is set to 100%, and the target scanning speed $Vw_0$ is calculated and stored in the memory 321. After these tasks are finished, the process terminates. Based on the calculated scanning speed $Vw_0$, scanning exposure is performed to achieve the target amount of the integral exposure dose $\Sigma E_0$.

If, in step 408, $n_1<r<(L_0)(S_0)$ is not satisfied, then the process advances to step 410 to further determine if $(n_1)(L_0) \leq r<(L_0)(S_0)$ is satisfied. If the determination result is YES, the process proceeds to step 411 to regulate the quantity of exposure light so that $t_L=r/n_1$, $q_1=n_1$ and $q_2=1$ are satisfied. In other words, the electric power supplied to the mercury-vapor lamp is regulated so as to satisfy $t_L=T/n_1$, the attenuation plate 323 having the transmittance of $n_1$ is inserted in the optical path of the exposure light, and the aperture ratio of the iris 310 is set to 100%. After these adjustments, the process terminates.

If the determination result in step 410 is NO, the process proceeds to step 412 to further determine if $(L_0)(S_0)(n_1) \leq r<(L_0)(n_1)$ is satisfied. If the determination result is YES, the process proceeds to step 413 to regulate the quantity of exposure light so that $t_L=L_0$, $q_1=n_1$, and $q_2=r/(L_0)(n_1)$ are satisfied. In other words, the electric power supplied to the mercury-vapor lamp is set at its minimum, the attenuation plate 323 having the transmittance of $n_1$ is inserted in the optical path of the exposure light, and the aperture ratio of the iris 310 is adjusted so that the transmittance of the iris 310 equals $r/(L_0)(n_1)$. After these adjustments, the process terminates.

If the determination result in step 412 is NO, the process advances to step 414 to further determine if $n_2<r<(L_0)(S_0)(n_1)$ is satisfied. If the determination result is YES, it is regarded that r lies in the discontinuous region, and the process proceeds to step 415. In order to deal with this discontinuity, in step 415, parameter $t_L$ of the mercury-vapor lamp 301 is set to 1 ($t_L=1$), $q_1$ of the attenuation plate 323 is set to $n_2$ ($q_1=n_2$), and $q_2$ of the iris 310 is set to 1 ($q_2=1$) in response to the target amount of exposure dose $\Sigma E_0$. At the same time, the target scanning speed $Vw_0$ is controlled to satisfy $Vw_0=\Sigma E(p_{max})(1)(n_1)(1)$. This means that the electric power supplied to the mercury-vapor lamp is set to its maximum, the attenuation plate 323 having the transmittance of $n_2$ is inserted in the optical path of the exposure light, the aperture ratio of the iris 310 is set to 100%, and the target scanning speed $Vw_0$ is calculated and stored in the memory 321. After these tasks are finished, the process terminates. Based on the calculated scanning speed $Vw_0$, scanning exposure is performed to achieve the target amount of the integral exposure dose $\Sigma E_0$.

If, in step 414, $n_2 \leq r<(L_0)(S_0)(n_1)$ is not satisfied, then the process advances to step 416 to further determine if $(L_0)(n_2) \leq r<(L_0)(n_1)(S_0)$ is satisfied. If the determination result is YES, the process proceeds to step 417 to regulate the quantity of exposure light so that $t_L=r/n_2$, $q_1=n_2$, and $q_2=1$ are satisfied. In other words, the electric power supplied to the mercury-vapor lamp 301 is regulated so as to satisfy $t_L=r/n_2$, the attenuation plate 323 having the transmittance of $n_2$ is inserted in the optical path of the exposure light, and the aperture ratio of the iris 310 is set to 100%. After these adjustments, the process terminates.

If the determination result in step 416 is NO, r is less than $(L_0)(n_2)$. Since $r_{min}>(L_0)(n_2)(S_0)$, r satisfies $(L_0)(n_2)(S_0) \leq r < (L_0)(n_2)$. In this case, the process proceeds to step 418, where the quantity of exposure light is regulated so that $t_L = r/n_{2,q1} = n_2$, and $q_2 = r/(L_0)(n_2)$ are satisfied. In other words, the electric power supplied to the mercury-vapor lamp 301 is set to its minimum, the attenuation plate 323 having the transmittance of $n_2$ is inserted in the optical path of the exposure light, and the aperture ratio of the iris 310 is adjusted so as that the transmittance of the iris 310 equals $r/(L_0)(n_2)$. After these adjustments, the process terminates.

Figure 20:
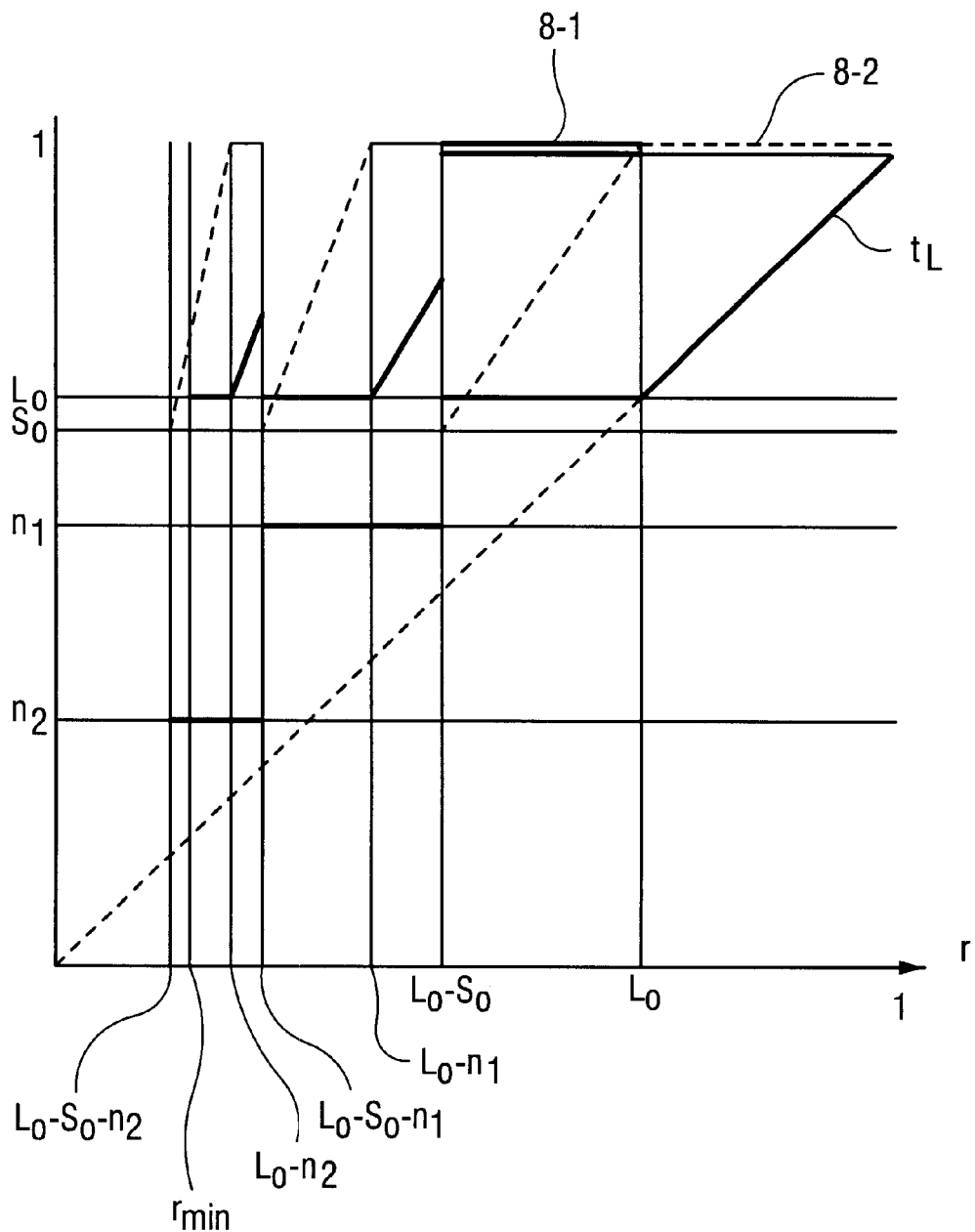
FIG. 20 is a graph showing the parameter values $t_L$ (the rate of the output of the mercury-vapor lamp), $q_1$ (transmittance of the attenuation plate 323), $q_2$ (transmittance of the iris 310), and r (which is a parameter representing the transmittance or the attenuation rate of the exposure light) which are set in the high-sensitivity region according to the flowchart of FIG. 19, in which no discontinuity occurs in exposure dose control.

FIG. 20 shows the values of the parameters r, $t_L$, $q_1$ and $q_2$ in the high-sensitivity region, assuming that no discontinuity occurs during the exposure control process. In this embodiment, when controlling the exposure dose in the high-sensitivity region, the adjusting rate of the light quantity of the lamp 301 and the actions of the attenuation structure (i.e., the attenuation plate 323 and the iris 310) differ according to the value of the parameter r that was calculated from equation (123) based on the integral amount of exposure dose $\Sigma E$. These factors are adjusted so that the output of the mercury-vapor lamp 301 is always at its necessary and minimum level.

In this embodiment, the quantity of exposure light is controlled in two steps. In the first step, the light quantity is roughly controlled in an open loop by adjusting the iris 310 and the attenuation plate 301 and by regulating the mercury-vapor lamp 301 at a constant power. Fine adjustment of the exposure light is performed by regulating the mercury-vapor lamp 301 at a constant illuminance.

A feedback loop is created by the integrator sensor 333 in the constant-illuminance control step. In the actual operation, the target illuminance is preset, and the integrator sensor 333 is controlled so that its output value reaches the target value. Through this step, an error in the illuminance, which may arise in the open-loop control, can be corrected.

In particular, the control margin of the constant-illuminance control (fine adjustment) must absorb the errors that may occur in the light-quantity adjusting factors (i.e., the electric power supplied to the mercury-vapor lamp 301, the transmittance of the attenuation plate 32 and the aperture ratio of the iris 310). Accordingly, the output level of the mercury-vapor lamp 301 is reduced from its 100% by the control margin. Hence, in actual operation, the control level of the mercury-vapor lamp 301 is determined taking the control margin into account.

If the control margin is not accounted for, the output range of the mercury-vapor lamp 301 is from LIM to 100%, and the adjustment range of the parameter $t_L$ is from $L_0$ to $L_1$. Taking the control margin into account, equation (116) is written:

$$\Sigma E = e(D/Vw) = k(p_{max})L_1 r'(D/Vw) \quad (124)$$

where r' is a parameter used in determining of the amount of exposure dose.

In equation (124), the maximum light-quantity $p_{max}$ is known, and the slit width D is fixed. When $\Sigma E$ is designated, the maximum scanning speed $Vw_{max}$ is input to equation (124), and equation (124) is solved with respect to r'. If r'>1, the integral amount of exposure dose is adjusted by changing the scanning speed. If r'<1, the integral amount of exposure dose is adjusted by changing (attenuating) the quantity of light. If r'=1, the output level (light-quantity) of the lamp 301 is at its maximum, and the scanning speed Vw equals the maximum scanning speed $Vw_{max}$.

Table 1 lists the output of the lamp 301 and the parameter values of the attenuation plate 323 and the iris 310, which are set under the condition of r'<1, taking the control margin into account. Table 1 precludes the discontinuous mode.

TABLE 1

| | LAMP OUTPUT | $q_1$ (PLATE) | $q_2$ (IRIS) |
|---|---|---|---|
| i) $1 > r^1 \geq L_0$ | $r^1$ | n/a | 1 |
| ii) $L_0 > r^1 \geq L_0 S_0$ | $L_0$ | n/a | $r^1/L_0$ |
| iii) $L_0 S_0 > r^1 \geq L_0 n_1$ | $r^1/n_1$ | $n_1$ | 1 |
| iv) $L_0 n_1 > r^1 \geq L_0 n_1 S_0$ | $L_0$ | $n_1$ | $r^1/(L_0)(n_1)$ |
| v) $L_0 n_1 S_0 > r^1 \geq L_0 n_2$ | $r^1/n_2$ | $n_2$ | 1 |
| vi) $L_0 n_2 > r^1 \geq L_0 n_2 S_0$ | $L_0$ | $n_2$ | $r^1/(L_0)(n_2)$ |

Figure 21:
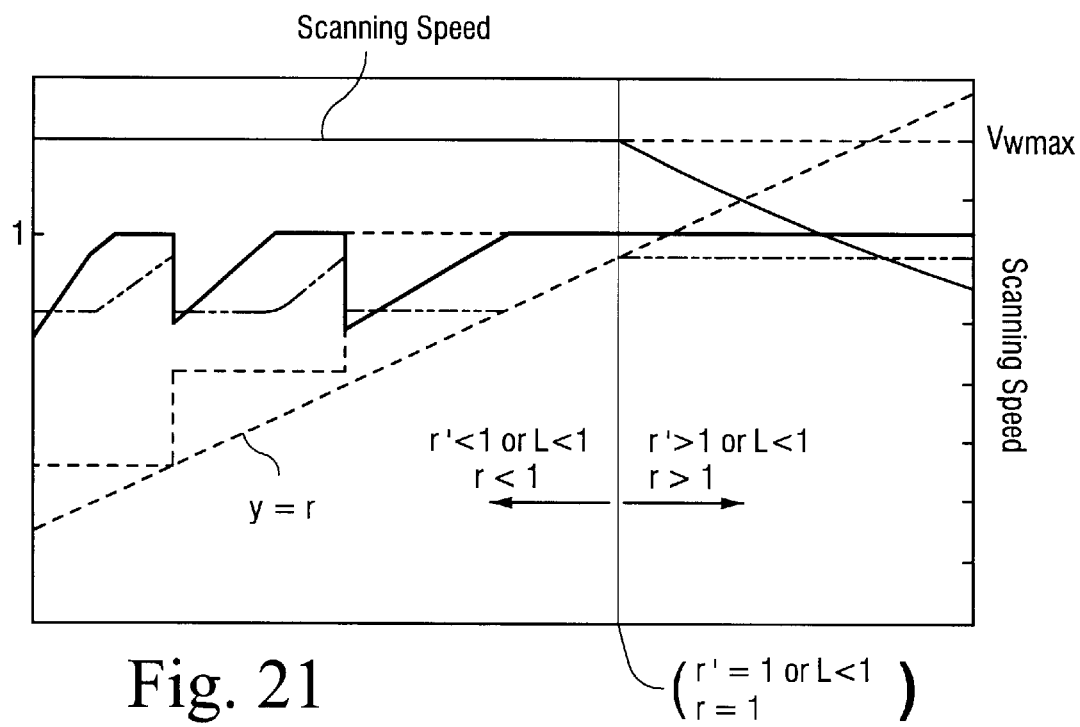
FIG. 21 is a diagram showing an example of the performance of the exposure dose control, including the factor of the scanning speed, according to the invention.
Figure 22:
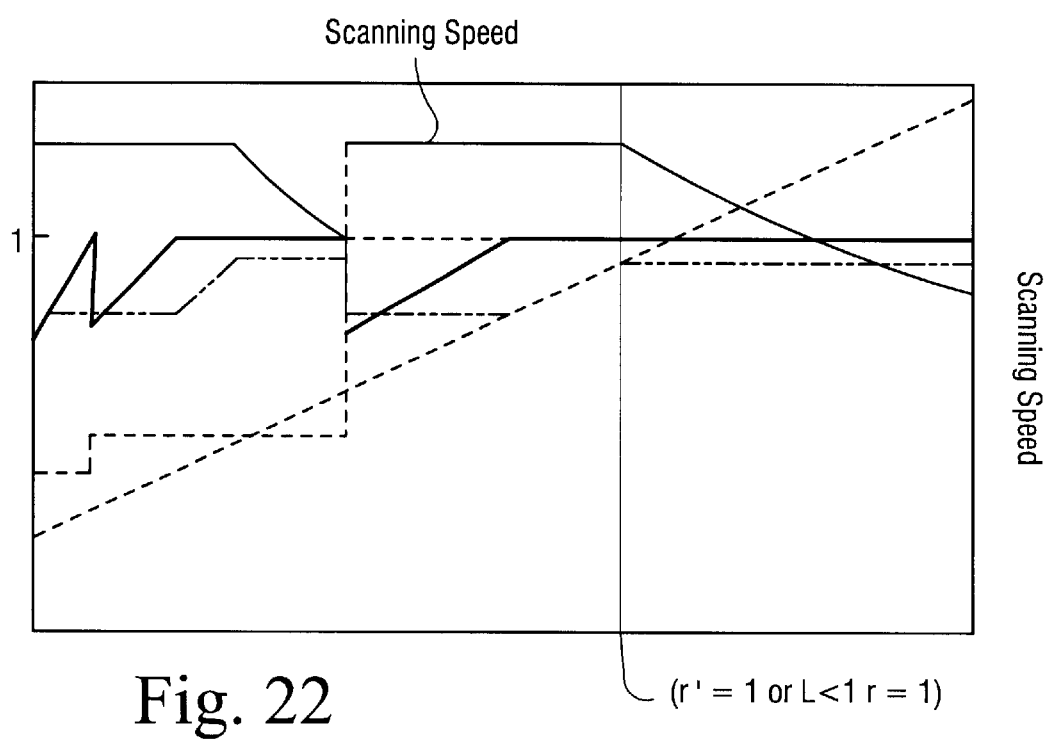
FIG. 22 is a diagram showing an example of the performance of the exposure dose control in the case where a discontinuity occurs in the range of $n_1 < L_0 S_0$.

FIG. 21 is a diagram showing an example of the performance of the exposure dose control, including the scanning speed. FIG. 22 is a diagram showing an example of the performance of the exposure dose control in the case where a discontinuity occurs in the range of $n_1 < L_0 S_0$. In these figures, the solid lines indicate the scanning speed, the bold lines indicate the parameter $q_2$, which represents the transmittance of the iris 310, the dashed lines indicate the parameter $q_1$, which represents the transmittance of the attenuation plate 323, and the two-dot broken lines indicates the parameter $t_L$, which represents the output level of the mercury-vapor lamp 301. The straight line is y=r where r is a parameter of the transmittance or the attenuation rate of the exposure light. In FIG. 22, the domain (v) shown in Table 1 is missing because of the discontinuity.

The above has been described in connection with the normal mode exposure control. Next, exposure control in the glass protection mode, which gives primary weight to protection of the glass (lens) components will be described. Of course, in the normal mode, protection of the glass components is considered to some extent by suppressing the lamp output at its necessary minimum. However, the normal mode gives primary weight to improvement of the throughput.

The output of the mercury-vapor lamp 301 varies between lamps, and the maximum quantity of light may exceed the specified level at the initial stage. In the normal mode, the maximum quantity of exposure light is applied to the low-sensitivity resist even if the maximum level exceeds the specified level, and the scanning speed is increased to its maximum in response to the maximum quantity of light, thereby increasing the throughput. However, as the quantity of light increases, the glass components are deteriorated rapidly, which often causes the illuminance to drop. To overcome this problem, in the glass protection mode, the specified level of the mercury-vapor lamp 301 is used as the maximum level if that lamp has its maximum level higher than the specified level. The parameter value $t_L$ of the mercury-vapor lamp 301 is set to L1S so as to correspond to the specified value.

In the normal mode, whether exposure control is performed by changing the scanning speed or by adjusting the quantity of light is determined by inserting the maximum speed into equation (124). On the other hand, in the protection mode, if the maximum quantity of exposure light that takes the control margin into account is greater than the specified maximum output level $ps_{max}$, that specified level is used as the maximum level.

In other words, if $(p_{max})(L1S) > ps_{max}$, then equation (125) is used to determine which means is used to control the amount of exposure dose:

$$\Sigma E = k(ps_{max}) r'(D/Vw_{max}) \quad (125)$$

If $r' \geq 1$, the specified maximum illuminance level of the mercury-vapor lamp 301 is used as the maximum output level, while the scanning speed Vw is reduced to adjust the integral amount of exposure dose. If r'<1, the scanning speed is set at its maximum, while the quantity of light (i.e., output of the lamp 301) is adjusted. The quantity of light is adjusted by determining the parameter r (representing the transmittance or the attenuation rate) using equation (116), as in the normal mode.

As in the normal mode, the glass protection mode also has p to compensate for a discontinuity. If the discontinuity occurs in the range $n_1 \leq r < L_0 S_0$, and if an integral amount of exposure dose is designated for that range, then parameter $t_L$ of the mercury-vapor lamp 301, $q_1$ of the attenuation plate 323, $q_2$ of the iris 310, and the scanning speed Vw are set as shown in Table 2. Table 2 shows parameter values used in both the normal mode and the glass protection mode.

TABLE 2

|   | NORMAL MODE | GLASS PROTECTION MODE |
|---|---|---|
| $t_L$ | $L_1$ | L1S |
| $q_1$ | $n_1$ | $n_1$ |
| $q_2$ | 1 | 1 |
| Vw | $\Sigma E/(p_{max})(t_L)(q_1)(q_2)$ | $\Sigma E/(p_{max})(t_L)(q_1)(q_2)$ |

The exposure sequence will now be described.

(1) The mercury-vapor lamp 301 is turned on. The electric power supplied when the mercury-vapor lamp 301 is turned on is set at its minimum, and the corresponding output level of the mercury-vapor lamp 301 is LIM, which is controlled at a constant power.

(2) The illuminance of the mercury-vapor lamp 301 is measured with the minimum power and the maximum power, respectively, to create a control line used to control the output of the lamp 301. The output level of the mercury-vapor lamp 301 is measured as the illuminance by the integrator sensor 333 when the electric power becomes stable. At this time, the aperture ratio of the iris 310 and the transmittance of the attenuation plate 323 are set to 100%.

The maximum and the minimum outputs of the power source used for the mercury-vapor lamp 301 include margins on both sides for an overshoot, which is required to perform a constant illuminance control by outputting power over the target value.

This measurement process for creating a control line is preferably conducted one a day.

(3) If the attenuation plate 323 is a coated mirror, the transmittance may fluctuate as time passes. The transmittance must thus be measured regularly. The transmittance of the attenuation plate 323 is represented by a ratio to the 100% transmittance. If both or either $n_1 < L_0 S_0$ and/or $n_2 < L_0 S_0 n_1$ are satisfied, discontinuity occurs, which must be considered. If a default is set, an alert is issued to urge the operator to check the system. The operator may set in advance whether the discontinuity treating process described above is performed. The following will be described presuming that no discontinuity occurs. The shutter 304 is closed except for the periods of the exposure process, preparation for the exposure, and measurement.

(4) The wafer W is loaded on the cassette (not shown). Then, the operator inputs the parameters of the integral exposure dose $\Sigma E_0$, the shot size, the number of shots, the arrangement of the shot areas, and so on through the console (not shown). At this time, the process shown in the flowchart in FIG. 19 starts. According to the flowchart, it is determined if the exposure dose is adjusted by changing the scanning speed or by adjusting the quantity of light. If the resist has a high sensitivity, a combination of the output values of the iris 310, the attenuation plate 323 and the mercury-vapor lamp 301 is determined in response to the parameter r obtained by equation (120).

(5) The wafer W is transported onto the wafer stage and aligned with respect to the projection optical system. During this process, the aperture of the iris 310 is adjusted according to the control map in response to the designated amount of exposure dose. At the same time, the attenuation plate 323 is inserted or removed into or off the optical path. If the attenuation plate 323 is inserted, the transmittance is selected, and the electric power supplied to the mercury-vapor lamp 301 is set to the required level. It takes a certain amount of time to change the electric power to the desired level so as to protect the electrodes. For instance, it takes more than one second to change the power from its minimum to the maximum level. The electric power set for the rough exposure control (i.e., the control at a constant power) corresponds to the parameter $t_L$ of the lamp output, and its value is determined from the output control line created during the measurement of the mercury-vapor lamp 301 illuminance. The determined value of the electric power Q is LW.

A sequence of these operations is performed during the waiting time for the actual exposure process so as not to decrease the throughput.

The subsequent sequence will be described with reference to FIG. 23.

Figure 23:
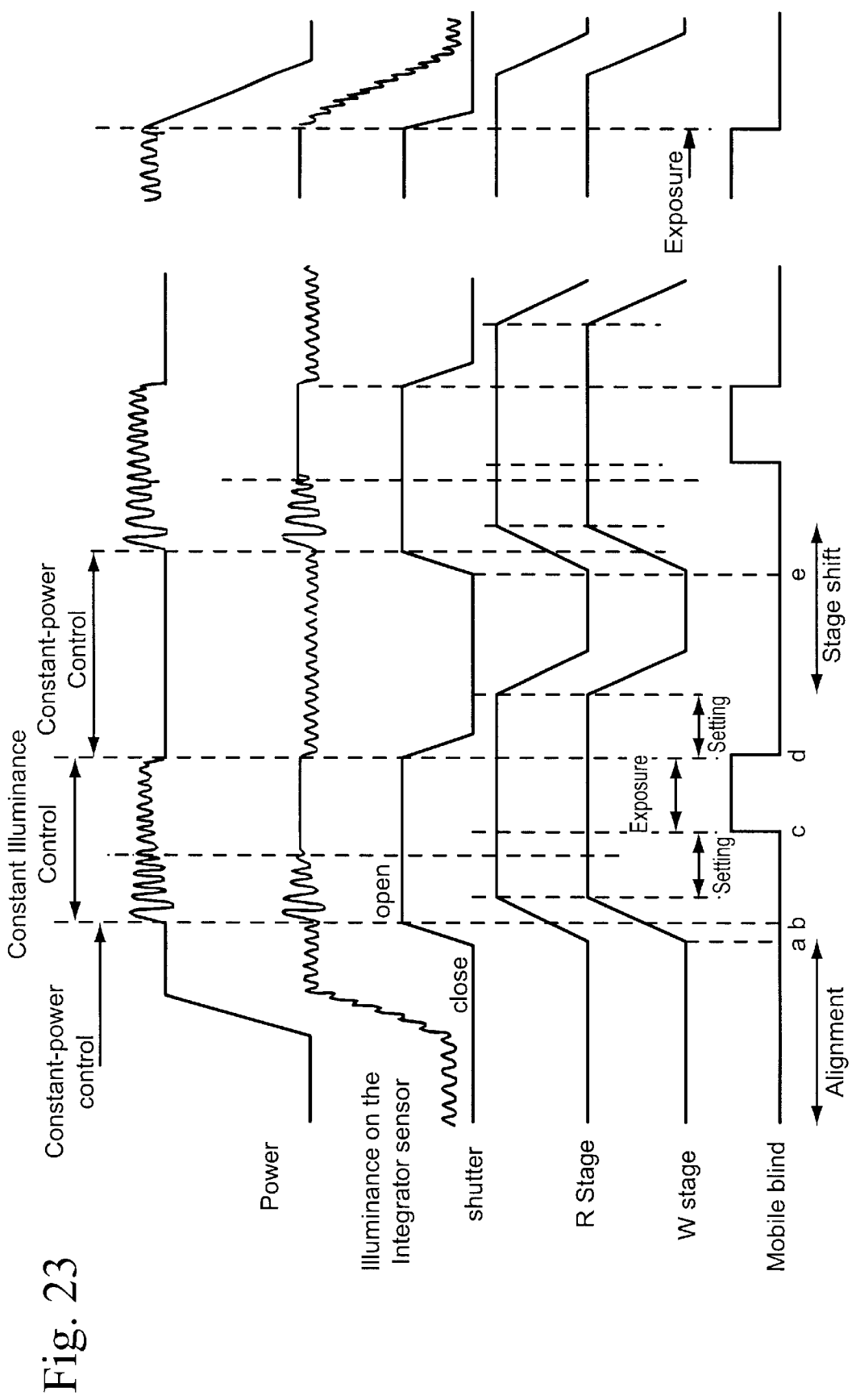
FIG. 23 is a timing chart showing an example of the exposure sequence according to the third embodiment of the invention.

When the electric power has reached the required level (Q=LW) and the illumination system gets ready, the reticle stage 342, the wafer stage 348, and the movable blinds 335A, 335B start moving synchronously at point "a" in the timing chart shown in FIG. 23. At the same time, the shutter 304 starts opening. When the shutter 304 is completely open (at point "b"), the control state of the mercury-vapor lamp 301 is switched to the constant-illuminance control mode. The target illuminance for the constant-illuminance control is defined by e in equation (112)

At point "b", the reticle stage 342 and the wafer stage 248 are being accelerated. When they reach a certain speed, setting of the stages is performed.

The illuminance of the mercury-vapor lamp 301 fluctuates immediately after the control mode has been switched, due to arc discharge, and a certain amount of time is required until the illuminance becomes stable. Scanning exposure starts when the low-frequency components have been removed from the illuminance. In this embodiment, the quantity of light is adjusted to a predetermined level in advance in an open loop, and therefore, the time required for stabilizing the illuminance is shortened. This can reduce the shutter releasing time.

As is clear from FIG. 23, the illuminance has been stabilized before the stage setting is completed. When the setting is finished (at point "c"), the first shot of exposure is performed by controlling the movable blinds 335A and 335B. When the exposure for the first shot area has been completed (at point "d"), the control state of the mercury-vapor lamp 301 is switched to the constant-power control mode, and the shutter 304 starts closing. The electric power supplied to the lamp 301 at this time is initially set to LW. Setting of the reticle stage 342 and the wafer stage 348 are again performed and are decelerated in the return path preparing for the next shot of exposure. At point "e", the reticle stage 342 and the wafer stage 238 start accelerating to the next shot area, and the shutter starts opening. This process is repeated until the entire area of the wafer W is exposed to the reticle pattern.

The above has been described on the assumption that the quantity of exposure light is set equal among the shots. If a different quantity of light is designated for certain shot areas, the most efficient order of exposure is calculated so that the decrease in throughput is minimized. At the same time, the most efficient way of controlling the exposure dose (by changing the scanning speed or by adjusting the quantity of light) is determined.

It is also presumed that the exposure dose is set equal among the wafers. For each shot, the shutter is closed, and the power is set to LW for the constant-power control. The same applies to the exposure between wafers. Every time a wafer is loaded, the exposure dose is first roughly controlled at a constant power LW as long as the throughput is not adversely affected.

The timing chart in FIG. 23 does not indicate the directions of the reticle stage 342 and the wafer stage 348 because the purpose of FIG. 23 is to show the timing of the actions of the components in association with the movement of the power supplied to the lamp 301 and the output of the lamp 301.

As has been described, in the third embodiment, the illuminance of the mercury-vapor lamp 301 is roughly adjusted near the target value at a constant power prior to the constant-illuminance control. During this step, the power supplied to the lamp 301 is regulated so that the output of the lamp 301 becomes the necessary minimum level, and the light-quantity adjusting structure (i.e., the attenuation plate 323 and the iris 310) are adjusted so that the i-rays do not unnecessarily illuminate the illumination path when the apparatus is not performing exposure. This arrangement can reduce the shutter releasing time and prevent unnecessary irradiation into the illumination path, which extends from the mercury-vapor lamp 301 to the movable blinds 335A and 335B. Thus, the amount of exposure dose can be controlled with a high efficiency and with high accuracy, while preventing deterioration of the glass components due to excessive amount of i-rays in the illumination path, and while reducing blur caused by chemical reaction.

In the third embodiment, when a high-sensitivity resist, which is becoming a major trend of material in this field, is used, scanning exposure is performed at the maximum scanning speed, while the output of the mercury-vapor lamp 301 is set to the necessary minimum level. Because the illuminance has been roughly adjusted prior to the constant-illuminance control step, time required for stabilizing the illuminance can be reduced, thereby improving the throughput.

When the exposure apparatus is not performing scanning exposure in the intervals of shots, the output of the mercury-vapor lamp 301 is maintained at a rough adjustment level LW, which is a little higher than the minimum level, with a constant power. This arrangement allows the next exposure action to start smoothly, and at the same time, deterioration of the electrodes of the mercury-vapor lamp 301 can be prevented.

The fourth embodiment according to the invention will be described with reference to FIG. 24.

The fourth embodiment is similar to the third embodiment. Although a portion of the exposure sequence is different, the structure of the apparatus is the same as that of the third embodiment. Accordingly, explanation will be made only of the altered portion.

Figure 24:
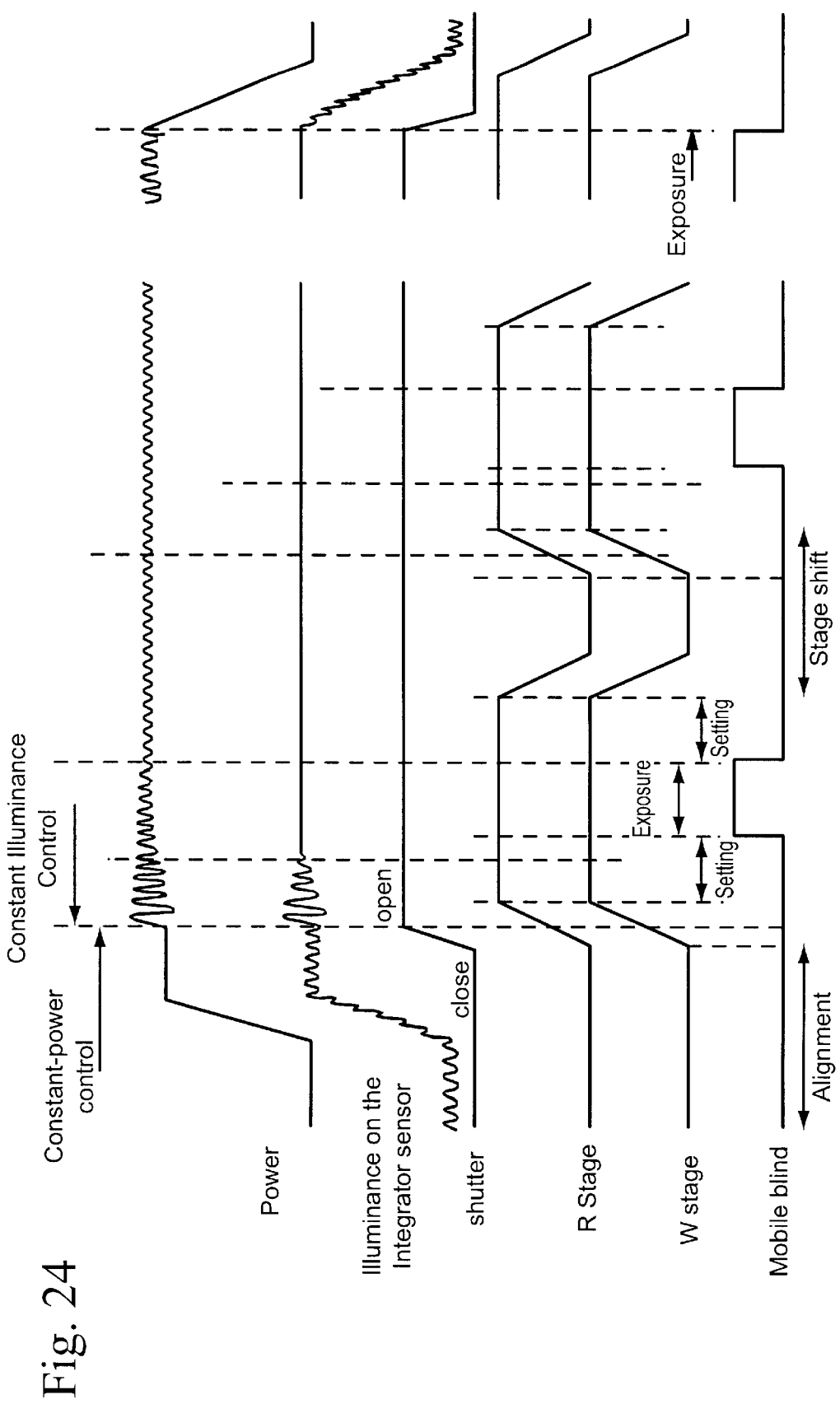
FIG. 24 is a timing chart showing an example of the exposure sequence according to the fourth embodiment of the invention.

In this embodiment, the output mode of the mercury-vapor lamp 301 is kept in the constant-illuminance control mode, and the shutter 304 is kept open during the scanning exposure period of a wafer, as shown in FIG. 24. The movement of the movable blinds 335A, 335B defines the start and end of an exposure shot.

When an exposure shot is finished, the movable blinds 335A, 335B are closed to block the exposure light onto the reticle, and therefore to the wafer W. However, the shutter 304 is kept open, and the output of the integrator sensor 333 is monitored to control the output of the mercury-vapor lamp 301 at a constant illuminance until the entire area of the wafer W is exposed. The shutter 304 is closed as the entire area of the wafer W is exposed, and the output mode of the mercury-vapor lamp 301 is switched to the constant-power control mode. The output level of the mercury-vapor lamp 301 during the constant-power control mode is LW, as in the third embodiment.

When the exposure apparatus is not performing scanning exposure, the mercury-vapor lamp 301 is kept in the ON state at a constant illuminance, but the exposure light emitted to the reticle (and to the wafer W) is blocked by the movable blinds 335A, 335B. This arrangement is advantageous because the output of the mercury-vapor lamp 301 is kept stable, and time required for adjusting the quantity of light for the next shot is substantially reduced or eliminated, thereby improving the throughput.

Although, in this embodiment, the output of the mercury-vapor lamp 301 is kept at LW, which is a little higher than the minimum level, in the constant-power control mode, the output may be lowered to the minimum as long as the throughput is not affected.

Figure 25:
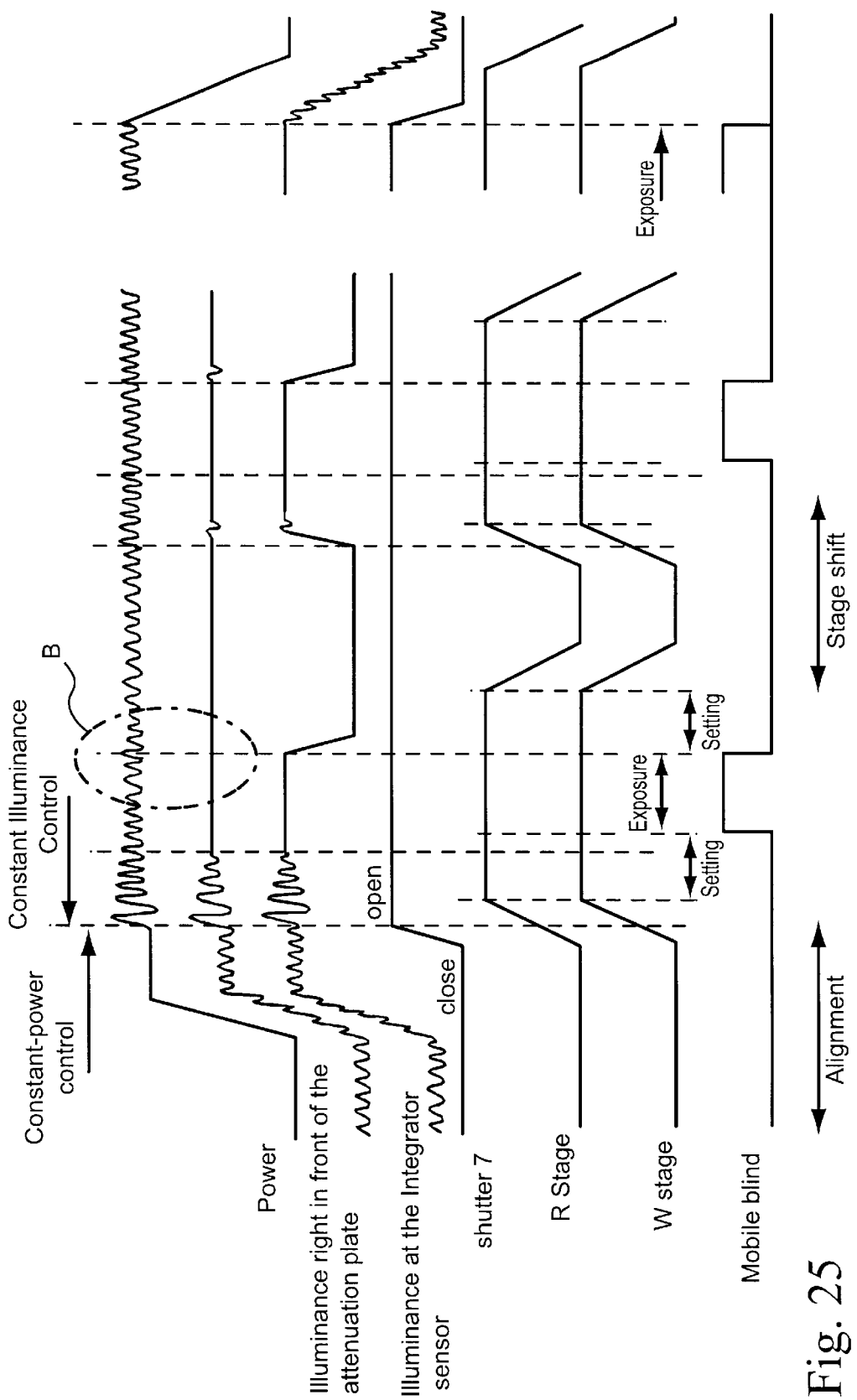
FIG. 25 is a timing chart showing an example of the exposure sequence according to the fifth embodiment of the invention.

The fifth embodiment according to the invention will be explained with reference to FIGS. 25–27.

The fifth embodiment is a modification of the fourth embodiment, however, a portion of the exposure sequence is different. The structure of the exposure apparatus is the same as that of the third and fourth embodiments.

In this embodiment, the control mode of the mercury-vapor lamp 301 is kept in the constant-illuminance control mode until the entire area of the wafer W is exposed to the mask pattern, as in the fourth embodiment. The difference lies in that a given attenuation plate 323 is inserted into the optical path of the exposure light during the non-exposure period of the operation between shots. The attenuation plate 323, which is inserted in the optical path, is, for example, the attenuation plate that has the lowest transmittance.

Figure 26A:
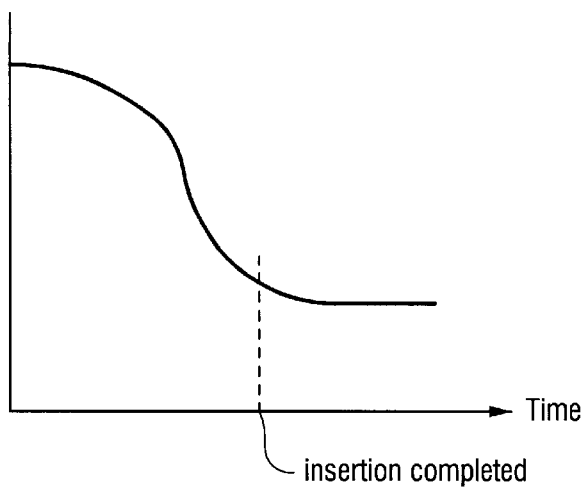
FIG. 26(A) illustrates a change in the quantity of light resulting from insertion of an attenuation plate.
Figure 27:
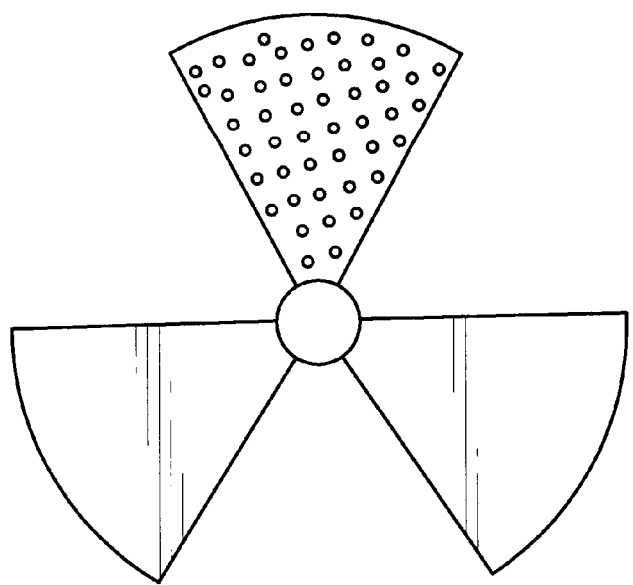
FIG. 27 illustrates a shutter that may be used in place of the attenuation plate.

When such an attenuation plate 323 is inserted into the optical path of the exposure light, the quantity of light that strikes the integrator sensor 333, which composes the feedback system for controlling the output of the mercury-vapor lamp 301 at a constant illuminance, decreases as shown in FIG. 26(A). At this time, in the fifth embodiment, the target value of the illuminance for the feedback control is multiplied by the transmittance of the attenuation plate 323 so as to reduce the value of the illuminance used in the constant-illuminance control mode.

Figure 26B:
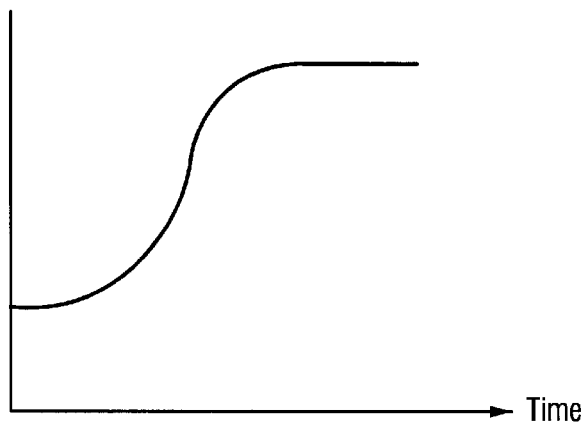
FIG. 26(B) illustrates a change (increase) in the output of the mercury-vapor lamp with a constant target illuminance.
Figure 26C:
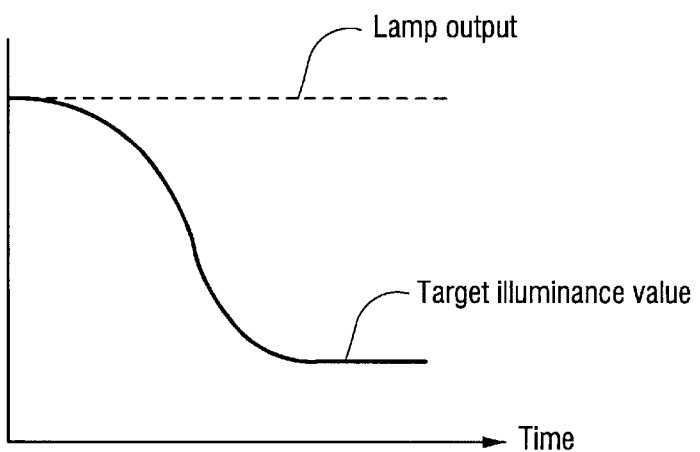
FIG. 26(C) illustrates a curve of the quantity of light adjusted toward the target illuminance.

The attenuation plate 323 is inserted at a high speed. During this process, eclipse of the light quantity occurs due to the metal fitting of the attenuation plate 323. The illuminance rises instantaneously to compensate for the eclipse (as indicated by the circle B in FIG. 25). If no change is made to the target value of the illuminance, the output of the mercury-vapor lamp 301 increases as shown in FIG. 26(B). To overcome this problem, the target value of the illuminance is gradually decreased based on the prediction of the change in the eclipse with respect to time, because the manner of eclipsing is known. In other words, based on the prediction that the eclipse occurs as shown in FIG. 26(A), the target illuminance is adjusted as indicated by the solid line in FIG. 26(C) so as to maintain the output of the mercury-vapor lamp 301 constant as indicated by the dashed line in FIG. 26(C), thereby continuing the exposure control at a constant illuminance.

Alternatively, the gain of the feedback loop may be instantaneously decreased during the insertion of the attenuation plate 323, instead of changing the target value of the illuminance, so as not to follow the eclipse. In this case, the illuminance slightly fluctuates; however, the illuminance soon follows the target value corresponding to the attenuation rate of the attenuation plate 323.

By controlling the illumination system in this manner, the amount of exposure dose can be reliably controlled at a constant illuminance with little change in the output of the mercury-vapor lamp 301 in the actual scanning exposure, while the quantity of light that strikes the glass components is suppressed to its minimum when the exposure apparatus is not performing scanning exposure. Because the exposure dose can be continuously controlled at a constant illuminance, while preventing the deterioration of the glass components, the temperature of the electrodes in the mercury-vapor lamp 301 is kept stable, and the time required for stabilizing the illuminance can be reduced.

If the attenuation plate 323 that has the lowest transmittance is being used during scanning exposure at a constant illuminance of the mercury-vapor lamp 301, the attenuation plate does not have to be reinserted in the optical path. It is preferable to design the shape of the support member of the attenuation plate 323 so as not to block the light completely.

The shutter 304 may be used in place of the attenuation plate 323 to attenuate the quantity of light. In this case, a rotational shutter consisting of a plurality of blades is preferably used. A number of holes are formed at random in one of the blades, which functions as a random walk filter (details of which will be described below). The weight of the blade is decreased by the holes, which must be compensated for by increasing the thickness of the blade to keep the rotation in balance. The rotational shutter is more efficient in switching the transmittance.

In the embodiments described above, a reflecting-type half mirror is used as the attenuation plate 323. The half mirror may be coated with a dielectric multi-layered coating film. Moreover, a metallic reticulated plate called a random walk filter may be used instead of the glass. A random walk filter is made of a thin metal plate in which polygonal holes are formed at random by, for example, etching, so as not to form a regular grating. The random walk filter is designed so as not to affect the pattern transfer. If the random walk filter is used as the attenuation plate 323, blur caused by chemical reaction does not occur, thereby eliminating the discontinuity region and the mode for treating with the discontinuity.

In general, the energy density and the ozone density due to the irradiation of the ultraviolet rays are high at the position in which the attenuation plate 323 is located in the exposure apparatus 1110. Accordingly, a metal material that is superior in heat-resistance and anti-corrosion ability is preferably selected.

In the exposure apparatus 1110, a mercury-vapor lamp that can cut off the light component whose wavelength is shorter than that of i-rays may be used because it is presumed that the light component having a wavelength shorter than i-rays causes blur. Moreover, a bending mirror may be used in place of the half mirror. In order to prevent the blur, a mechanism for supplying clean air into the illumination system may be used. One example of such a mechanism is a chemical filter that removes ammonia gas or organic gas.

According to the exposure apparatus described in the embodiments, scanning exposure can be performed in a short time regardless of the sensitivity of the resist applied on the wafer.

Furthermore, in the embodiments described above, discrete adjustment of the quantity of light using the attenuation plate, and continuous adjustment using the iris and by regulating the output of the light source are combined. The adjustment of the output of the light source and adjustment of the iris are alternately performed to set the exposure dose onto a photosensitive substrate to a desired level, while maintaining the scanning speed at its maximum. In this arrangement, scanning exposure is performed always in the shortest time in the high-sensitivity region, while, in the low-sensitivity region, the throughput can be improved as compared with a conventional apparatus.

Even if the pulsed energy varies in the high-sensitivity region during scanning exposure, a prescribed amount of integral exposure dose can be correctly provided to the next shot area without reducing the scanning speed.

Thus, the scanning-type exposure apparatus according to the invention has superior advantages that a high throughput is maintained, while preventing the illuminance from decreasing due to blur, and that the life of the light source (e.g., mercury-vapor lamp) is prolonged.

While the invention has been described in connection with what is presently considered to be the most practical and preferred embodiments, it is to be understood that the invention is not to be limited to the disclosed embodiments, but on the contrary, is intended to cover various modifications and equivalent arrangements included within the spirit and scope of the appended claims.

The entire disclosure of Japanese Patent Application No. 8-221751 filed on Aug. 5, 1996 and No. 9-88907 filed on Mar. 24, 1997 including the specification, claims, drawings, and summary are incorporated herein by reference.

What is claimed is:

1. An exposure method for exposing a substrate by projecting a pattern on a mask onto the substrate with pulsed light from a light source and scanning the substrate relative to the pulsed light, the method comprising the steps of:

setting a target exposure dose to the substrate;

selecting an exposure control mode either a maximum scan speed mode or a maximum oscillation frequency mode in accordance with the target exposure dose to the substrate, wherein when the maximum scan speed mode is selected, the scan speed of the substrate is maximized and the oscillation frequency of the pulsed light is adjusted so as to expose the substrate by the target exposure dose, and when the maximum oscillation frequency mode is selected, the oscillation frequency of the pulsed light from the light source is maximized and scanning speed of the substrate is adjusted so as to expose the substrate by the target exposure dose; and scanning the substrate relative to the pulsed light by the selected exposure control mode.

2. A method according to claim 1 wherein:

the maximum scan speed mode is selected when the target exposure dose set in the setting step is low, and the maximum oscillation frequency mode is selected when the target exposure dose set in the setting step is high.

3. A method according to claim 1 wherein:

said selecting step includes judging a possibility of exposing by the maximum scan speed mode before judging to decide the maximum oscillation frequency mode.

4. A method according to claim 1 further comprising:

measuring an integral exposure dose of a shot area on the substrate when the shot area is exposed; and controlling the oscillation frequency of the pulsed light based on the measured integral exposure dose so as to expose a next shot area with an appropriate exposure dose when the maximum scan speed mode is selected.

5. A method according to claim 1 further comprising:
measuring an integral exposure dose of a shot area on the substrate when the shot area is exposed; and
controlling the scanning speed of the substrate based on the measured integral exposure dose so as to expose a next shot area with an appropriate exposure dose when the maximum oscillation frequency mode is selected.

6. A method according to claim 1 further comprising:
illuminating the mask by an illumination system with the pulsed light;
changing an illumination condition of the illumination system; and
controlling the oscillation frequency of the pulsed light based on the illumination condition changed by the changing step so as to expose the substrate with an appropriate exposure dose when the maximum scan speed mode is selected.

7. A method according to claim 1 further comprising:
obtaining a relationship between energy of the pulsed light outputted from the light source and illuminance of the pulsed light on the substrate.

8. A method for manufacturing a semiconductor device comprising the steps of transferring a device pattern onto a workpiece using an exposure method according to claim 1.

9. An exposure apparatus for exposing a substrate by projecting a pattern on a mask onto the substrate with pulsed light from a light source and scanning the substrate relative to the pulsed light, the apparatus comprising:
a setting device that sets a target exposure dose to the substrate;
a selecting device, connected to said setting device, that selects an exposure control mode either a maximum scan speed mode or a maximum oscillation frequency mode in accordance with the target exposure dose to the substrate, wherein when the maximum scan speed mode is selected, the scan speed of said substrate is maximized and the oscillation frequency of said pulsed light is adjusted so as to expose the substrate by the target exposure dose, and when the maximum oscillation frequency mode is selected, the oscillation frequency of said pulsed light from the light source is maximized and scanning speed of said substrate is adjusted so as to expose the substrate by the target exposure dose; and
a scanning device, connected to said selecting device, that moves the substrate relative to the pulsed light by the selected exposure control mode.

10. An apparatus according to claim 9 wherein:
said selecting device selects said maximum scan speed mode when the target exposure dose set by the setting device is low, and selects said maximum oscillation frequency mode when the target exposure dose set by the setting device is high.

11. An apparatus according to claim 9 wherein:
said selecting device judges a possibility of exposing by the maximum scan speed mode before judging to decide the maximum oscillation frequency mode.

12. An apparatus according to claim 9 further comprising:
a measuring device that measures an integral exposure dose of a shot area on the substrate when the shot area is exposed; and
a controller, connected to said measuring device, that controls the oscillation frequency of the pulsed light based on the measured integral exposure dose so as to expose a next shot area with an appropriate exposure dose when the maximum scan speed mode is selected.

13. An apparatus according to claim 9 further comprising:
a measuring device that measures an integral exposure dose of a shot area on the substrate when the shot area is exposed; and
a controller, connected to said measuring device, that controls the scanning speed of said substrate based on the measured integral exposure dose so as to expose a next shot area with an appropriate exposure dose when the maximum oscillation frequency mode is selected.

14. An apparatus according to claim 9 further comprising:
an illumination system that illuminates the mask with the pulsed light;
a changing device that changes an illumination condition of the illumination system; and
a controller, connected to said changing device, that controls the oscillation frequency of the pulsed light based on the illumination condition changed by the changing device so as to expose the substrate with an appropriate exposure dose when the maximum scan speed mode is selected.

15. An apparatus according to claim 9 further comprising:
a controller that obtains a relationship between energy of the pulsed light outputted from said light source and illuminance of the pulsed light on the substrate.

16. A method for making an exposure apparatus for exposing a substrate by projecting a pattern on a mask on the substrate with pulsed light from a light source and scanning the substrate relative to the pulsed light, the method comprising the steps of:
providing a setting device that sets a target exposure dose for the substrate;
providing a selecting device, connected to the setting device, that selects an exposure control mode either a maximum scan speed mode or a maximum oscillation frequency mode in accordance with the target exposure dose to the substrate, wherein when the maximum scan speed mode is selected, the scan speed of said substrate is maximized and the oscillation frequency of said pulsed light is adjusted so as to expose the substrate by the target exposure dose, and when the maximum oscillation frequency mode is selected, the oscillation frequency of said pulsed light is maximized and scanning speed of said substrate is adjusted so as to expose the substrate by the target exposure dose; and
providing a scanning device, connected to said selecting device, that moves the substrate relative to the pulsed light by the selected exposure control mode.

* * * * *